United States Patent
Zhang et al.

(10) Patent No.: US 12,048,151 B2
(45) Date of Patent: Jul. 23, 2024

(54) METHODS FOR FORMING THREE-DIMENSIONAL MEMORY DEVICES WITH BACKSIDE SOURCE CONTACTS

(71) Applicant: YANGTZE MEMORY TECHNOLOGIES CO., LTD., Wuhan (CN)

(72) Inventors: Kun Zhang, Wuhan (CN); Ziqun Hua, Wuhan (CN); Wenxi Zhou, Wuhan (CN); Zhiliang Xia, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 738 days.

(21) Appl. No.: 17/020,398

(22) Filed: Sep. 14, 2020

(65) Prior Publication Data

US 2021/0375915 A1    Dec. 2, 2021

Related U.S. Application Data

(63) Continuation of application No. PCT/CN2020/100521, filed on Jul. 7, 2020.

(30) Foreign Application Priority Data

May 27, 2020  (WO) ................ PCT/CN2020/092499
May 27, 2020  (WO) ................ PCT/CN2020/092501
(Continued)

(51) Int. Cl.
*H10B 41/40*    (2023.01)
*H10B 41/27*    (2023.01)
(Continued)

(52) U.S. Cl.
CPC ............. *H10B 43/27* (2023.02); *H10B 41/27* (2023.02); *H10B 41/40* (2023.02); *H10B 43/35* (2023.02); *H10B 43/40* (2023.02)

(58) Field of Classification Search
CPC ........ H10B 69/00; H10B 53/00; H10B 53/10; H10B 53/20; H10B 53/30; H10B 53/40;
(Continued)

(56) References Cited

U.S. PATENT DOCUMENTS 9,525,065 B1 *  12/2016  Kyeon ................ H01L 29/7827
9,824,966 B1    11/2017  Kanakamedala et al.
(Continued)

FOREIGN PATENT DOCUMENTS

CN   104681561 A   6/2015
CN   104813407 A   7/2015
(Continued)

OTHER PUBLICATIONS

Extended European Search Report issued in corresponding European Application No. 201913066.5, mailed on Nov. 11, 2022, 10 pages.
(Continued)

*Primary Examiner* — Didarul A Mazumder
*Assistant Examiner* — Gustavo G Ramallo
(74) *Attorney, Agent, or Firm* — BAYES PLLC

(57) ABSTRACT

Embodiments of 3D memory devices and methods for forming the same are disclosed. In an example, a 3D memory device includes a substrate, a peripheral circuit on the substrate, a memory stack including interleaved conductive layers and dielectric layers above the peripheral circuit, an N-type doped semiconductor layer above the memory stack, a plurality of channel structures each extending vertically through the memory stack into the N-type doped semiconductor layer, a conductive layer in contact with
(Continued)

upper ends of the plurality of channel structures, at least part of which is on the N-type doped semiconductor layer, and a source contact above the memory stack and in contact with the N-type doped semiconductor layer.

20 Claims, 37 Drawing Sheets

(30) Foreign Application Priority Data

| | | | |
|---|---|---|---|
| May 27, 2020 | (WO) | ................ | PCT/CN2020/092504 |
| May 27, 2020 | (WO) | ................ | PCT/CN2020/092506 |
| May 27, 2020 | (WO) | ................ | PCT/CN2020/092512 |
| May 27, 2020 | (WO) | ................ | PCT/CN2020/092513 |

(51) Int. Cl.
  *H10B 43/27* (2023.01)
  *H10B 43/35* (2023.01)
  *H10B 43/40* (2023.01)

(58) Field of Classification Search
  CPC ........ H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
  See application file for complete search history.

(56) References Cited

U.S. PATENT DOCUMENTS

| | | | |
|---|---|---|---|
| 10,147,732 B1* | 12/2018 | Hu | .......................... H10B 41/35 |
| 10,199,359 B1 | 2/2019 | Sakakibara et al. | |
| 10,600,763 B1 | 3/2020 | Xiao | |
| 10,629,613 B1 | 4/2020 | Shimizu et al. | |
| 2010/0214838 A1* | 8/2010 | Hishida | .............. G11C 16/0483 365/185.11 |
| 2012/0273872 A1 | 11/2012 | Lim et al. | |
| 2014/0042520 A1 | 2/2014 | Lee et al. | |
| 2015/0145015 A1 | 5/2015 | Shin et al. | |
| 2015/0357413 A1 | 12/2015 | Zhang et al. | |
| 2015/0364487 A1* | 12/2015 | Yun | ........................ H10B 43/35 257/324 |
| 2015/0372101 A1* | 12/2015 | Lee | ........................ H10B 43/27 257/314 |
| 2016/0148948 A1* | 5/2016 | Kim | ...................... H01L 23/528 438/269 |
| 2016/0204122 A1 | 7/2016 | Shoji et al. | |
| 2016/0225714 A1 | 8/2016 | Yun et al. | |
| 2016/0336338 A1 | 11/2016 | Song et al. | |
| 2017/0084624 A1 | 3/2017 | Lee et al. | |
| 2017/0125437 A1 | 5/2017 | Pachamuthu et al. | |
| 2017/0243650 A1 | 8/2017 | Ogawa et al. | |
| 2017/0338241 A1 | 11/2017 | Lee | |
| 2018/0006049 A1 | 1/2018 | Inomata et al. | |
| 2018/0122904 A1 | 5/2018 | Matsumoto et al. | |
| 2018/0122906 A1 | 5/2018 | Yu et al. | |
| 2018/0342531 A1 | 11/2018 | Susuki et al. | |
| 2019/0043830 A1 | 2/2019 | Sakakibara et al. | |
| 2019/0067314 A1 | 2/2019 | Lu et al. | |
| 2019/0081069 A1 | 3/2019 | Lu et al. | |
| 2019/0115363 A1 | 4/2019 | Choi | |
| 2019/0139974 A1 | 5/2019 | Sugawara et al. | |
| 2019/0221557 A1 | 7/2019 | Kim et al. | |
| 2019/0252403 A1 | 8/2019 | Kaminaga et al. | |
| 2020/0006358 A1 | 1/2020 | Nishikawa et al. | |
| 2020/0020718 A1 | 1/2020 | Harari et al. | |
| 2020/0027509 A1 | 1/2020 | Chen et al. | |
| 2020/0027835 A1 | 1/2020 | Hsu et al. | |
| 2020/0027892 A1 | 1/2020 | Zhu et al. | |
| 2020/0044078 A1 | 2/2020 | Yilmaz et al. | |
| 2020/0051995 A1 | 2/2020 | Tanaka et al. | |
| 2020/0058674 A1 | 2/2020 | Jiang et al. | |
| 2020/0105781 A1 | 4/2020 | Yang et al. | |
| 2020/0111807 A1 | 4/2020 | Xu et al. | |
| 2020/0111808 A1 | 4/2020 | Liu et al. | |
| 2020/0126974 A1 | 4/2020 | Liu et al. | |
| 2020/0203329 A1 | 6/2020 | Kanamori et al. | |
| 2021/0320094 A1* | 10/2021 | Zhang | ..................... H01L 25/50 |
| 2021/0335808 A1* | 10/2021 | Wu | ........................ H10B 43/27 |
| 2021/0391315 A1* | 12/2021 | Zhang | .................... H10B 41/50 |

FOREIGN PATENT DOCUMENTS

| | | |
|---|---|---|
| CN | 104916319 A | 9/2015 |
| CN | 107204340 A | 9/2017 |
| CN | 107425005 A | 12/2017 |
| CN | 107431063 A | 12/2017 |
| CN | 108022929 A | 5/2018 |
| CN | 108447865 A | 8/2018 |
| CN | 109037227 A | 12/2018 |
| CN | 109075174 A | 12/2018 |
| CN | 109148463 A | 1/2019 |
| CN | 109155316 A | 1/2019 |
| CN | 109192734 A | 1/2019 |
| CN | 109273453 A | 1/2019 |
| CN | 109314116 A | 2/2019 |
| CN | 109314147 A | 2/2019 |
| CN | 109417078 A | 3/2019 |
| CN | 109496355 A | 3/2019 |
| CN | 109686739 A | 4/2019 |
| CN | 109742081 A | 5/2019 |
| CN | 109786387 A | 5/2019 |
| CN | 109817633 A | 5/2019 |
| CN | 109860197 A | 6/2019 |
| CN | 109994487 A | 7/2019 |
| CN | 110034124 A | 7/2019 |
| CN | 110088905 A | 8/2019 |
| CN | 110121779 A | 8/2019 |
| CN | 110168728 A | 8/2019 |
| CN | 110246846 A | 9/2019 |
| CN | 110462829 A | 11/2019 |
| CN | 110473878 A | 11/2019 |
| CN | 110785851 A | 2/2020 |
| CN | 111370423 A | 7/2020 |
| EP | 3326205 A1 | 5/2018 |
| JP | 2014187321 A | 10/2014 |
| TW | 201913967 A | 4/2019 |
| TW | 201933546 A | 8/2019 |
| TW | I667774 B | 8/2019 |
| TW | 201947706 A | 12/2019 |
| TW | 202005000 A | 1/2020 |
| TW | I683424 B | 1/2020 |
| TW | 202010109 A | 3/2020 |
| TW | 202013685 A | 4/2020 |
| TW | 202015223 A | 4/2020 |
| WO | 2017074546 A1 | 5/2017 |
| WO | 2019052127 A1 | 3/2019 |

OTHER PUBLICATIONS

Jaehoon Jang et al: "Vertical cell array, using TCAT(Terabit Cell Array Transistor), technology for ultra high density NANO flash memory", VLSI Technology, 2009 Symposium on, IEEE, Piscataway, NJ, USA, Jun. 16, 2009 (Jun. 16, 2009), pp. 192-193.

International Search Report issued in corresponding International Application No. PCT/CN2020/100522, mailed Feb. 25, 2021, 5 pages.

International Search Report issued in corresponding International Application No. PCT/CN2020/100561, mailed Feb. 26, 2021, 4 pages.

(56) References Cited

OTHER PUBLICATIONS

International Search Report issued in corresponding International Application No. PCT/CN2020/100563, mailed Feb. 26, 2021, 4 pages.

* cited by examiner

100
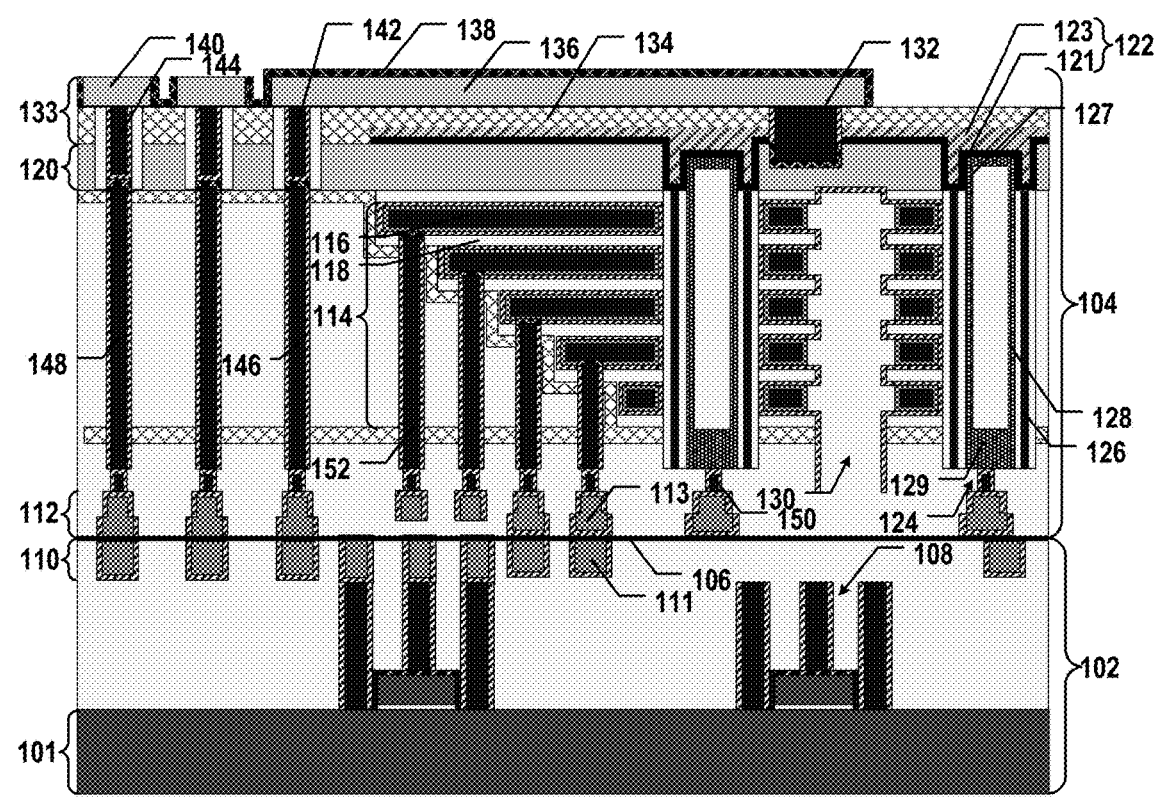
FIG. 1A

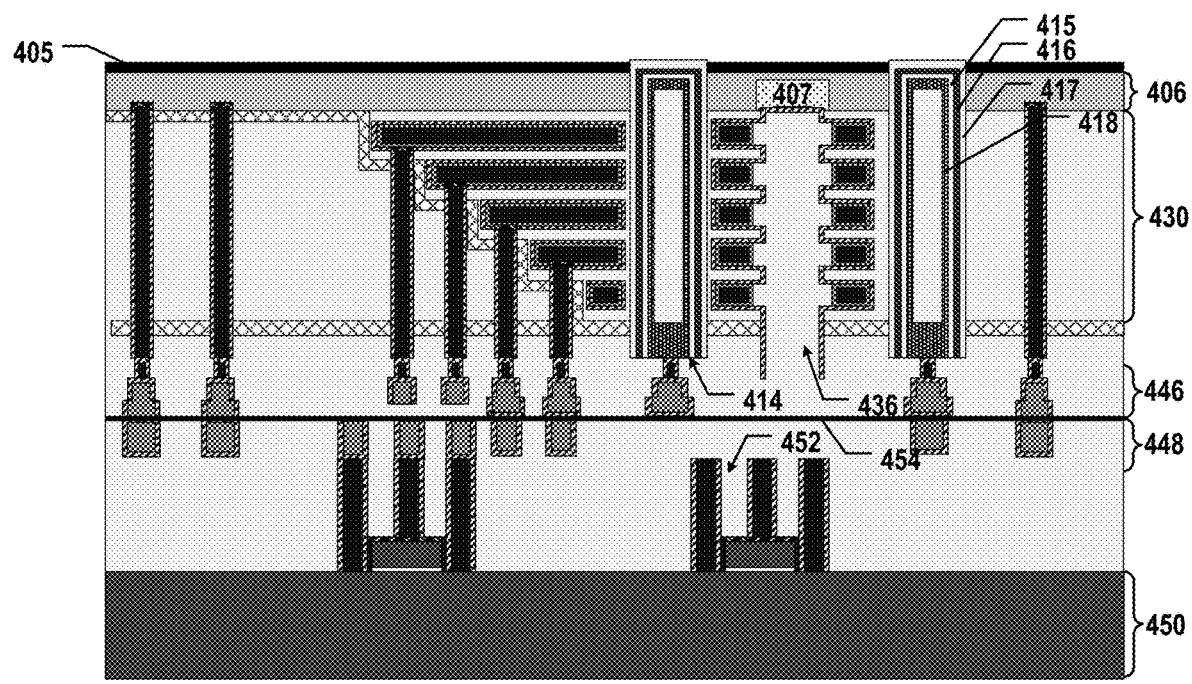
FIG. 4I

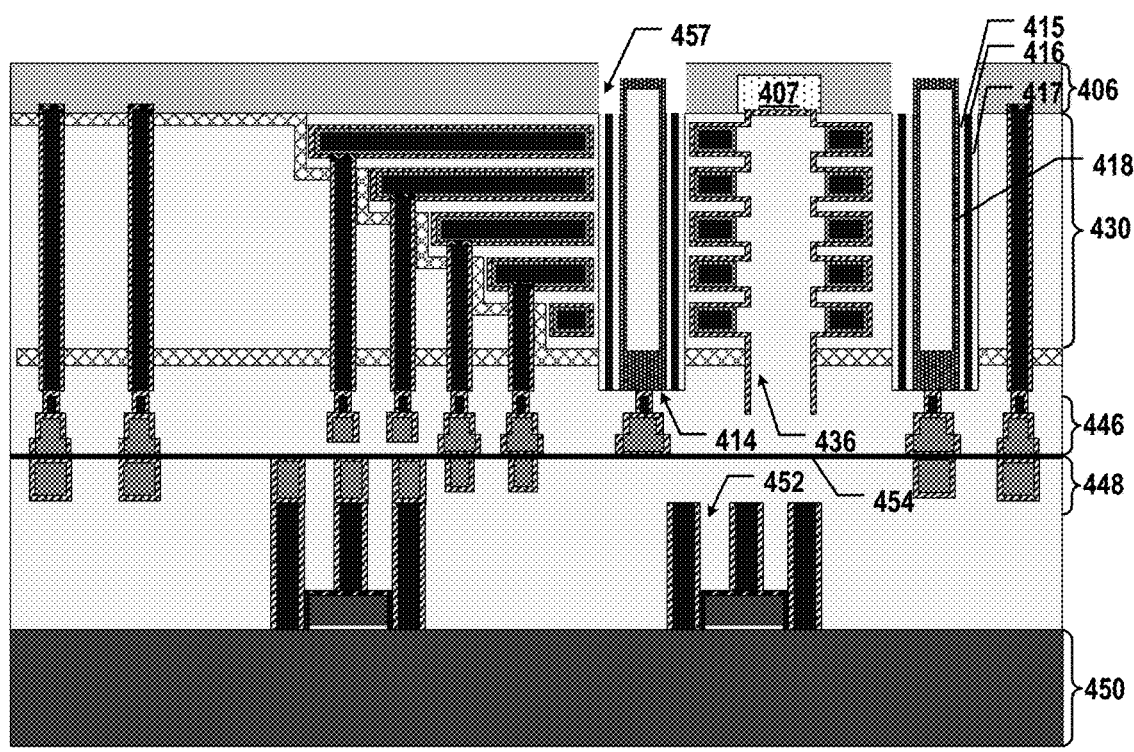
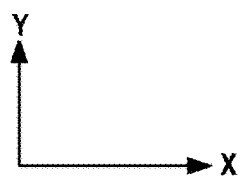
FIG. 4J

METHODS FOR FORMING THREE-DIMENSIONAL MEMORY DEVICES WITH BACKSIDE SOURCE CONTACTS

CROSS-REFERENCE TO RELATED APPLICATIONS

This application is a continuation of International Application No. PCT/CN2020/100521, filed on Jul. 7, 2020, entitled "THREE-DIMENSIONAL MEMORY DEVICES," which claims the benefit of priorities to International Application No. PCT/CN2020/092499, filed on May 27, 2020, entitled "THREE-DIMENSIONAL MEMORY DEVICES," International Application No. PCT/CN2020/092501, filed on May 27, 2020, entitled "METHODS FOR FORMING THREE-DIMENSIONAL MEMORY DEVICES," International Application No. PCT/CN2020/092504, filed on May 27, 2020, entitled "THREE-DIMENSIONAL MEMORY DEVICES," International Application No. PCT/CN2020/092506, filed on May 27, 2020, entitled "METHODS FOR FORMING THREE-DIMENSIONAL MEMORY DEVICES," International Application No. PCT/CN2020/092512, filed on May 27, 2020, entitled "THREE-DIMENSIONAL MEMORY DEVICES," and International Application No. PCT/CN2020/092513, filed on May 27, 2020, entitled "METHODS FOR FORMING THREE-DIMENSIONAL MEMORY DEVICES," all of which are incorporated herein by reference in their entireties. This application is also related to co pending U.S. application Ser. No. 17/020,416, filed on Sep. 14, 2020, entitled "THREE-DIMENSIONAL MEMORY DEVICES," issued as U.S. Pat. No. 11,158,622, U.S. application Ser. No. 17/020,424, filed on Sep. 14, 2020, entitled "METHODS FOR FORMING THREE-DIMENSIONAL MEMORY DEVICES WITH BACKSIDE SOURCE CONTACTS," and U.S. application Ser. No. 17/020,437, filed on Sep. 14, 2020, entitled "METHODS FOR FORMING THREE-DIMENSIONAL MEMORY DEVICES," all of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a substrate, a peripheral circuit on the substrate, a memory stack including interleaved conductive layers and dielectric layers above the peripheral circuit, an N-type doped semiconductor layer above the memory stack, a plurality of channel structures each extending vertically through the memory stack into the N-type doped semiconductor layer, a conductive layer in contact with upper ends of the plurality of channel structures, at least part of which is on the N-type doped semiconductor layer, and a source contact above the memory stack and in contact with the N-type doped semiconductor layer.

In another example, a 3D memory device includes a substrate, a memory stack including interleaved conductive layers and dielectric layers above the substrate, an N-type doped semiconductor layer above the memory stack, and a plurality of channel structures each extending vertically through the memory stack into the N-type doped semiconductor layer. Each of the plurality of channel structures includes a memory film and a semiconductor channel. An upper end of the memory film is below an upper end of the semiconductor channel. The 3D memory device further includes a conductive layer in contact with the semiconductor channels of the plurality of channel structures. At least part of the conductive layer is on the N-type doped semiconductor layer.

In still another example, a 3D memory device includes a first semiconductor structure, a second semiconductor structure, and a bonding interface between the first semiconductor structure and the second semiconductor structure. The first semiconductor structure includes a peripheral circuit. The second semiconductor structure includes a memory stack including interleaved conductive layers and dielectric layers, an N-type doped semiconductor layer, a plurality of channel structures each extending vertically through the memory stack into the N-type doped semiconductor layer and electrically connected to the peripheral circuit, and a conductive layer including a metal silicide layer and a metal layer electrically connecting the plurality of channel structures.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 1A illustrates a side view of a cross-section of an exemplary 3D memory device, according to some embodiments of the present disclosure.

Figure 1B:
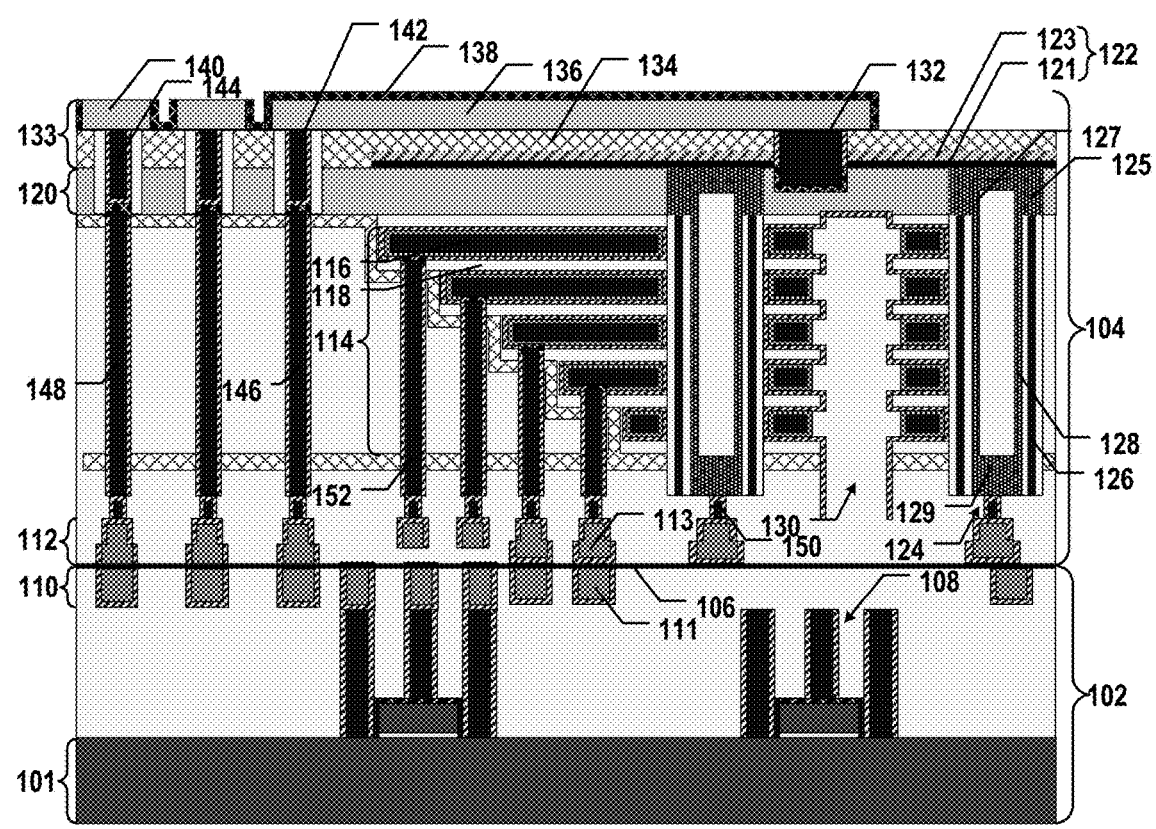
FIG. 1B illustrates a side view of a cross-section of another exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure, or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (via) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, slit structures (e.g., gate line slits (GLSs)) are used for providing electrical connections to the source of the memory array, such as array common source (ACS), from the front side of the devices. The front side source contacts, however, can affect the electrical performance of the 3D memory devices by introducing both leakage current and parasitic capacitance between the word lines and the source contacts, even with the presence of spacers in between. The formation of the spacers also complicates the fabrication process. Besides affecting the electrical performance, the slit structures usually include wall-shaped polysilicon and/or metal fillings, which can introduce local stress to cause wafer bow or warp, thereby reducing the production yield.

Moreover, in some 3D NAND memory devices, semiconductor plugs are selectively grown to surround the sidewalls of channel structures, e.g., known as sidewall selective epitaxial growth (SEG). Compared with another type of semiconductor plugs that are formed at the lower end of the channel structures, e.g., bottom SEG, the formation of sidewall SEG avoids the etching of the memory film and semiconductor channel at the bottom surface of channel holes (also known as "SONO" punch), thereby increasing the process window, in particular when fabricating 3D NAND memory devices with advanced technologies, such as having 96 or more levels with a multi-deck architecture. Sidewall SEGs are usually formed by replacing a sacrificial layer between the substrate and stack structure with the sidewall SEGs, which involves multiple deposition and etching processes through the slit openings. However, as the levels of 3D NAND memory devices continue increasing, the aspect ratio of the slit openings extending through the stack structure becomes larger, making the deposition and etching processes through the slit openings more challenging and undesirable for forming the sidewall SEGs using the known approach due to the increased cost and reduced yield.

Furthermore, the sidewall SEG structure can be combined with backside processes to form source contacts from the backside of the substrate to avoid leakage current and parasitic capacitance between front side source contacts and word lines and increase the effective device area. However, since the backside processes require thinning the substrate, the thickness uniformity is difficult to control at the wafer level in the thinning process, thereby limiting the production yield of the 3D NAND memory devices with sidewall SEG structure and backside processes.

Various embodiments in accordance with the present disclosure provide 3D memory devices with backside source contacts. By moving the source contacts from the front side to the backside, the cost per memory cell can be reduced as the effective memory cell array area can be increased, and the spacer formation process can be skipped. The device performance can be improved as well, for example, by avoiding the leakage current and parasitic capacitance between the word lines and the source contacts and by reducing the local stress caused by the front side slit structures (as source contacts). The sidewall SEGs (e.g., semiconductor plugs) can be formed from the backside of the substrate to avoid any deposition or etching process through the openings extending through the stack structure at the front side of the substrate. As a result, the complexity and cost of the fabrication process can be reduced, and the product yield can be increased. Also, as the fabrication process of the sidewall SEGs is no longer affected by the aspect ratio of the openings through the stack structure, i.e., not limited by the levels of the memory stack, the scalability of the 3D memory devices can be improved as well.

The substrate on which the memory stack is formed can be removed from the backside to expose the channel structures prior to the formation of the sidewall SEGs. Thus, the selection of the substrate can be expanded, for example, to dummy wafers to reduce the cost. In some embodiments, one or more stop layers are used to automatically stop the backside thinning process, such that the substrate can be completely removed to avoid the wafer thickness uniformity control issue and reduce the fabrication complexity of the backside processes. In some embodiments, the same stop layer or another stop layer is used to automatically stop the channel hole etching, which can better control the gouging variation between different channel structures and further increase the backside process window.

After removing the substrate, a conductive layer can be formed from the backside to electrically connect the sources of multiple channel structures, thereby increasing the conductance of the array common source (ACS) of the channel structures. In some embodiments, the conductive layer includes a metal silicide layer in contact with the semiconductor channels of the channel structures to reduce the contact resistance, and also a metal layer in contact with the metal silicide layer to further reduce the total resistance. As a result, the thickness of the semiconductor layer (either N-type doped or P-type doped), as part of the ACS, can be reduced without affecting the ACS conductance.

Various 3D memory device architectures and fabrication methods thereof, for example, with different erase operation mechanisms, are disclosed in the present disclosure to accommodate different requirements and applications. In some embodiments, the sidewall SEGs are parts of an N-type doped semiconductor layer to enable gate-induced-drain-leakage (GIDL) erasing by the 3D memory device. In some embodiments, the sidewall SEGs are parts of a P-type doped semiconductor layer to enable P-well bulk erasing by the 3D memory device.

FIG. 1A illustrates a side view of a cross-section of an exemplary 3D memory device 100, according to some embodiments of the present disclosure. In some embodiments, 3D memory device 100 is a bonded chip including a first semiconductor structure 102 and a second semiconductor structure 104 stacked over first semiconductor structure 102. First and second semiconductor structures 102 and 104 are jointed at a bonding interface 106 therebetween, according to some embodiments. As shown in FIG. 1, first semiconductor structure 102 can include a substrate 101, which can include silicon (e.g., single crystalline silicon, c-Si), silicon germanium (SiGe), gallium arsenide (GaAs), germanium (Ge), SOI, or any other suitable materials.

First semiconductor structure 102 of 3D memory device 100 can include peripheral circuits 108 on substrate 101. It is noted that x and y axes are included in FIG. 1 to further illustrate the spatial relationship of the components in 3D memory device 100 having substrate 101. Substrate 101 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 101) in they-direction (i.e., the vertical direction) when the substrate is positioned in the lowest plane of the semiconductor device in the y-direction. The same notion for describing spatial relationships is applied throughout the present disclosure.

In some embodiments, peripheral circuit 108 is configured to control and sense 3D memory device 100. Peripheral circuit 108 can be any suitable digital, analog, and/or mixed-signal control and sensing circuits used for facilitating the operation of 3D memory device 100 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuits 108 can include transistors formed "on" substrate 101, in which the entirety or part of the transistors are formed in substrate 101 (e.g., below the top surface of substrate 101) and/or directly on substrate 101. Isolation regions (e.g., shallow trench isolations (STIs)) and doped regions (e.g., source regions and drain regions of the transistors) can be formed in substrate 101 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments. It is understood that in some embodiments, peripheral circuit 108 may further include any other circuits compatible with the advanced logic processes including logic circuits, such as processors and programmable logic devices (PLDs), or memory circuits, such as static random-access memory (SRAM) and dynamic RAM (DRAM).

In some embodiments, first semiconductor structure 102 of 3D memory device 100 further includes an interconnect layer (not shown) above peripheral circuits 108 to transfer electrical signals to and from peripheral circuits 108. The interconnect layer can include a plurality of interconnects (also referred to herein as "contacts"), including lateral interconnect lines and vertical interconnect access (VIA) contacts. As used herein, the term "interconnects" can broadly include any suitable types of interconnects, such as middle-end-of-line (MEOL) interconnects and back-end-of-line (BEOL) interconnects. The interconnect layer can further include one or more interlayer dielectric (ILD) layers (also known as "intermetal dielectric (IMD) layers") in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, tungsten (W), cobalt (Co), copper (Cu), aluminum (Al), silicides, or any combination thereof. The ILD layers in the interconnect layer can include dielectric materials including, but not limited to, silicon oxide, silicon nitride, silicon oxynitride, low dielectric constant (low-k) dielectrics, or any combination thereof.

As shown in FIG. 1A, first semiconductor structure 102 of 3D memory device 100 can further include a bonding layer 110 at bonding interface 106 and above the interconnect layer and peripheral circuits 108. Bonding layer 110 can include a plurality of bonding contacts 111 and dielectrics electrically isolating bonding contacts 111. Bonding contacts 111 can include conductive materials including, but not limited to, W, Co, Cu, Al, silicides, or any combination thereof. The remaining area of bonding layer 110 can be formed with dielectrics including, but not limited to, silicon oxide, silicon nitride, silicon oxynitride, low-k dielectrics, or any combination thereof. Bonding contacts 111 and surrounding dielectrics in bonding layer 110 can be used for hybrid bonding.

Similarly, as shown in FIG. 1A, second semiconductor structure 104 of 3D memory device 100 can also include a bonding layer 112 at bonding interface 106 and above bonding layer 110 of first semiconductor structure 102. Bonding layer 112 can include a plurality of bonding contacts 113 and dielectrics electrically isolating bonding contacts 113. Bonding contacts 113 can include conductive materials including, but not limited to, W, Co, Cu, Al, silicides, or any combination thereof. The remaining area of bonding layer 112 can be formed with dielectrics including, but not limited to, silicon oxide, silicon nitride, silicon oxynitride, low-k dielectrics, or any combination thereof. Bonding contacts 113 and surrounding dielectrics in bonding layer 112 can be used for hybrid bonding. Bonding contacts 113 are in contact with bonding contacts 111 at bonding interface 106, according to some embodiments.

As described below in detail, second semiconductor structure 104 can be bonded on top of first semiconductor structure 102 in a face-to-face manner at bonding interface 106. In some embodiments, bonding interface 106 is disposed between bonding layers 110 and 112 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 106 is the place at which bonding layers 112 and 110 are met and bonded. In practice, bonding interface 106 can be a layer with a certain thickness that includes the top surface of bonding layer 110 of first semiconductor structure 102 and the bottom surface of bonding layer 112 of second semiconductor structure 104.

In some embodiments, second semiconductor structure 104 of 3D memory device 100 further includes an interconnect layer (not shown) above bonding layer 112 to transfer electrical signals. The interconnect layer can include a plurality of interconnects, such as MEOL interconnects and BEOL interconnects. The interconnect layer can further include one or more ILD layers in which the interconnect lines and VIA contacts can form. The interconnect lines and VIA contacts in the interconnect layer can include conductive materials including, but not limited to, W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

In some embodiments, 3D memory device 100 is a NAND Flash memory device in which memory cells are provided in the form of an array of NAND memory strings. As shown in FIG. 1A, second semiconductor structure 104 of 3D memory device 100 can include an array of channel structures 124 functioning as the array of NAND memory strings. As shown in FIG. 1A, each channel structure 124 can extend vertically through a plurality of pairs each including a conductive layer 116 and a dielectric layer 118. The interleaved conductive layers 116 and dielectric layers 118 are part of a memory stack 114. The number of the pairs of conductive layers 116 and dielectric layers 118 in memory stack 114 (e.g., 32, 64, 96, 128, 160, 192, 224, 256, or more) determines the number of memory cells in 3D memory device 100. It is understood that in some embodiments, memory stack 114 may have a multi-deck architecture (not shown), which includes a plurality of memory decks stacked over one another. The numbers of the pairs of conductive layers 116 and dielectric layers 118 in each memory deck can be the same or different.

Memory stack 114 can include a plurality of interleaved conductive layers 116 and dielectric layers 118. Conductive layers 116 and dielectric layers 118 in memory stack 114 can alternate in the vertical direction. In other words, except the ones at the top or bottom of memory stack 114, each conductive layer 116 can be adjoined by two dielectric layers 118 on both sides, and each dielectric layer 118 can be adjoined by two conductive layers 116 on both sides. Conductive layers 116 can include conductive materials including, but not limited to, W, Co, Cu, Al, polysilicon, doped silicon, silicides, or any combination thereof. Each conductive layer 116 can include a gate electrode (gate line) surrounded by an adhesive layer and a gate dielectric layer. The gate electrode of conductive layer 116 can extend laterally as a word line, ending at one or more staircase structures of memory stack 114. Dielectric layers 118 can include dielectric materials including, but not limited to, silicon oxide, silicon nitride, silicon oxynitride, or any combination thereof.

As shown in FIG. 1A, second semiconductor structure 104 of 3D memory device 100 can also include an N-type doped semiconductor layer 120 above memory stack 114. N-type doped semiconductor layer 120 can be an example of the "sidewall SEG" as described above. N-type doped semiconductor layer 120 can include a semiconductor material, such as silicon. In some embodiments, N-type doped semiconductor layer 120 includes polysilicon formed by deposition techniques, as described below in detail. N-type doped semiconductor layer 120 can be doped with any suitable N-type dopants, such as phosphorus (P), arsenic (Ar), or antimony (Sb), which contribute free electrons and increase the conductivity of the intrinsic semiconductor. For example, N-type doped semiconductor layer 120 may be a polysilicon layer doped with N-type dopant(s), such as P, Ar, or Sb.

In some embodiments, each channel structure 124 includes a channel hole filled with a semiconductor layer (e.g., as a semiconductor channel 128) and a composite dielectric layer (e.g., as a memory film 126). In some embodiments, semiconductor channel 128 includes silicon, such as amorphous silicon, polysilicon, or single crystalline silicon. In some embodiments, memory film 126 is a composite layer including a tunneling layer, a storage layer (also known as a "charge trap layer"), and a blocking layer. The remaining space of channel structure 124 can be partially or fully filled with a capping layer including dielectric materials, such as silicon oxide, and/or an air gap. Channel structure 124 can have a cylinder shape (e.g., a pillar shape). The capping layer, semiconductor channel 128, the tunneling layer, storage layer, and blocking layer of memory film 126 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, memory film 126 can include a composite layer of silicon oxide/silicon oxynitride/silicon oxide (ONO).

In some embodiments, channel structure 124 further includes a channel plug 129 in the bottom portion (e.g., at the lower end) of channel structure 124. As used herein, the "upper end" of a component (e.g., channel structure 124) is the end farther away from substrate 101 in the y-direction, and the "lower end" of the component (e.g., channel structure 124) is the end closer to substrate 101 in the y-direction when substrate 101 is positioned in the lowest plane of 3D memory device 100. Channel plug 129 can include semiconductor materials (e.g., polysilicon). In some embodiments, channel plug 129 functions as the drain of the NAND memory string.

As shown in FIG. 1A, each channel structure 124 can extend vertically through interleaved conductive layers 116 and dielectric layers 118 of memory stack 114 into N-type doped semiconductor layer 120. The upper end of each channel structure 124 can be flush with or below the top surface of N-type doped semiconductor layer 120. That is, channel structure 124 does not extend beyond the top surface of N-type doped semiconductor layer 120, according to some embodiments. In some embodiments, the upper end of memory film 126 is below the upper end of semiconductor channel 128 in channel structure 124, as shown in FIG. 1A. In some embodiments, the upper end of memory film 126 is below the top surface of N-type doped semiconductor layer 120, and the upper end of semiconductor channel 128 is flush with or below the top surface of N-type doped semiconductor layer 120. For example, as shown in FIG. 1A, memory film 126 may end at the bottom surface of N-type doped semiconductor layer 120, while semiconductor channel 128 may extend above the bottom surface of N-type doped semiconductor layer 120, such that N-type doped semiconductor layer 120 may surround a top portion 127 of semiconductor channel 128 extending into N-type doped semiconductor layer 120. In some embodiments, the doping concentration of top portion 127 of semiconductor channel 128 extending into N-type doped semiconductor layer 120 is different from the doping concentration of the rest of the semiconductor channel 128. For example, semiconductor channel 128 may include undoped polysilicon except top portion 127, which may include doped polysilicon to increase its conductivity in forming an electrical connection with the surrounding N-type doped semiconductor layer 120.

In some embodiments, second semiconductor structure 104 of 3D memory device 100 includes a conductive layer 122 above and in contact with the upper ends of channel structures 124. Conductive layer 122 can electrically connect multiple channel structures 124. Although not shown in the side view of FIG. 1A, it is understood that conductive layer 122 may be a continuous conductive layer (e.g., a conductive plate with holes therein (a mesh) to allow source contacts 132 to pass through in the plan view) in contact with multiple channel structures 124. As a result, conductive layer 122 and N-type doped semiconductor layer 120 can together provide electrical connections between the sources of an array of NAND memory string in the same block, i.e., the ACS. As shown in FIG. 1A, in some embodiments, conductive layer 122 includes two portions in the lateral direction: a first portion on N-type doped semiconductor layer 120 (outside of the regions of channel structures 124) and a second portion abutting N-type doped semiconductor layer 120 and in contact with the upper ends of channel structures 124 (within the regions of channel structures 124). That is, at least part of conductive layer 122 (i.e., the first portion) is on N-type doped semiconductor layer 120, according to some embodiments. The remainder of conductive layer 122 (i.e., the second portion) surrounding the upper end of each channel structure 124 extending into N-type doped semiconductor layer 120 is in contact with top portions 127 of semiconductor channels 128, according to some embodiments. As described below in detail, the formation of memory stack 114 and the formation of conductive layer 122 and top portions 127 of semiconductor channels 128 occur at opposite sides of N-type doped semiconductor layer 120, which can avoid any deposition or etching process through openings extending through memory stack 114, thereby reducing the fabrication complexity and cost and increasing the yield and vertical scalability.

In some embodiments, conductive layer 122 includes multiple layers in the vertical direction, including a metal silicide layer 121 and a metal layer 123 above metal silicide layer 121. Each of metal silicide layer 121 and metal layer 123 can be a continuous film. Metal silicide layer 121 can be disposed above and in contact with N-type doped semiconductor layer 120 (in the first portion of conductive layer 122) and the upper ends of channel structures 124 (in the second portion of conductive layer 122). In some embodiments, part of metal silicide layer 121 surrounds and contacts top portions 127 of semiconductor channels 128 extending into N-type doped semiconductor layer 120 to make electrical connections with multiple channel structures 124. Metal silicide layer 121 can include a metal silicide, such as copper silicide, cobalt silicide, nickel silicide, titanium silicide, tungsten silicide, silver silicide, aluminum silicide, gold silicide, platinum silicide, any other suitable metal silicide, or any combinations thereof. Metal layer 123 is above and in contact with metal silicide layer 121, according to some embodiments. Metal layer 123 can include a metal, such as W, Co, Cu, Al, nickel (Ni), titanium (Ti), any other suitable metal, or any combinations thereof. It is understood that the metal in metal layer 123 may broadly include any suitable conductive metal compounds and metal alloys as well, such as titanium nitride and tantalum nitride. Metal silicide layer 121 can reduce the contact resistance between conductive layer 122 and top portions 127 of semiconductor channels 128 as well as serve as the barrier layer of metal layer 123 in conductive layer 122.

By combining conductive layer 122 and N-type doped semiconductor layer 120, the conductance between channel structures 124 (i.e., at the ACS of NAND memory strings in the same block) can be increased compared with N-type doped semiconductor layer 120 alone, thereby improving the electrical performance of 3D memory device 100. By introducing conductive layer 122, to maintain the same conductance/resistance between channel structures 124, the thickness of N-type doped semiconductor layer 120 can be reduced, for example, to be less than about 50 nm, such as less than 50 nm. In some embodiments, the thickness of N-type doped semiconductor layer 120 is between about 10 nm and about 30 nm, such as between 10 nm and 30 nm (e.g., 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, any range bounded by the lower end by any of these values, or in any range defined by any two of these values). N-type doped semiconductor layer 120 in combination with conductive layer 122, which surround top portion 127 of semiconductor channels 128 of channel structures 124, can enable GIDL-assisted body biasing for erase operations for 3D memory device 100. The GIDL around the source select gate of the NAND memory string can generate hole current into the NAND memory string to raise the body potential for erase operations. That is, 3D memory device 100 is configured to generate GIDL-assisted body biasing when performing an erase operation, according to some embodiments.

As shown in FIG. 1A, second semiconductor structure 104 of 3D memory device 100 can further include insulating structures 130 each extending vertically through interleaved conductive layers 116 and dielectric layers 118 of memory stack 114. Different from channel structure 124 that extends further into N-type doped semiconductor layer 120, insulating structures 130 stops at the bottom surface of N-type doped semiconductor layer 120, i.e., does not extend vertically into N-type doped semiconductor layer 120, according to some embodiments. That is, the top surface of insulating structure 130 can be flush with the bottom surface of N-type doped semiconductor layer 120. Each insulating structure 130 can also extend laterally to separate channel structures 124 into a plurality of blocks. That is, memory stack 114 can be divided into a plurality of memory blocks by insulating structures 130, such that the array of channel structures 124 can be separated into each memory block. Different from the slit structures in existing 3D NAND memory devices described above, which include front side ACS contacts, insulating structure 130 does not include any contact therein (i.e., not functioning as the source contact) and thus, does not introduce parasitic capacitance and leakage current with conductive layers 116 (including word lines), according to some embodiments. In some embodiments, each insulating structure 130 includes an opening (e.g., a slit) filled with one or more dielectric materials, including, but not limited to, silicon oxide, silicon nitride, silicon oxynitride, or any combination thereof. In one example, each insulating structure 130 may be filled with silicon oxide.

Moreover, as described below in detail, because the opening for forming insulating structure 130 is not used for forming N-type doped semiconductor layer 120 and the second portion of conductive layer 122, the increased aspect ratio of the opening (e.g., greater than 50) as the number of interleaved conductive layers 116 and dielectric layers 118 increases would not affect the formation of N-type doped semiconductor layer 120 and conductive layer 122.

Instead of the front side source contacts, 3D memory device 100 can include a backside source contact 132 above memory stack 114 and in contact with N-type doped semiconductor layer 120, as shown in FIG. 1. Source contact 132 and memory stack 114 (and insulating structure 130 therethrough) can be disposed at opposites sides of N-type doped semiconductor layer 120 and thus, viewed as a "backside" source contact. In some embodiments, source contact 132 is electrically connected to semiconductor channel 128 of channel structure 124 through N-type doped semiconductor layer 120. In some embodiments, source contact 132 is not laterally aligned with insulating structure 130, but approximate to channel structure 124 to reduce the resistance of the electrical connection therebetween. For example, source contact 132 may be laterally between insulating structure 130 and channel structure 124 (e.g., in the x-direction in FIG. 1). Source contacts 132 can include any suitable types of contacts. In some embodiments, source contacts 132 include a VIA contact. In some embodiments, source contacts 132 include a wall-shaped contact extending laterally. Source contact 132 can include one or more conductive layers, such as a metal layer (e.g., W, Co, Cu, or Al) or a silicide layer surrounded by an adhesive layer (e.g., titanium nitride (TiN)).

Figure 3A:
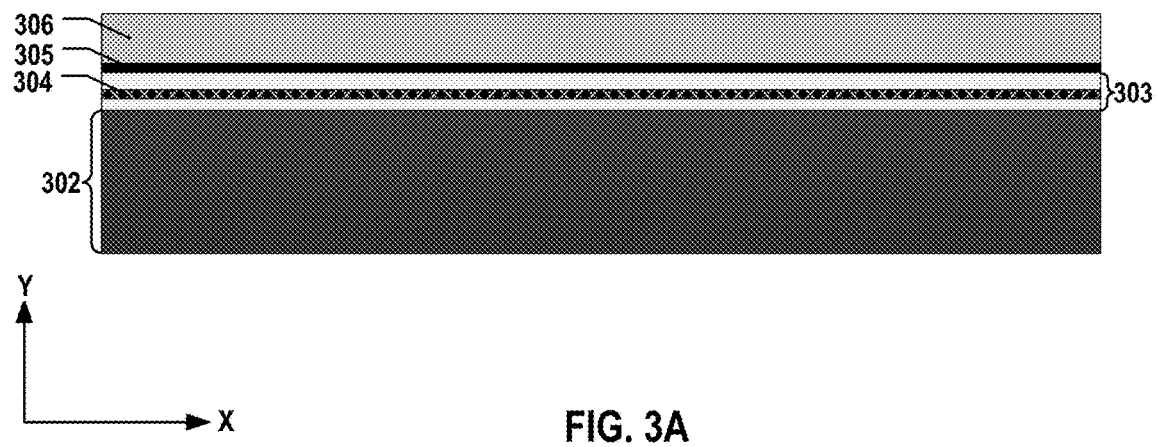
FIGS. 3A-3P illustrate a fabrication process for forming an exemplary 3D memory device, according to some embodiments of the present disclosure.
Figure 3B:
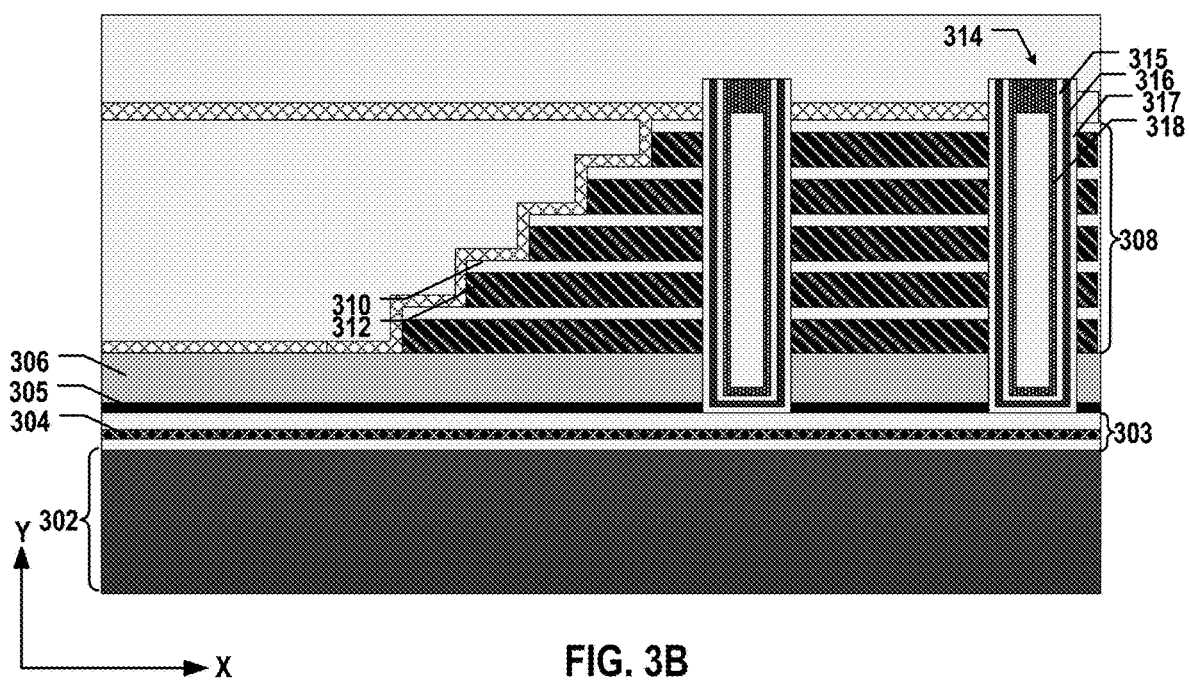
Figure 3C:
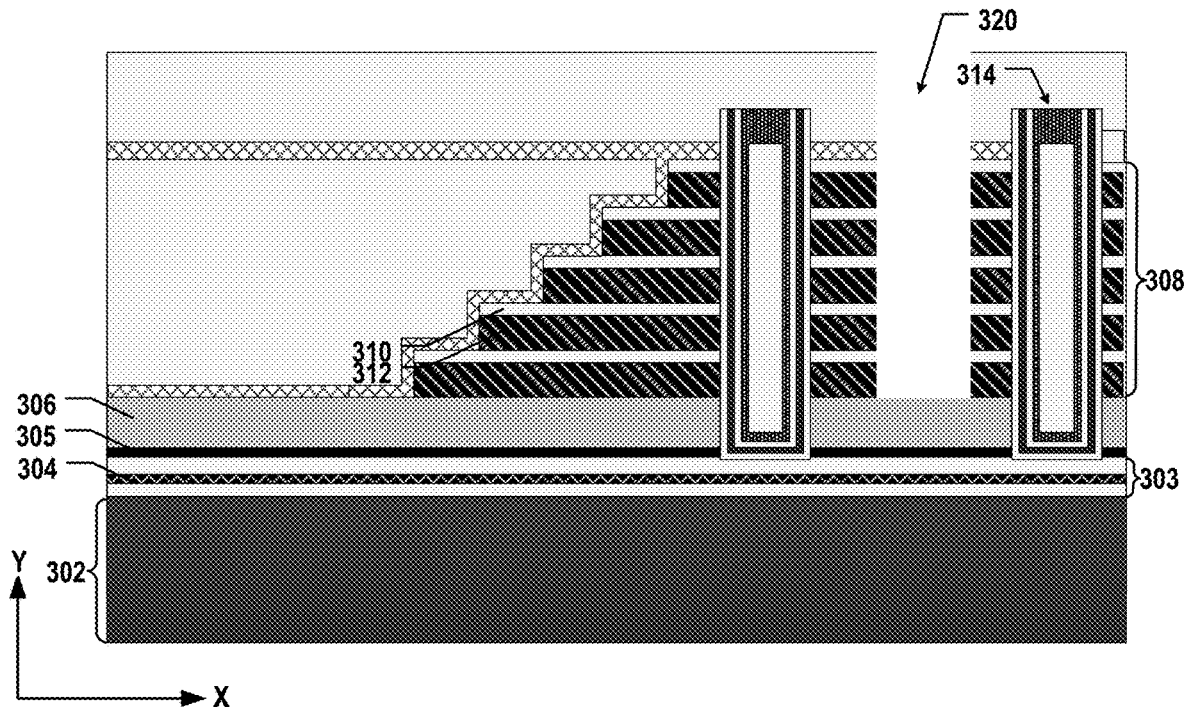
Figure 3D:
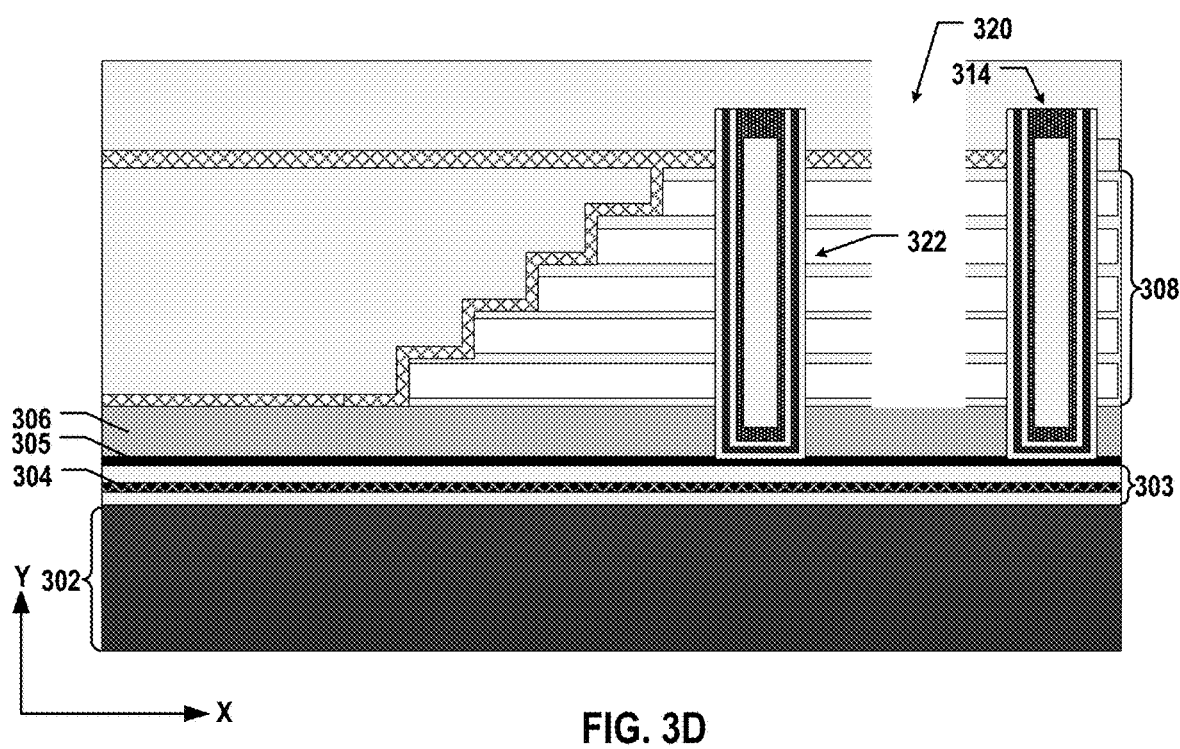

As shown in FIG. 1A, 3D memory device 100 can further include a BEOL interconnect layer 133 above and electrically connected to source contact 132 for pad-out, e.g., transferring electrical signals between 3D memory device 100 and external circuits. In some embodiments, interconnect layer 133 includes one or more ILD layers 134 on N-type doped semiconductor layer 120 and a redistribution layer 136 on ILD layers 134. The upper end of source contact 132 is flush with the top surface of ILD layers 134, and the bottom surface of redistribution layer 136, and source contact 132 extends vertically through ILD layers 134 and conductive layer 122 into N-type doped semiconductor layer 120, according to some embodiments. ILD layers 134 in interconnect layer 133 can include dielectric materials including, but not limited to, silicon oxide, silicon nitride, silicon oxynitride, low-k dielectrics, or any combination thereof. Redistribution layer 136 in interconnect layer 133 can include conductive materials including, but not limited to, W, Co, Cu, Al, silicides, or any combination thereof. In one example, redistribution layer 136 may include Al. In some embodiments, interconnect layer 133 further includes a passivation layer 138 as the outmost layer for passivation and protection of 3D memory device 100. Part of redistribution layer 136 can be exposed from passivation layer 138 as contact pads 140. That is, interconnect layer 133 of 3D memory device 100 can also include contact pads 140 for wire bonding and/or bonding with an interposer.

In some embodiments, second semiconductor structure 104 of 3D memory device 100 further includes contacts 142 and 144 through N-type doped semiconductor layer 120. As N-type doped semiconductor layer 120 can include polysilicon, contacts 142 and 144 are through silicon contacts (TSCs), according to some embodiments. In some embodiments, contact 142 extends through N-type doped semiconductor layer 120 and ILD layers 134 to be in contact with redistribution layer 136, such that N-type doped semiconductor layer 120 is electrically connected to contact 142 through source contact 132 and redistribution layer 136 of interconnect layer 133. In some embodiments, contact 144 extends through N-type doped semiconductor layer 120 and ILD layers 134 to be in contact with contact pad 140. Contacts 142 and 144 each can include one or more conductive layers, such as a metal layer (e.g., W, Co, Cu, or Al) or a silicide layer surrounded by an adhesive layer (e.g., TiN). In some embodiments, at least contact 144 further includes a spacer (e.g., a dielectric layer) to electrically separate contact 144 from N-type doped semiconductor layer 120.

In some embodiments, 3D memory device 100 further includes peripheral contacts 146 and 148 each extending vertically outside of memory stack 114. Each peripheral contact 146 or 148 can have a depth greater than the depth of memory stack 114 to extend vertically from bonding layer 112 to N-type doped semiconductor layer 120 in a peripheral region that is outside of memory stack 114. In some embodiments, peripheral contact 146 is below and in contact with contact 142, such that N-type doped semiconductor layer 120 is electrically connected to peripheral circuit 108 in first semiconductor structure 102 through at least source contact 132, interconnect layer 133, contact 142, and peripheral contact 146. In some embodiments, peripheral contact 148 is below and in contact with contact 144, such that peripheral circuit 108 in first semiconductor structure 102 is electrically connected to contact pad 140 for pad-out through at least contact 144 and peripheral contact 148. Peripheral contacts 146 and 148 each can include one or more conductive layers, such as a metal layer (e.g., W, Co, Cu, or Al) or a silicide layer surrounded by an adhesive layer (e.g., TiN). In some embodiments, conductive layer 122 is within the region of memory stack 114, i.e., does not extend laterally into the peripheral region, such that contacts 142 and 144 do not extend vertically through conductive layer 122 in order to be in contact with peripheral contacts 148 and 144, respectively.

As shown in FIG. 1, 3D memory device 100 also includes a variety of local contacts (also known as "Cl") as part of the interconnect structure, which are in contact with a structure in memory stack 114 directly. In some embodiments, the local contacts include channel local contacts 150 each below and in contact with the lower end of respective channel structure 124. Each channel local contact 150 can be electrically connected to a bit line contact (not shown) for bit line fan-out. In some embodiments, the local contacts further include word line local contacts 152 each below and in contact with respective conductive layer 116 (including a word line) at the staircase structure of memory stack 114 for word line fan-out. Local contacts, such as channel local contacts 150 and word line local contacts 152, can be electrically connected to peripheral circuits 108 of first semiconductor structure 102 through at least bonding layers 112 and 110. Local contacts, such as channel local contacts 150 and word line local contacts 152, each can include one or more conductive layers, such as a metal layer (e.g., W, Co, Cu, or Al) or a silicide layer surrounded by an adhesive layer (e.g., TiN).

FIG. 1B illustrates a side view of a cross-section of another exemplary 3D memory device 150, according to some embodiments of the present disclosure. 3D memory device 150 is similar to 3D memory device 100 except for the different structures of conductive layer 122 and the upper ends of channel structures 124. It is understood that the details of other same structures in both 3D memory devices 150 and 100 are not repeated for ease of description.

As shown in FIG. 1B, each channel structure 124 further includes a channel plug 125 abutting N-type doped semiconductor layer 120, according to some embodiments. In some embodiments, each channel plug 125 surrounds and contacts respective top portion 127 of semiconductor channel 128. The top surface of channel plug 125 can be flush with the top surface of N-type doped semiconductor layer 120. Channel plug 125 can have the same material as top portion 127 of semiconductor channel 128, for example, doped polysilicon, and thus, can be viewed as part of semiconductor channel 128 of channel structure 124. That is, the entire doped polysilicon structure surrounded by N-type doped semiconductor layer 120 may be viewed as the upper end of channel structure 124 in the present disclosure. Thus, conductive layer 122 (and metal silicide layer 121 therein) in both 3D memory devices 100 and 150 is in contact with the upper ends of channel structures 124, according to some embodiments.

Different from conductive layer 122 in 3D memory devices 100 in which the second portion of conductive layer 122 is below the top surface of N-type doped semiconductor layer 120 and surrounds the upper end of channel structure 124 as shown in FIG. 1A, since the upper end of channel structure 124 also includes channel plug 125 in FIG. 1B, the entire conductive layer 122 is above the top surface of N-type doped semiconductor layer 120. As shown in FIG. 1B, the top surface of the upper end of channel structure 124 is flush with the top surface of N-type doped semiconductor layer 120, and conductive layer 122 is disposed on N-type doped semiconductor layer 120 and the upper ends of channel structures 124. In other words, part of conductive layer 122 in 3D memory devices 100 that fills up the recess between N-type doped semiconductor layer 120 and top portion 127 of semiconductor channel 128 can be replaced by channel plug 125 in 3D memory device 150, such that conductive layer 122 can be formed in the same plane on the top surface of N-type doped semiconductor layer 120 and channel structures 124.

Figure 1C:
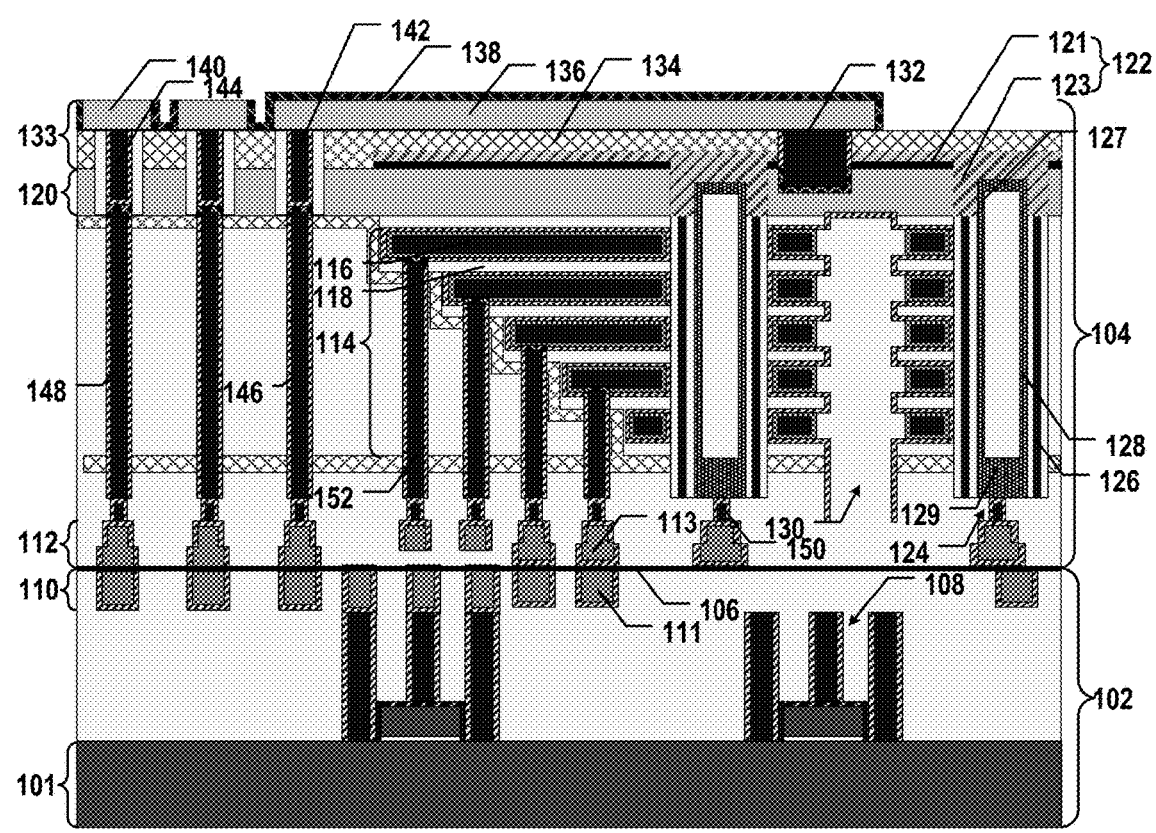
FIG. 1C illustrates a side view of a cross-section of still another exemplary 3D memory device, according to some embodiments of the present disclosure.

FIG. 1C illustrates a side view of a cross-section of still another exemplary 3D memory device 160, according to some embodiments of the present disclosure. 3D memory device 160 is similar to 3D memory device 100 except for the different structures of conductive layer 122. It is understood that the details of other same structures in both 3D memory devices 160 and 100 are not repeated for ease of description.

As shown in FIG. 1C, metal layer 123 of conductive layer 122 is in contact with semiconductor channels 128, and part of metal layer 123 is above and in contact with metal silicide layer 121, according to some embodiments. Different from conductive layer 122 in 3D memory devices 100 in which part of metal silicide layer 121 is below the top surface of N-type doped semiconductor layer 120 and surrounds top portions 127 of semiconductor channels 128, in 3D memory device 160, only metal layer 123 is below the top surface of N-type doped semiconductor layer 120 and surrounds top portions 127 of semiconductor channels 128. Nevertheless, the first portion of conductive layer 122 has the same structure in 3D memory devices 100, 150, and 160, i.e., having metal silicide layer 121 on N-type doped semiconductor layer 120 and metal layer 123 above and in contact with metal silicide layer 121. As to the second portion of conductive layer 122 (within the regions of channel structures 124), the various structures in 3D memory devices 100, 150, and 160 may be caused by the different examples for forming conductive layers 122 described below in detail with respect to the fabrication processes, for example, the ways how the recess between N-type doped semiconductor layer 120 and top portion 127 of semiconductor channel 128 is filled up.

For example, as described below in detail, metal silicide layer 121 of 3D memory device 160 in FIG. 1C may be part of a stop layer for automatically stopping the etching of the channel holes of channel structures 124. The stop layer may be patterned to expose the upper ends of channel structures 124 from the backside of N-type doped semiconductor layer 120, and the remainder of the stop layer may remain in 3D memory device 160 as metal silicide layer 121. Metal layer 123 then can be formed to fill up the recess between N-type doped semiconductor layer 120 and top portion 127 of semiconductor channel 128 as well as on metal silicide layer 121. In contrast, the same stop layer in 3D memory devices 100 and 150 may be removed prior to the formation of conductive layer 122. Thus, metal silicide layer 121 in 3D memory devices 100 and 150 may be formed after the removal of the stop layer from the backside of N-type doped semiconductor layer 120 to be in contact with the upper ends of channel structures 124, either without channel plug 125 in 3D memory device 100 or with channel plug 125 in 3D memory device 150, which can lower the contact resistance with channel structure 124, but increase the number of processes, compared with conductive layer 122 in 3D memory device 160.

Figure 2A:
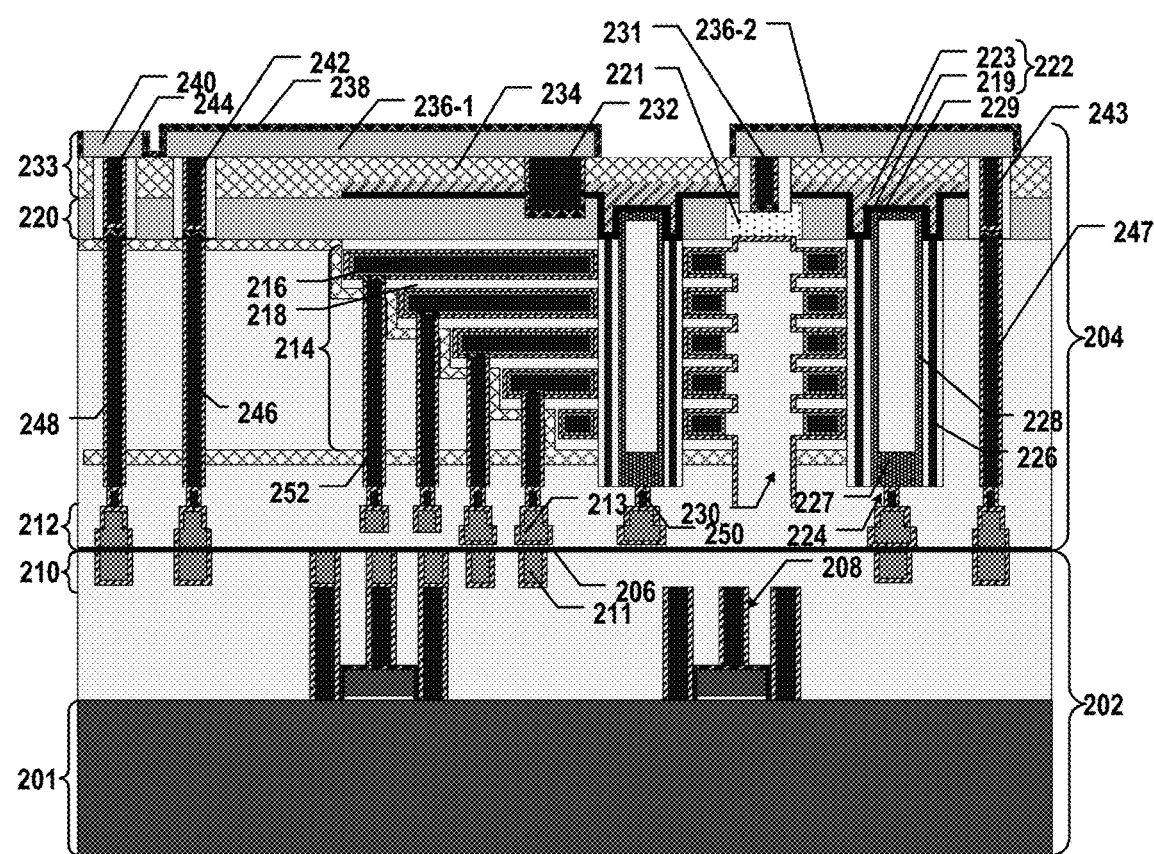
FIG. 2A illustrates a side view of a cross-section of yet another exemplary 3D memory device, according to some embodiments of the present disclosure.

FIG. 2A illustrates a side view of a cross-section of another exemplary 3D memory device 200, according to some embodiments of the present disclosure. In some embodiments, 3D memory device 200 is a bonded chip including a first semiconductor structure 202 and a second semiconductor structure 204 stacked over first semiconductor structure 202. First and second semiconductor structures 202 and 204 are jointed at a bonding interface 206 therebetween, according to some embodiments. As shown in FIG. 2A, first semiconductor structure 202 can include a substrate 201, which can include silicon (e.g., single crystalline silicon, c-Si), SiGe, GaAs, Ge, SOI, or any other suitable materials.

First semiconductor structure 202 of 3D memory device 200 can include peripheral circuits 208 on substrate 201. In some embodiments, peripheral circuit 208 is configured to control and sense 3D memory device 200. Peripheral circuit 208 can be any suitable digital, analog, and/or mixed-signal control and sensing circuits used for facilitating the operation of 3D memory device 200 including, but not limited to, a page buffer, a decoder (e.g., a row decoder and a column decoder), a sense amplifier, a driver (e.g., a word line driver), a charge pump, a current or voltage reference, or any active or passive components of the circuit (e.g., transistors, diodes, resistors, or capacitors). Peripheral circuits 208 can include transistors formed "on" substrate 201, in which the entirety or part of the transistors are formed in substrate 201 (e.g., below the top surface of substrate 201) and/or directly on substrate 201. Isolation regions (e.g., shallow trench isolations (STIs)) and doped regions (e.g., source regions and drain regions of the transistors) can be formed in substrate 201 as well. The transistors are high-speed with advanced logic processes (e.g., technology nodes of 90 nm, 65 nm, 45 nm, 32 nm, 28 nm, 20 nm, 16 nm, 14 nm, 10 nm, 7 nm, 5 nm, 3 nm, 2 nm, etc.), according to some embodiments. It is understood that in some embodiments, peripheral circuit 208 may further include any other circuits compatible with the advanced logic processes including logic circuits, such as processors and PLDs, or memory circuits, such as SRAM and DRAM.

In some embodiments, first semiconductor structure 202 of 3D memory device 200 further includes an interconnect layer (not shown) above peripheral circuits 208 to transfer electrical signals to and from peripheral circuits 208. The interconnect layer can include a plurality of interconnects (also referred to herein as "contacts"), including lateral interconnect lines and VIA contacts. As used herein, the term "interconnects" can broadly include any suitable types of interconnects, such as MEOL interconnects and BEOL interconnects. The interconnect layer can further include one or more ILD layers (also known as "(IMD layers") in which the interconnect lines and VIA contacts can form. That is, the interconnect layer can include interconnect lines and VIA contacts in multiple ILD layers. The interconnect lines and VIA contacts in the interconnect layer can include conductive materials including, but not limited to, W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

As shown in FIG. 2A, first semiconductor structure 202 of 3D memory device 200 can further include a bonding layer 210 at bonding interface 206 and above the interconnect layer and peripheral circuits 208. Bonding layer 210 can include a plurality of bonding contacts 211 and dielectrics electrically isolating bonding contacts 211. Bonding contacts 211 can include conductive materials including, but not limited to, W, Co, Cu, Al, silicides, or any combination thereof. The remaining area of bonding layer 210 can be formed with dielectrics including, but not limited to, silicon oxide, silicon nitride, silicon oxynitride, low-k dielectrics, or any combination thereof. Bonding contacts 211 and surrounding dielectrics in bonding layer 210 can be used for hybrid bonding.

Similarly, as shown in FIG. 2A, second semiconductor structure 204 of 3D memory device 200 can also include a bonding layer 212 at bonding interface 206 and above bonding layer 210 of first semiconductor structure 202. Bonding layer 212 can include a plurality of bonding contacts 213 and dielectrics electrically isolating bonding contacts 213. Bonding contacts 213 can include conductive materials including, but not limited to, W, Co, Cu, Al, silicides, or any combination thereof. The remaining area of bonding layer 212 can be formed with dielectrics including, but not limited to, silicon oxide, silicon nitride, silicon oxynitride, low-k dielectrics, or any combination thereof. Bonding contacts 213 and surrounding dielectrics in bonding layer 212 can be used for hybrid bonding. Bonding contacts 213 are in contact with bonding contacts 211 at bonding interface 206, according to some embodiments.

As described below in detail, second semiconductor structure 204 can be bonded on top of first semiconductor structure 202 in a face-to-face manner at bonding interface 206. In some embodiments, bonding interface 206 is disposed between bonding layers 210 and 212 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 206 is the place at which bonding layers 212 and 210 are met and bonded. In practice, bonding interface 206 can be a layer with a certain thickness that includes the top surface of bonding layer 210 of first semiconductor structure 202 and the bottom surface of bonding layer 212 of second semiconductor structure 204.

In some embodiments, second semiconductor structure 204 of 3D memory device 200 further includes an interconnect layer (not shown) above bonding layer 212 to transfer electrical signals. The interconnect layer can include a plurality of interconnects, such as MEOL interconnects and BEOL interconnects. The interconnect layer can further include one or more ILD layers in which the interconnect lines and VIA contacts can form. The interconnect lines and VIA contacts in the interconnect layer can include conductive materials including, but not limited to, W, Co, Cu, Al, silicides, or any combination thereof. The ILD layers in the interconnect layer can include dielectric materials including, but not limited to, silicon oxide, silicon nitride, silicon oxynitride, low-k dielectrics, or any combination thereof.

In some embodiments, 3D memory device 200 is a NAND Flash memory device in which memory cells are provided in the form of an array of NAND memory strings. As shown in FIG. 2A, second semiconductor structure 204 of 3D memory device 200 can include an array of channel structures 224 functioning as the array of NAND memory strings. As shown in FIG. 2A, each channel structure 224 can extend vertically through a plurality of pairs each including a conductive layer 216 and a dielectric layer 218. The interleaved conductive layers 216 and dielectric layers 218 are part of a memory stack 214. The number of the pairs of conductive layers 216 and dielectric layers 218 in memory stack 214 (e.g., 32, 64, 96, 128, 160, 192, 224, 256, or more) determines the number of memory cells in 3D memory device 200. It is understood that in some embodiments, memory stack 214 may have a multi-deck architecture (not shown), which includes a plurality of memory decks stacked over one another. The numbers of the pairs of conductive layers 216 and dielectric layers 218 in each memory deck can be the same or different.

Memory stack 214 can include a plurality of interleaved conductive layers 216 and dielectric layers 218. Conductive layers 216 and dielectric layers 218 in memory stack 214 can alternate in the vertical direction. In other words, except the ones at the top or bottom of memory stack 214, each conductive layer 216 can be adjoined by two dielectric layers 218 on both sides, and each dielectric layer 218 can be adjoined by two conductive layers 216 on both sides. Conductive layers 216 can include conductive materials including, but not limited to, W, Co, Cu, Al, polysilicon, doped silicon, silicides, or any combination thereof. Each conductive layer 216 can include a gate electrode (gate line) surrounded by an adhesive layer and a gate dielectric layer. The gate electrode of conductive layer 216 can extend laterally as a word line, ending at one or more staircase structures of memory stack 214. Dielectric layers 218 can include dielectric materials including, but not limited to, silicon oxide, silicon nitride, silicon oxynitride, or any combination thereof.

As shown in FIG. 2A, second semiconductor structure 204 of 3D memory device 200 can also include a P-type doped semiconductor layer 220 above memory stack 114. P-type doped semiconductor layer 220 can be an example of the "sidewall SEG" as described above. P-type doped semiconductor layer 220 can include a semiconductor material, such as silicon. In some embodiments, P-type doped semiconductor layer 220 includes polysilicon formed by deposition techniques, as described below in detail. P-type doped semiconductor layer 220 can be doped with any suitable P-type dopants, such as boron (B), gallium (Ga), or aluminum (Al), to an intrinsic semiconductor creates deficiencies of valence electrons, called "holes." For example, P-type doped semiconductor layer 220 may be a polysilicon layer doped with P-type dopant(s), such as B, Ga, or Al.

In some embodiments, second semiconductor structure 204 of 3D memory device 200 further includes an N-well 221 in P-type doped semiconductor layer 220. N-well 221 can be doped with any suitable N-type dopants, such as phosphorus (P), arsenic (Ar), or antimony (Sb), which contribute free electrons and increase the conductivity of the intrinsic semiconductor. In some embodiments, N-well 221 is doped from the bottom surface of P-type doped semiconductor layer 220. It is understood that N-well 221 may extend vertically in the entire thickness of P-type doped semiconductor layer 220, i.e., to the top surface of P-type doped semiconductor layer 220, or part of the entire thickness of P-type doped semiconductor layer 220.

In some embodiments, each channel structure 224 includes a channel hole filled with a semiconductor layer (e.g., as a semiconductor channel 228) and a composite dielectric layer (e.g., as a memory film 226). In some embodiments, semiconductor channel 228 includes silicon, such as amorphous silicon, polysilicon, or single crystalline silicon. In some embodiments, memory film 226 is a composite layer including a tunneling layer, a storage layer (also known as a "charge trap layer"), and a blocking layer. The remaining space of channel structure 224 can be partially or fully filled with a capping layer including dielectric materials, such as silicon oxide, and/or an air gap. Channel structure 224 can have a cylinder shape (e.g., a pillar shape). The capping layer, semiconductor channel 228, the tunneling layer, storage layer, and blocking layer of memory film 226 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, memory film 226 can include a composite layer of silicon oxide/silicon oxynitride/silicon oxide (ONO).

In some embodiments, channel structure 224 further includes a channel plug 227 in the bottom portion (e.g., at the lower end) of channel structure 224. As used herein, the "upper end" of a component (e.g., channel structure 224) is the end farther away from substrate 201 in the y-direction, and the "lower end" of the component (e.g., channel structure 224) is the end closer to substrate 201 in the y-direction when substrate 201 is positioned in the lowest plane of 3D memory device 200. Channel plug 227 can include semiconductor materials (e.g., polysilicon). In some embodiments, channel plug 227 functions as the drain of the NAND memory string.

As shown in FIG. 2A, each channel structure 224 can extend vertically through interleaved conductive layers 216 and dielectric layers 218 of memory stack 214 into P-type doped semiconductor layer 220. The upper end of each channel structure 224 can be flush with or below the top surface of P-type doped semiconductor layer 220. That is, channel structure 224 does not extend beyond the top surface of P-type doped semiconductor layer 220, according to some embodiments. In some embodiments, the upper end of memory film 226 is below the upper end of semiconductor channel 228 in channel structure 224, as shown in FIG. 2A. In some embodiments, the upper end of memory film 226 is below the top surface of P-type doped semiconductor layer 220, and the upper end of semiconductor channel 228 is flush with or below the top surface of P-type doped semiconductor layer 220. For example, as shown in FIG. 2A, memory film 226 may end at the bottom surface of P-type doped semiconductor layer 220, while semiconductor channel 228 may extend above the bottom surface of P-type doped semiconductor layer 220, such that P-type doped semiconductor layer 220 may surround and in contact with a top portion 229 of semiconductor channel 228 extending into P-type doped semiconductor layer 220. In some embodiments, the doping concentration of top portion 229 of semiconductor channel 228 extending into P-type doped semiconductor layer 220 is different from the doping concentration of the rest of semiconductor channel 228. For example, semiconductor channel 228 may include undoped polysilicon except top portion 229, which may include doped polysilicon to increase its conductivity in forming an electrical connection with surrounding P-type doped semiconductor layer 220.

In some embodiments, second semiconductor structure 204 of 3D memory device 200 includes a conductive layer 222 above and in contact with the upper ends of channel structures 224. Conductive layer 222 can electrically connect multiple channel structures 224. Although not shown in the side view of FIG. 2A, it is understood that conductive layer 222 may be a continuous conductive layer (e.g., a conductive plate with holes therein (a mesh) to allow source contacts 232 to pass through in the plan view) in contact with multiple channel structures 224. As a result, conductive layer 222 and P-type doped semiconductor layer 220 can together provide electrical connections between the sources of an array of NAND memory strings in the same block, i.e., the ACS. As shown in FIG. 2A, in some embodiments, conductive layer 222 includes two portions in the lateral direction: a first portion on P-type doped semiconductor layer 220 (outside of the regions of channel structures 224) and a second portion abutting P-type doped semiconductor layer 220 and in contact with the upper ends of channel structures 224 (within the regions of channel structures 224). That is, at least part of conductive layer 222 (i.e., the first portion) is on P-type doped semiconductor layer 220, according to some embodiments. The remainder of conductive layer 222 (i.e., the second portion) surrounding the upper end of each channel structure 224 extending into P-type doped semiconductor layer 220 is in contact with top portions 229 of semiconductor channels 228, according to some embodiments. As described below in detail, the formation of memory stack 214 and the formation of conductive layer 222 and top portions 229 of semiconductor channels 228 occur at opposite sides of P-type doped semiconductor layer 220, which can avoid any deposition or etching process through openings extending through memory stack 114, thereby reducing the fabrication complexity and cost and increasing the yield and vertical scalability.

In some embodiments, conductive layer 222 includes multiple layers in the vertical direction, including a metal silicide layer 219 and a metal layer 223 above metal silicide layer 219. Each of metal silicide layer 219 and metal layer 223 can be a continuous film. Metal silicide layer 219 can be disposed above and in contact with P-type doped semiconductor layer 220 (in the first portion of conductive layer 222) and the upper ends of channel structures 224 (in the second portion of conductive layer 222). In some embodiments, part of metal silicide layer 219 surrounds and contacts top portions 229 of semiconductor channels 228 extending into P-type doped semiconductor layer 220 to make electrical connections with multiple channel structures 224. Metal silicide layer 219 can include a metal silicide, such as copper silicide, cobalt silicide, nickel silicide, titanium silicide, tungsten silicide, silver silicide, aluminum silicide, gold silicide, platinum silicide, any other suitable metal silicide, or any combinations thereof. Metal layer 223 is above and in contact with metal silicide layer 219, according to some embodiments. Metal layer 223 can include a metal, such as W, Co, Cu, Al, Ni, Ti, any other suitable metal, or any combinations thereof. It is understood that the metal in metal layer 223 may broadly include any suitable conductive metal compounds and metal alloys as well, such as titanium nitride and tantalum nitride. Metal silicide layer 219 can reduce the contact resistance between conductive layer 222 and top portions 229 of semiconductor channels 228 as well as serve as the barrier layer of metal layer 223 in conductive layer 222.

By combining conductive layer 222 and P-type doped semiconductor layer 220, the conductance between channel structures 224 (i.e., at the ACS of NAND memory strings in the same block) can be increased compared with P-type doped semiconductor layer 220 alone, thereby improving the electrical performance of 3D memory device 200. By introducing conductive layer 222, to maintain the same conductance/resistance between channel structures 224, the thickness of P-type doped semiconductor layer 220 can be reduced, for example, to be less than about 50 nm, such as less than 50 nm. In some embodiments, the thickness of P-type doped semiconductor layer 220 is between about 10 nm and about 30 nm, such as between 10 nm and 30 nm (e.g., 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, any range bounded by the lower end by any of these values, or in any range defined by any two of these values). N-type doped semiconductor layer 220 in combination with conductive layer 222, which surround top portion 229 of semiconductor channels 228 of channel structures 224, can enable P-well bulk erase operations for 3D memory device 200. The design of the 3D memory device 200 disclosed herein can achieve the separation of the hole current path and the electron current path for forming erase operations and read operations, respectively. In some embodiments, 3D memory device 200 is configured to form an electron current path between the electron source (e.g., N-well 221) and semiconductor channel 228 of channel structure 224 to provide electrons to the NAND memory string when performing a read operation, according to some embodiments. Conversely, 3D memory device 200 is configured to form a hole current path between the hole source (e.g., P-type doped semiconductor layer 220) and semiconductor channel 228 of channel structure 224 to provide holes to the NAND memory string when performing a P-well bulk erase operation, according to some embodiments.

As shown in FIG. 2A, second semiconductor structure 204 of 3D memory device 200 can further include insulating structures 230 each extending vertically through interleaved conductive layers 216 and dielectric layers 218 of memory stack 214. Different from channel structure 224 that extends further into P-type doped semiconductor layer 220, insulating structures 230 stops at the bottom surface of P-type doped semiconductor layer 220, i.e., does not extend vertically into P-type doped semiconductor layer 220, according to some embodiments. That is, the top surface of insulating structure 230 can be flush with the bottom surface of P-type doped semiconductor layer 220. Each insulating structure 230 can also extend laterally to separate channel structures 224 into a plurality of blocks. That is, memory stack 214 can be divided into a plurality of memory blocks by insulating structures 230, such that the array of channel structures 224 can be separated into each memory block. Different from the slit structures in existing 3D NAND memory devices described above, which include front side ACS contacts, insulating structure 230 does not include any contact therein (i.e., not functioning as the source contact) and thus, does not introduce parasitic capacitance and leakage current with conductive layers 216 (including word lines), according to some embodiments. In some embodiments, each insulating structure 230 includes an opening (e.g., a slit) filled with one or more dielectric materials, including, but not limited to, silicon oxide, silicon nitride, silicon oxynitride, or any combination thereof. In one example, each insulating structure 230 may be filled with silicon oxide.

Moreover, as described below in detail, because the opening for forming insulating structure 230 is not used for forming P-type doped semiconductor layer 220, the increased aspect ratio of the opening (e.g., greater than 50) as the number of interleaved conductive layers 216 and dielectric layers 218 increases would not affect the formation of P-type doped semiconductor layer 220 and conductive layer 222.

Instead of the front side source contacts, 3D memory device 200 can include backside source contacts 231 and 232 above memory stack 214 and in contact with N-well 221 and P-type doped semiconductor layer 220, respectively, as shown in FIG. 2A. Source contacts 231 and 232 and memory stack 214 (and insulating structure 230 therethrough) can be disposed at opposites sides of P-type doped semiconductor layer 220 and thus, viewed as "backside" source contacts. In some embodiments, source contact 232 in contact with P-type doped semiconductor layer 220 is electrically connected to semiconductor channel 228 of channel structure 224 through P-type doped semiconductor layer 220. In some embodiments, source contact 231 in contact with N-well 221 is electrically connected to semiconductor channel 228 of channel structure 224 through P-type doped semiconductor layer 220. In some embodiments, source contact 232 is not laterally aligned with insulating structure 230 and is approximate to channel structure 224 to reduce the resistance of the electrical connection therebetween. It is understood that although source contact 231 is laterally aligned with insulating structure 230 as shown in FIG. 2A, in some examples, source contact 231 may not be laterally aligned with insulating structure 230, but approximate to channel structure 224 (e.g., laterally between insulating structure 230 and channel structure 224) to reduce the resistance of the electrical connection therebetween as well. As described above, source contacts 231 and 232 can be used to separately control the electron current and hole current during the read operations and erase operations, respectively. Source contacts 231 and 232 can include any suitable types of contacts.

In some embodiments, source contacts 231 and 232 include a VIA contact. In some embodiments, source contacts 231 and 232 include a wall-shaped contact extending laterally. Source contacts 231 and 232 can include one or more conductive layers, such as a metal layer (e.g., W, Co, Cu, or Al) or a silicide layer surrounded by an adhesive layer (e.g., TiN).

As shown in FIG. 2, 3D memory device 100 can further include a BEOL interconnect layer 233 above and electrically connected to source contacts 231 and 232 for pad-out, e.g., transferring electrical signals between 3D memory device 200 and external circuits. In some embodiments, interconnect layer 233 includes one or more ILD layers 234 on P-type doped semiconductor layer 220 and a redistribution layer 236 on ILD layers 234. The upper end of source contact 231 or 232 is flush with the top surface of ILD layers 234 and the bottom surface of redistribution layer 236. Source contacts 231 and 232 can be electrically separated by on ILD layers 234. In some embodiments, source contact 232 extends vertically through ILD layers 234 and conductive layer 222 into P-type doped semiconductor layer 220 to make an electrical connection with P-type doped semiconductor layer 220. In some embodiments, source contact 231 extends vertically through ILD layers 234, conductive layer 222, and P-type doped semiconductor layer 220 into N-well 221 to make an electrical connection with N-well 221. Source contact 231 can include a spacer (e.g., a dielectric layer) surrounding its sidewall to be electrically separated from P-type doped semiconductor layer 220. Redistribution layer 236 can include two electrically separated interconnects: a first interconnect 236-1 in contact with source contact 232 and a second interconnect 236-2 in contact with source contact 231.

ILD layers 234 in interconnect layer 233 can include dielectric materials including, but not limited to, silicon oxide, silicon nitride, silicon oxynitride, low-k dielectrics, or any combination thereof. Redistribution layer 236 in interconnect layer 233 can include conductive materials including, but not limited to W, Co, Cu, Al, silicides, or any combination thereof. In one example, redistribution layer 236 includes Al. In some embodiments, interconnect layer 233 further includes a passivation layer 238 as the outmost layer for passivation and protection of 3D memory device 200. Part of redistribution layer 236 can be exposed from passivation layer 238 as contact pads 240. That is, interconnect layer 233 of 3D memory device 200 can also include contact pads 240 for wire bonding and/or bonding with an interposer.

In some embodiments, second semiconductor structure 204 of 3D memory device 200 further includes contacts 242, 243, and 244 through P-type doped semiconductor layer 220. As P-type doped semiconductor layer 220 can include polysilicon, contacts 242, 243, and 244 are TSCs, according to some embodiments. In some embodiments, contact 242 extends through P-type doped semiconductor layer 220 and ILD layers 234 to be in contact with first interconnect 236-1 of redistribution layer 236, such that P-type doped semiconductor layer 220 is electrically connected to contact 242 through source contact 232 and first interconnect 236-1 of interconnect layer 233. In some embodiments, contact 243 extends through P-type doped semiconductor layer 220 and ILD layers 234 to be in contact with second interconnect 236-2 of redistribution layer 236, such that N-well 221 is electrically connected to contact 243 through source contact 231 and second interconnect 236-2 of interconnect layer 233. In some embodiments, contact 244 extends through P-type doped semiconductor layer 220 and ILD layers 234 to be in contact with contact pad 240. Contacts 242, 243, and 244 each can include one or more conductive layers, such as a metal layer (e.g., W, Co, Cu, or Al) or a silicide layer surrounded by an adhesive layer (e.g., TiN). In some embodiments, at least contacts 243 and 244 each further include a spacer (e.g., a dielectric layer) to electrically separate contacts 243 and 244 from P-type doped semiconductor layer 220.

In some embodiments, 3D memory device 200 further includes peripheral contacts 246, 247, and 248 each extending vertically outside of memory stack 214. Each peripheral contact 246, 247, or 248 can have a depth greater than the depth of memory stack 214 to extend vertically from bonding layer 212 to P-type doped semiconductor layer 220 in a peripheral region that is outside of memory stack 214. In some embodiments, peripheral contact 246 is below and in contact with contact 242, such that P-type doped semiconductor layer 220 is electrically connected to peripheral circuit 208 in first semiconductor structure 202 through at least source contact 232, first interconnect 236-1 of interconnect layer 233, contact 242, and peripheral contact 246. In some embodiments, peripheral contact 247 is below and in contact with contact 243, such that N-well 221 is electrically connected to peripheral circuit 208 in first semiconductor structure 202 through at least source contact 231, second interconnect 236-2 of interconnect layer 233, contact 243, and peripheral contact 247. That is, the electron current and hole current for read operations and erase operations can be separately controlled by peripheral circuits 208 through different electrical connections. In some embodiments, peripheral contact 248 is below and in contact with contact 244, such that peripheral circuit 208 in first semiconductor structure 202 is electrically connected to contact pad 240 for pad-out through at least contact 244 and peripheral contact 248. Peripheral contacts 246, 247, and 248 each can include one or more conductive layers, such as a metal layer (e.g., W, Co, Cu, or Al) or a silicide layer surrounded by an adhesive layer (e.g., TiN). In some embodiments, conductive layer 222 is within the region of memory stack 214, i.e., does not extend laterally into the peripheral region, such that contacts 242, 244, and 243 do not extend vertically through conductive layer 222 in order to be in contact with peripheral contacts 246, 248, and 247, respectively.

As shown in FIG. 2A, 3D memory device 200 also includes a variety of local contacts (also known as "Cl") as part of the interconnect structure, which are in contact with a structure in memory stack 214 directly. In some embodiments, the local contacts include channel local contacts 250 each below and in contact with the lower end of respective channel structure 224. Each channel local contact 250 can be electrically connected to a bit line contact (not shown) for bit line fan-out. In some embodiments, the local contacts further include word line local contacts 252 each below and in contact with respective conductive layer 216 (including a word line) at the staircase structure of memory stack 214 for word line fan-out. Local contacts, such as channel local contacts 250 and word line local contacts 252, can be electrically connected to peripheral circuits 208 of first semiconductor structure 202 through at least bonding layers 212 and 210. Local contacts, such as channel local contacts 250 and word line local contacts 252, each can include one or more conductive layers, such as a metal layer (e.g., W, Co, Cu, or Al) or a silicide layer surrounded by an adhesive layer (e.g., TiN).

Figure 2B:
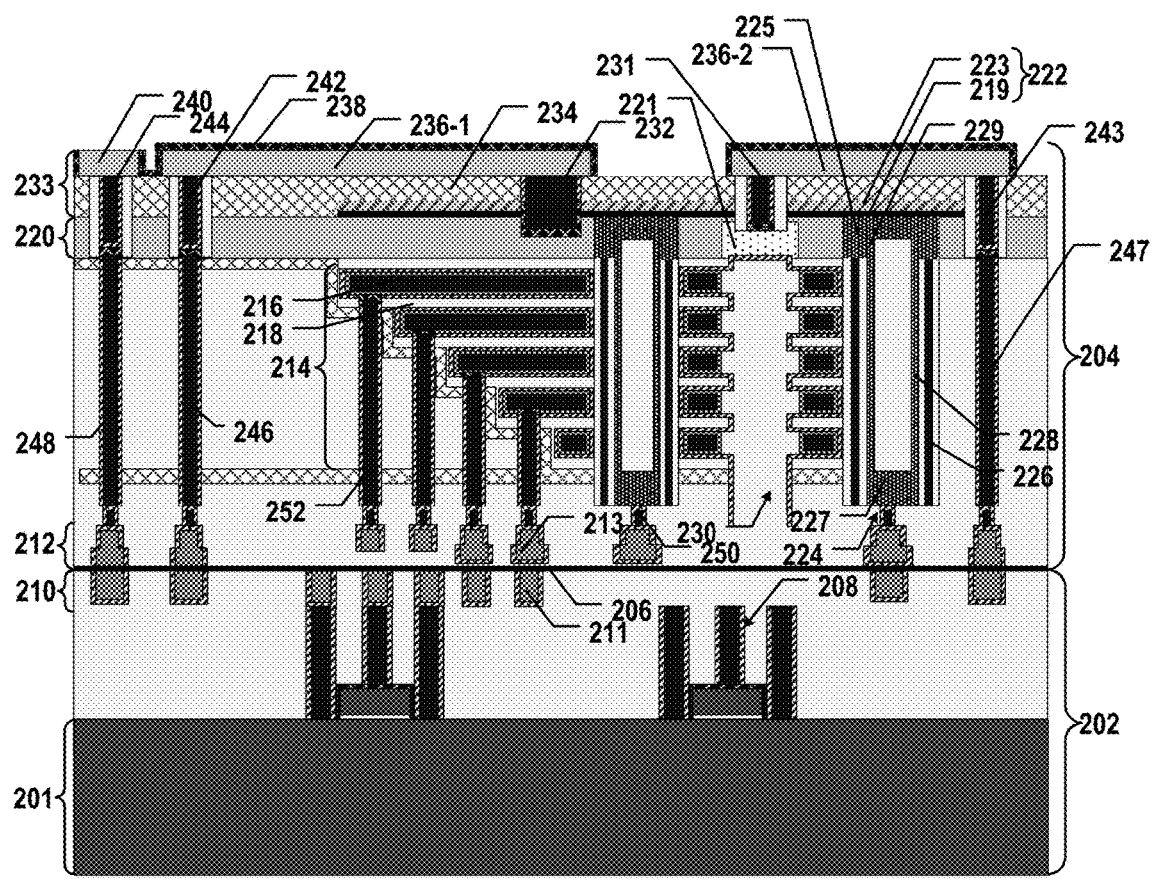
FIG. 2B illustrates a side view of a cross-section of yet another exemplary 3D memory device, according to some embodiments of the present disclosure.

FIG. 2B illustrates a side view of a cross-section of yet another exemplary 3D memory device 250, according to some embodiments of the present disclosure. 3D memory device 250 is similar to 3D memory device 200 except for the different structures of conductive layer 222 and the upper ends of channel structures 224. It is understood that the details of other same structures in both 3D memory devices 250 and 200 are not repeated for ease of description.

As shown in FIG. 2B, each channel structure 224 further includes a channel plug 225 abutting P-type doped semiconductor layer 220, according to some embodiments. In some embodiments, each channel plug 225 surrounds and contacts respective top portion 229 of semiconductor channel 228. The top surface of channel plug 225 can be flush with the top surface of P-type doped semiconductor layer 220. Channel plug 225 can have the same material as top portion 229 of semiconductor channel 228, for example, doped polysilicon, and thus, can be viewed as part of semiconductor channel 228 of channel structure 224. That is, the entire doped polysilicon structure surrounded by P-type doped semiconductor layer 220 may be viewed as the upper end of channel structure 224 in the present disclosure. Thus, conductive layer 222 (and metal silicide layer 219 therein) in both 3D memory devices 200 and 250 is in contact with the upper ends of channel structures 224, according to some embodiments.

Different from conductive layer 222 in 3D memory devices 200 in which the second portion of conductive layer 222 is below the top surface of P-type doped semiconductor layer 220 and surrounds the upper end of channel structure 224, as shown in FIG. 2A, since the upper end of channel structure 224 also includes channel plug 225 in FIG. 2B, the entire conductive layer 222 is above the top surface of P-type doped semiconductor layer 220. As shown in FIG. 2B, the top surface of the upper end of channel structure 224 is flush with the top surface of P-type doped semiconductor layer 220, and conductive layer 222 is disposed on P-type doped semiconductor layer 220 and the upper ends of channel structures 224. In other words, part of conductive layer 222 in 3D memory devices 200 that fills up the recess between P-type doped semiconductor layer 220 and top portion 229 of semiconductor channel 228 can be replaced by channel plug 225 in 3D memory devices 250, such that conductive layer 222 can be formed in the same plane on the top surface of P-type doped semiconductor layer 220 and channel structures 224.

Figure 2C:
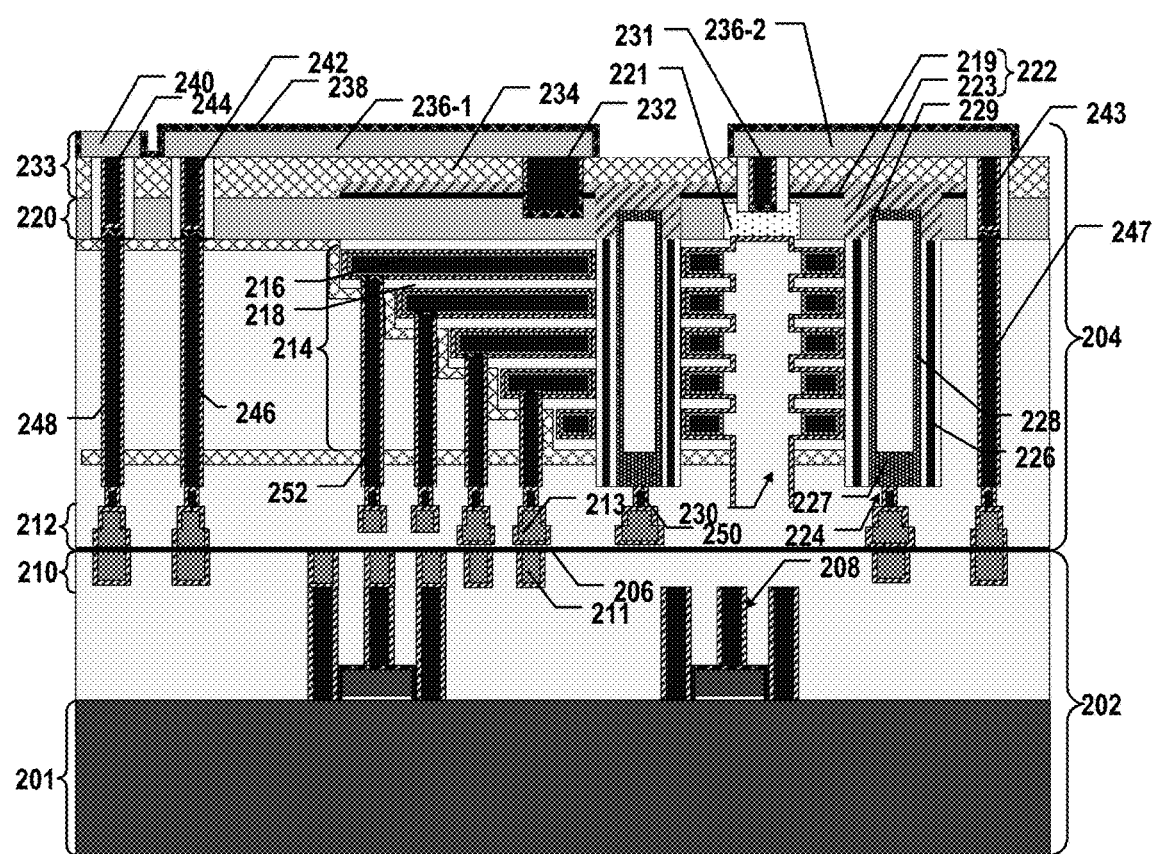
FIG. 2C illustrates a side view of a cross-section of yet another exemplary 3D memory device, according to some embodiments of the present disclosure.

FIG. 2C illustrates a side view of a cross-section of yet another exemplary 3D memory device 260, according to some embodiments of the present disclosure. 3D memory device 260 is similar to 3D memory device 100 except for the different structures of conductive layer 222. It is understood that the details of other same structures in both 3D memory devices 260 and 200 are not repeated for ease of description.

As shown in FIG. 2C, metal layer 223 of conductive layer 222 is in contact with semiconductor channels 228, and part of metal layer 223 is above and in contact with metal silicide layer 219, according to some embodiments. Different from conductive layer 222 in 3D memory devices 200 in which part of metal silicide layer 219 is below the top surface of P-type doped semiconductor layer 220 and surrounds top portions 229 of semiconductor channels 228, in 3D memory device 260, only metal layer 223 is below the top surface of P-type doped semiconductor layer 220 and surrounds top portions 229 of semiconductor channels 228. Nevertheless, the first portion of conductive layer 222 has the same structure in 3D memory devices 200, 250, and 260, i.e., having metal silicide layer 219 on P-type doped semiconductor layer 220 and metal layer 223 above and in contact with metal silicide layer 219. As to the second portion of conductive layer 222 (within the regions of channel structures 224), the various structures in 3D memory devices 200, 250, and 260 may be caused by the different examples for forming conductive layers 222 described below in detail with respect to the fabrication processes, for example, the ways how the recess between P-type doped semiconductor layer 220 and top portion 229 of semiconductor channel 228 is filled up.

For example, as described below in detail, metal silicide layer 219 of 3D memory device 260 in FIG. 2C may be part of a stop layer for automatically stopping the etching of the channel holes of channel structures 224. The stop layer may be patterned to expose the upper ends of channel structures 224 from the backside of P-type doped semiconductor layer 220, and the remainder of the stop layer may remain in 3D memory device 260 as metal silicide layer 219. Metal layer 223 then can be formed to fill up the recess between P-type doped semiconductor layer 220 and top portion 229 of semiconductor channel 228 as well as on metal silicide layer 219. In contrast, the same stop layer in 3D memory devices 200 and 250 may be removed prior to the formation of conductive layer 222. Thus, metal silicide layer 219 in 3D memory devices 200 and 250 may be formed after the removal of the stop layer from the backside of P-type doped semiconductor layer 220 to be in contact with the upper ends of channel structures 224, either without channel plug 225 in 3D memory device 200 or with channel plug 225 in 3D memory device 250, which can lower the contact resistance with channel structure 224, but increase the number of processes, compared with conductive layer 222 in 3D memory device 260.

Figure 3E:
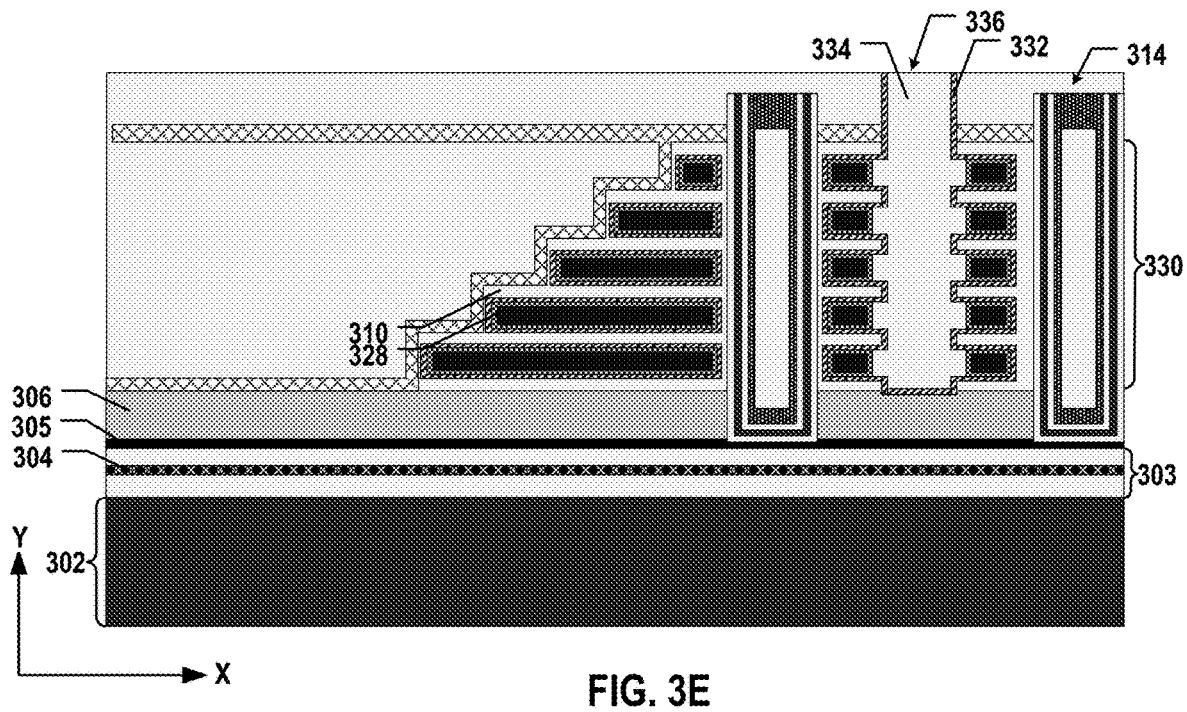
Figure 3F:
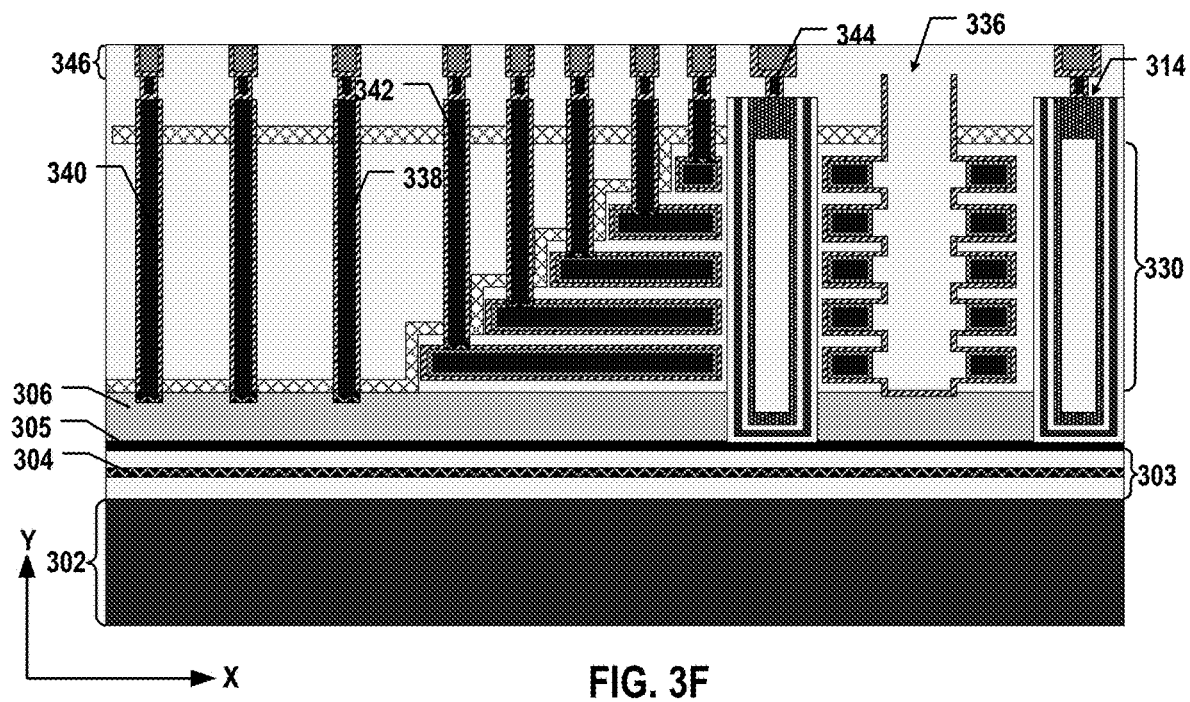
Figure 3G:
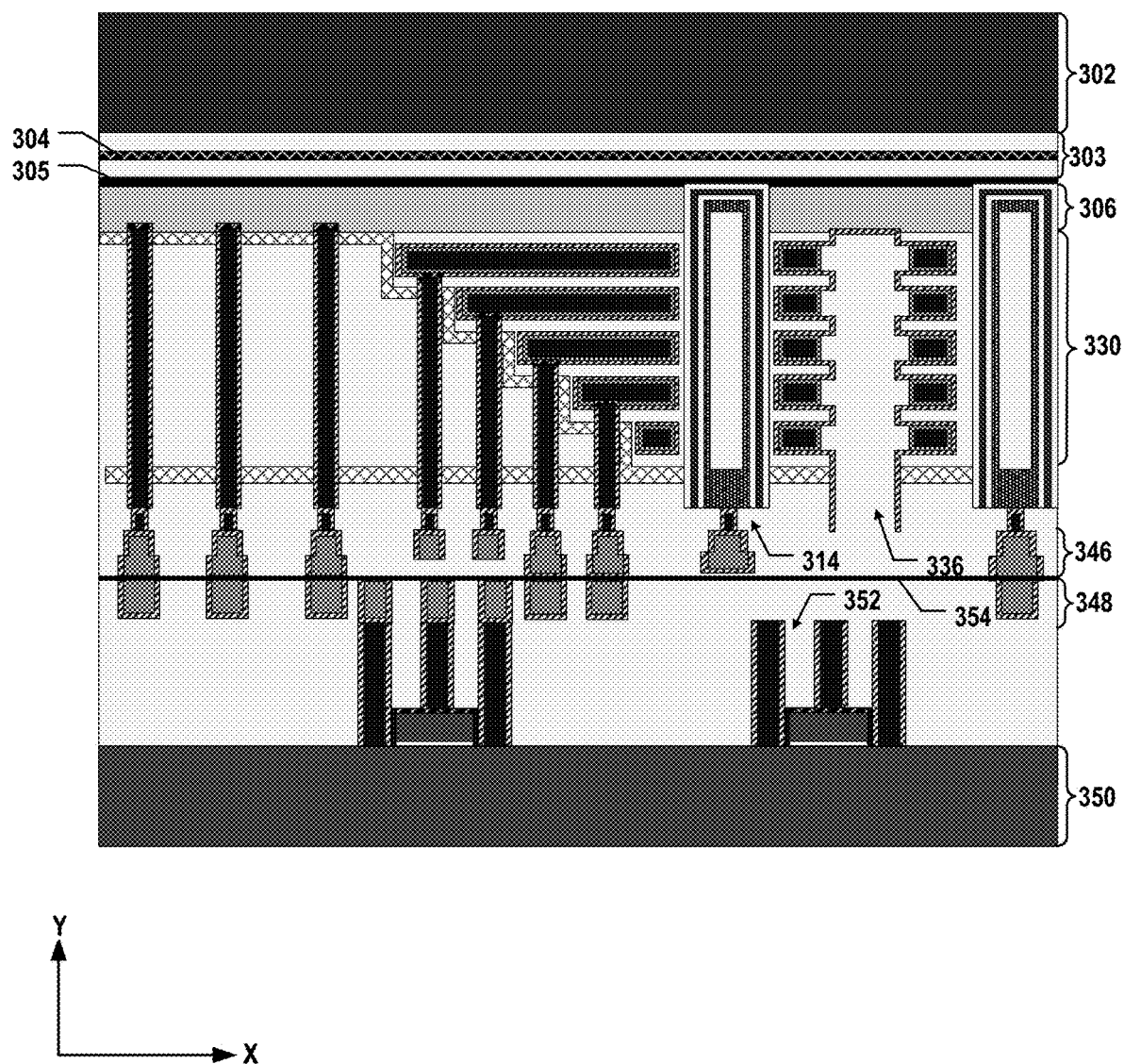
Figure 3H:
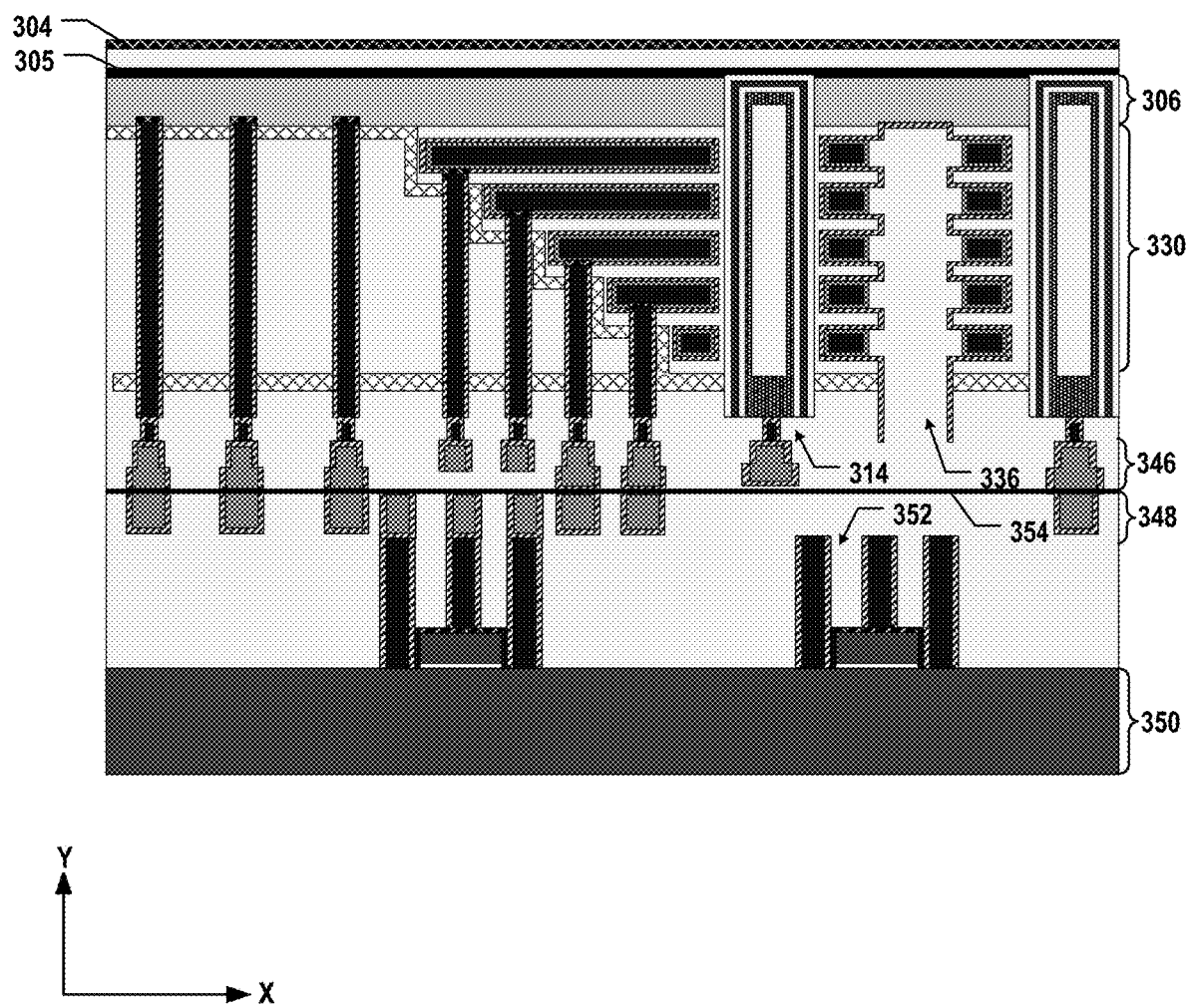
Figure 3I:
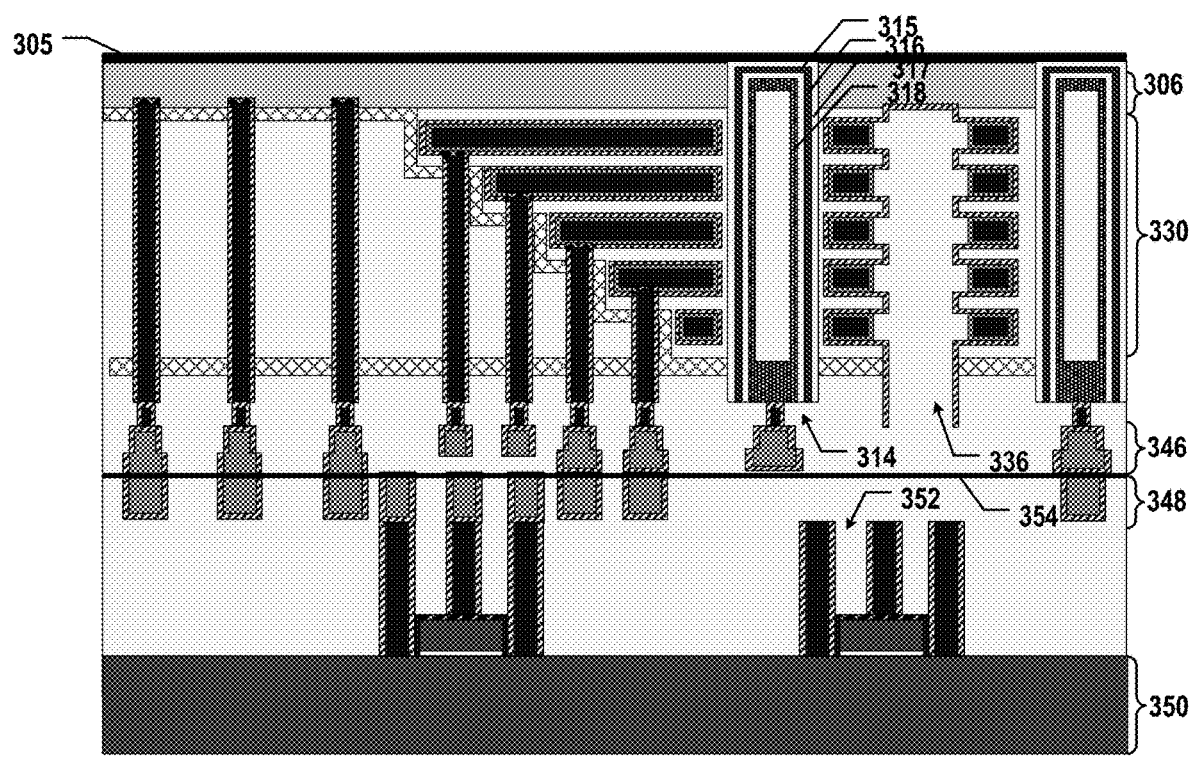
Figure 3J:
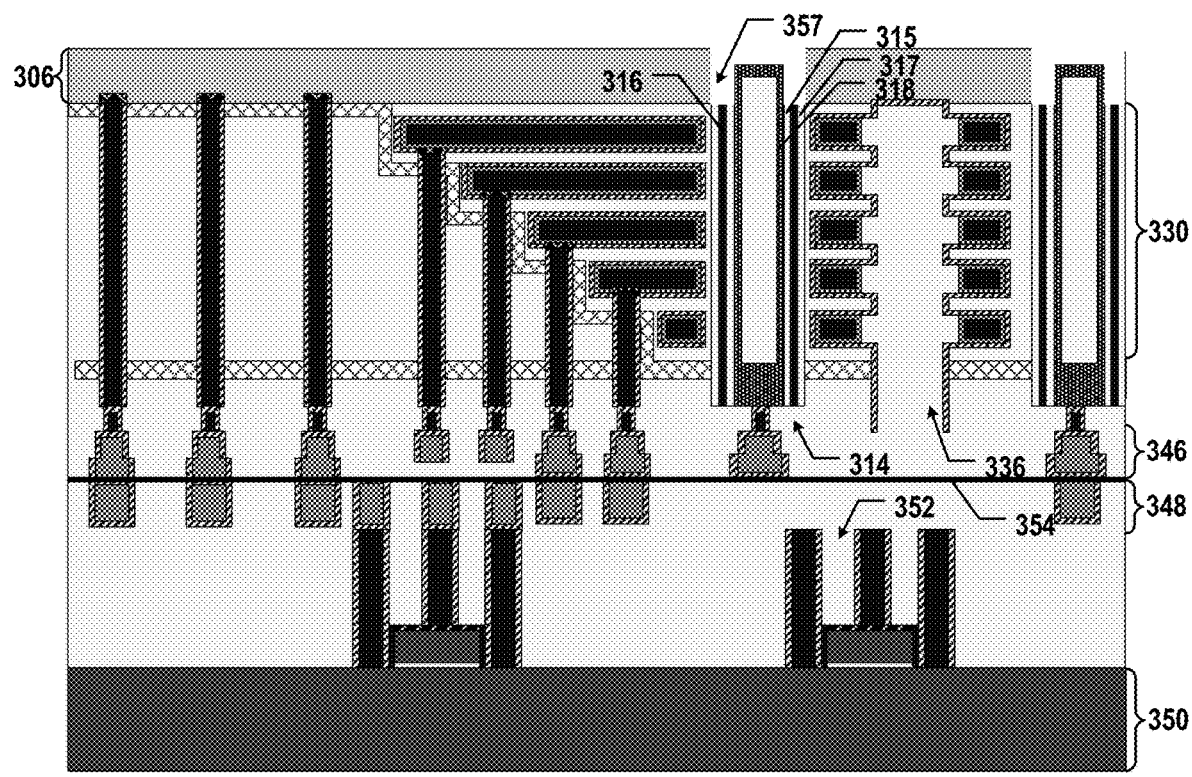
Figure 3K:
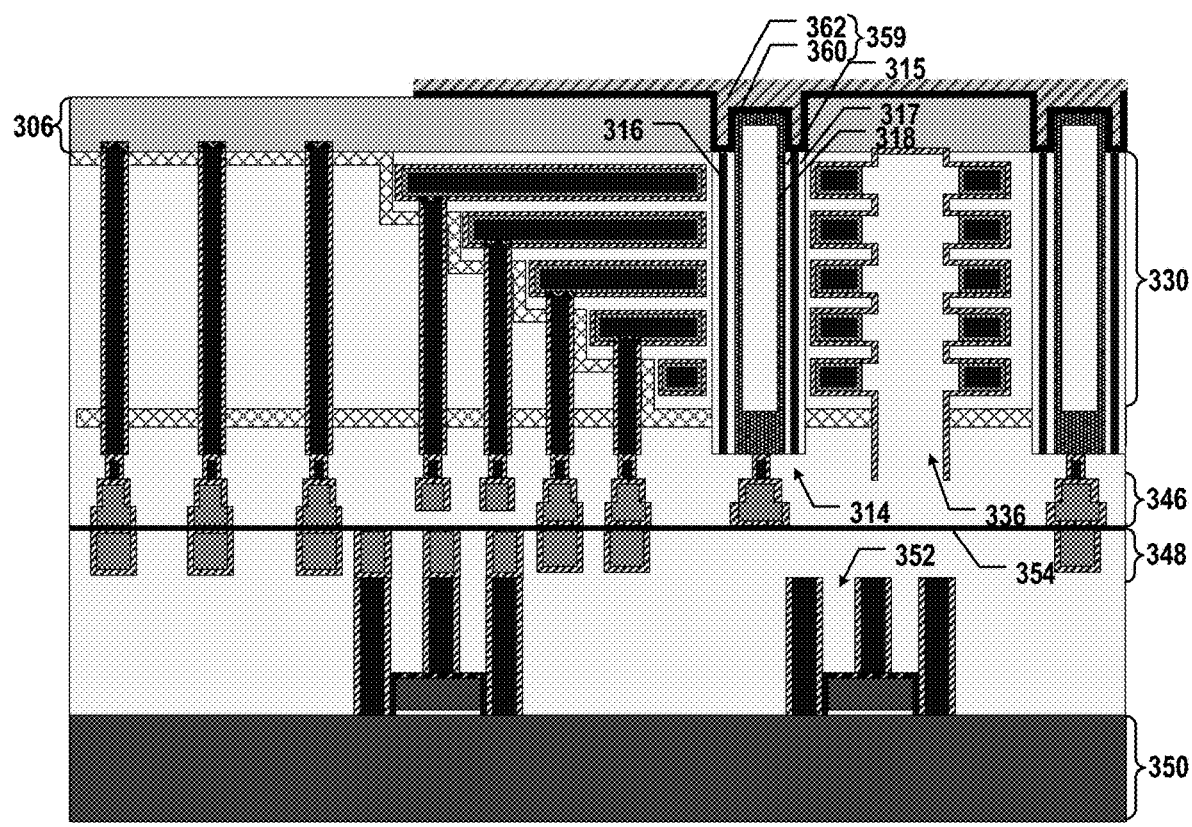
Figure 3L:
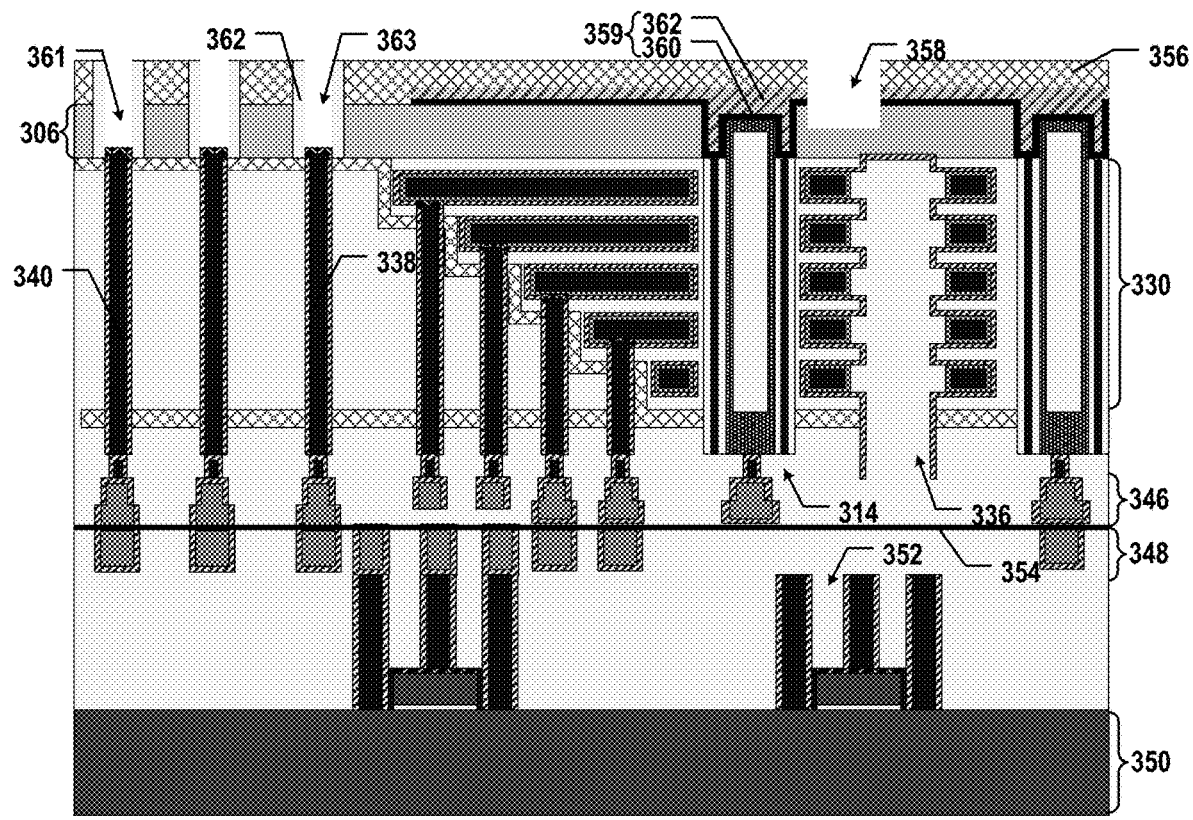
Figure 3M:
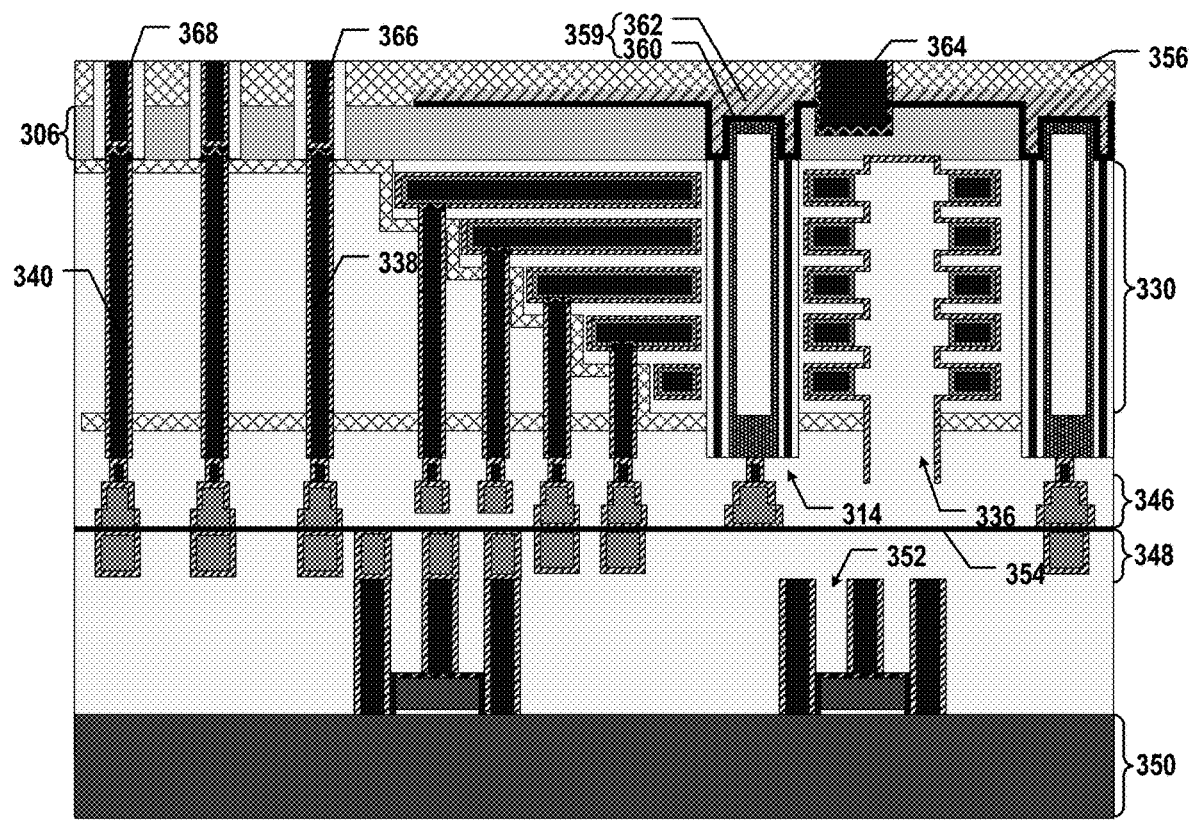
Figure 3N:
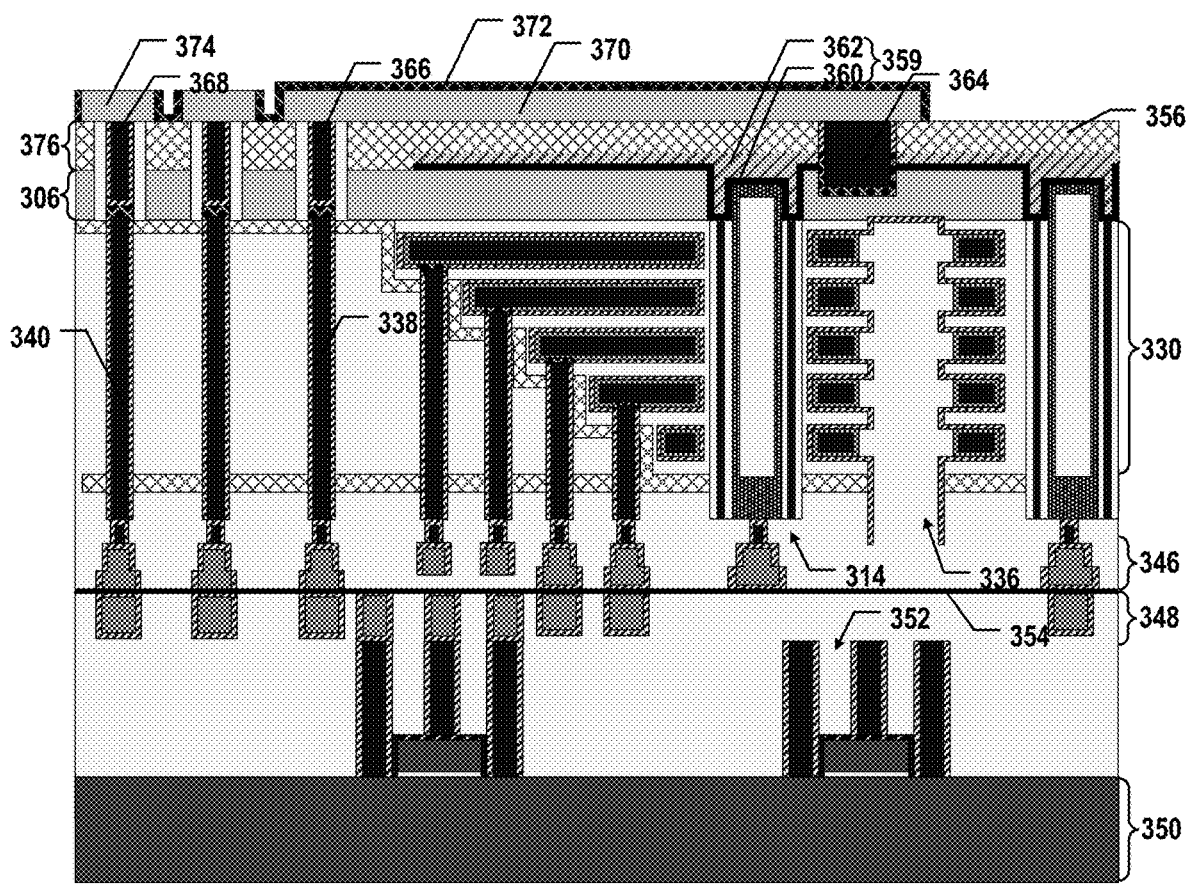
Figure 3O:
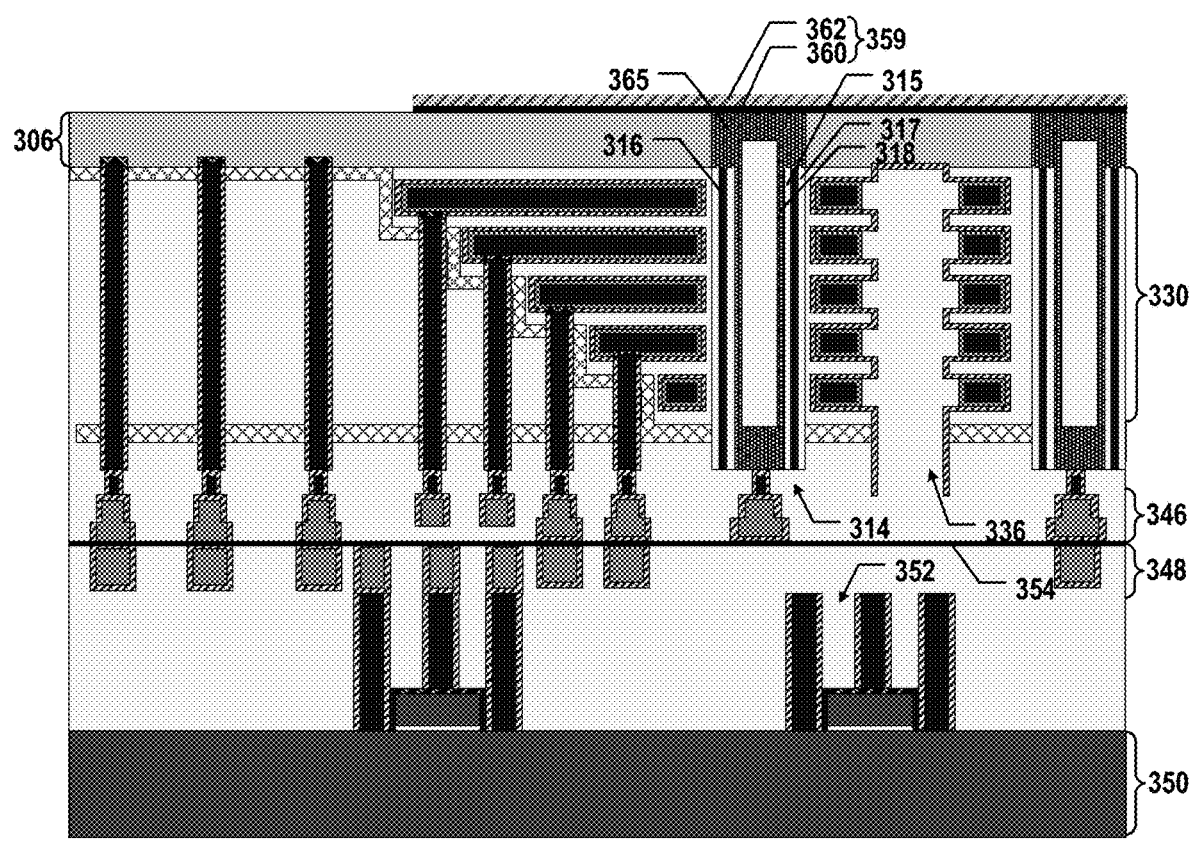
Figure 3P:
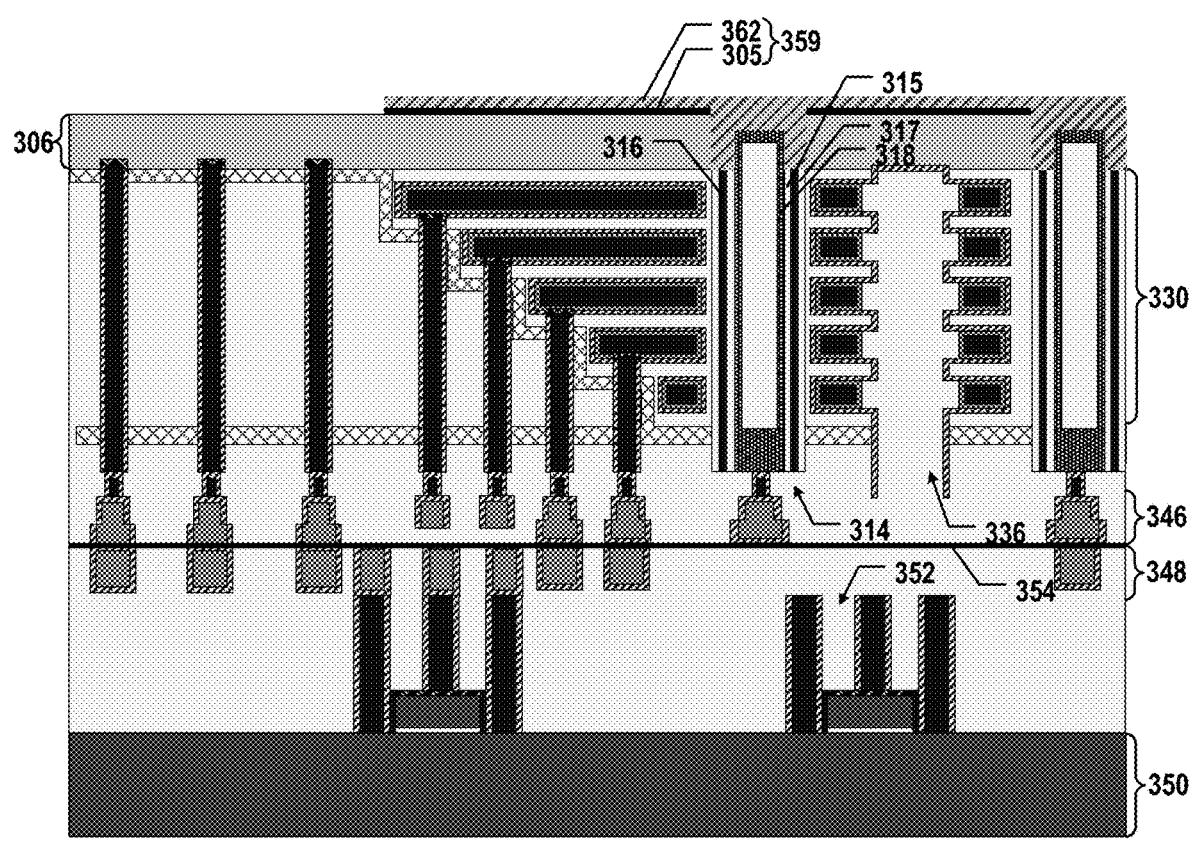
Figure 5A:
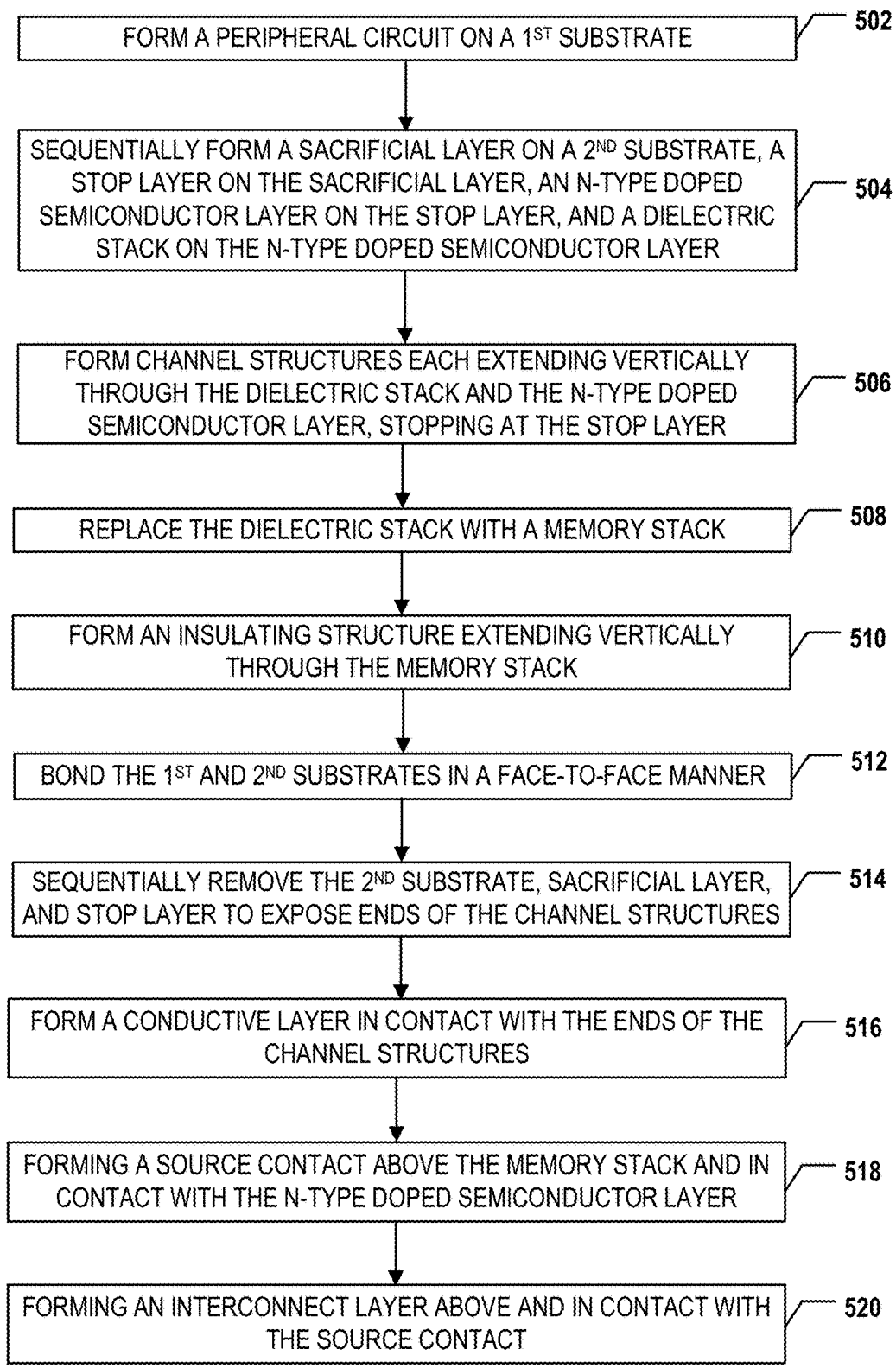
FIG. 5A illustrates a flowchart of a method for forming an exemplary 3D memory device, according to some embodiments of the present disclosure.
Figure 5B:
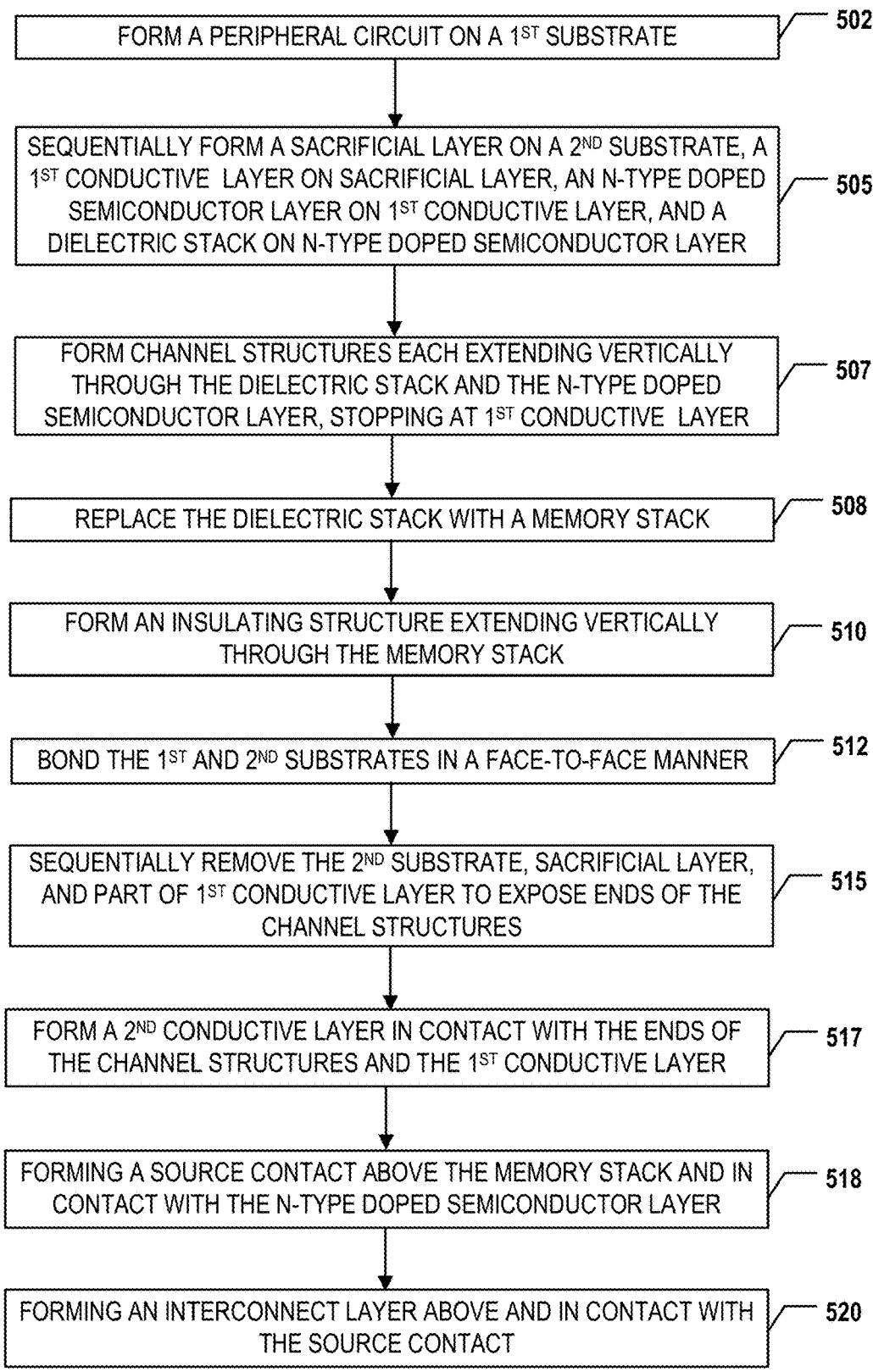
FIG. 5B illustrates a flowchart of another method for forming an exemplary 3D memory device, according to some embodiments of the present disclosure.

FIGS. 3A-3P illustrate a fabrication process for forming an exemplary 3D memory device, according to some embodiments of the present disclosure. FIG. 5A illustrates a flowchart of a method 500 for forming an exemplary 3D memory device, according to some embodiments of the present disclosure. FIG. 5B illustrates a flowchart of another method 501 for forming an exemplary 3D memory device, according to some embodiments of the present disclosure. Examples of the 3D memory device depicted in FIGS. 3A-3P, 5A, and 5B include 3D memory devices 100, 150, and 160 depicted in FIGS. 1A-1C. FIGS. 3A-3P, 5A, and 5B will be described together. It is understood that the operations shown in methods 500 and 501 are not exhaustive and that other operations can be performed as well before, after, or between any of the illustrated operations. Further, some of the operations may be performed simultaneously, or in a different order than shown in FIGS. 5A and 5B.

Referring to FIG. 5A, method 500 starts at operation 502, in which a peripheral circuit is formed on a first substrate. The first substrate can be a silicon substrate. As illustrated in FIG. 3G, a plurality of transistors are formed on a silicon substrate 350 using a plurality of processes including, but not limited to, photolithography, etching, thin film deposition, thermal growth, implantation, chemical mechanical polishing (CMP), and any other suitable processes. In some embodiments, doped regions (not shown) are formed in silicon substrate 350 by ion implantation and/or thermal diffusion, which function, for example, as source regions and/or drain regions of the transistors. In some embodiments, isolation regions (e.g., STIs) are also formed in silicon substrate 350 by wet etching and/or dry etching and thin film deposition. The transistors can form peripheral circuits 352 on silicon substrate 350.

As illustrated in FIG. 3G, a bonding layer 348 is formed above peripheral circuits 352. Bonding layer 348 includes bonding contacts electrically connected to peripheral circuits 352. To form bonding layer 348, an ILD layer is deposited using one or more thin film deposition processes, such as chemical vapor deposition (CVD), physical vapor deposition (PVD), atomic layer deposition (ALD), or any combination thereof; the bonding contacts through the ILD layer are formed using wet etching and/or dry etching, e.g., reactive ion etching (ME), followed by one or more thin film deposition processes, such as ALD, CVD, PVD, any other suitable processes, or any combination thereof.

Channel structures each extending vertically through a memory stack and an N-type doped semiconductor layer can be formed above a second substrate. Method 500 proceeds to operation 504, as illustrated in FIG. 5A, in which a sacrificial layer on the second substrate, a first stop layer on the sacrificial layer, an N-type doped semiconductor layer on the first stop layer, and a dielectric stack on the N-type doped semiconductor layer are sequentially formed. The sacrificial layer can be formed on the front side of the second substrate on which semiconductor devices can be formed. The second substrate can be a silicon substrate. It is understood that as the second substrate will be removed from the final product, the second substrate may be part of a dummy wafer, for example, a carrier substrate, made of any suitable materials, such as glass, sapphire, plastic, silicon, to name a few, to reduce the cost of the second substrate. In some embodiments, the substrate is a carrier substrate, the N-type doped semiconductor layer includes polysilicon, and the dielectric stack includes interleaved stack dielectric layers and stack sacrificial layers. In some embodiments, the stack dielectric layers and stack sacrificial layers are alternatingly deposited on the N-type doped semiconductor layer to form the dielectric stack. In some embodiments, the sacrificial layer includes two pad oxide layers (also known as buffer layers) and a second stop layer sandwiched between the two pad oxide layers. In some embodiments, the first stop layer includes a high-k dielectric, the second stop layer includes silicon nitride, and each of the two pad oxide layers includes silicon oxide.

As illustrated in FIG. 3A, a sacrificial layer 303 is formed on a carrier substrate 302, a stop layer 305 is formed on sacrificial layer 303, and an N-type doped semiconductor layer 306 is formed on stop layer 305. N-type doped semiconductor layer 306 can include polysilicon doped with N-type dopant(s), such as P, As, or Sb. Sacrificial layer 303 can include any suitable sacrificial materials that can be later selectively removed and are different from the material of N-type doped semiconductor layer 306. In some embodiments, sacrificial layer 303 is a composite dielectric layer having a stop layer 304 sandwiched between two pad oxide layers. As described below in detail, stop layer 304 can act as a CMP/etch stop layer when removing carrier substrate 302 from the backside and thus, may include any suitable materials other than the material of carrier substrate 302, such as silicon nitride. Similarly, stop layer 305 can act as an etch stop layer when etching the channel holes from the front side and thus, may include any suitable materials that have a high etching selectivity (e.g., greater than about 5) with respect to polysilicon (the material of N-type doped semiconductor layer 306 on stop layer 305). In one example, stop layer 305 may be removed in the later process from the final product and may include a high-k dielectric, e.g., aluminum oxide, hafnium oxide, zirconium oxide, or titanium oxide, to name a few. In another example, at least part of stop layer 305 may remain in the final product and may include a metal silicide, e.g., copper silicide, cobalt silicide, nickel silicide, titanium silicide, tungsten silicide, silver silicide, aluminum silicide, gold silicide, platinum silicide, to name a few. It is understood that in some examples, pad oxide layers (e.g., silicon oxide layers) may be formed between carrier substrate 302 and stop layer 304 and between stop layer 304 and stop layer 305 to relax the stress between different layers and avoid peeling.

To form sacrificial layer 303, silicon oxide, silicon nitride, and silicon oxide are sequentially deposited on carrier substrate 302 using one or more thin film deposition processes including, but not limited to, CVD, PVD, ALD, or any combination thereof, according to some embodiments. To form stop layer 305, a high-k dielectric is deposited on sacrificial layer 303 using one or more thin film deposition processes including, but not limited to, CVD, PVD, ALD, or any combination thereof, according to some embodiments. In some embodiments, to form N-type doped semiconductor layer 306, polysilicon is deposited on stop layer 305 using one or more thin film deposition processes including, but not limited to, CVD, PVD, ALD, or any combination thereof, followed by doping the deposited polysilicon with N-type dopant(s), such as P, As or Sb, using ion implantation and/or thermal diffusion. In some embodiments, to form N-type doped semiconductor layer 306, in-situ doping of N-type dopants, such as P, As, or Sb, is performed when depositing polysilicon on stop layer 305. In some embodiments in which stop layer 305 includes a metal silicide, a metal layer is deposited on sacrificial layer 303, followed by depositing polysilicon to form N-type doped semiconductor layer 306 on the metal layer. A silicidation process can then be performed on the polysilicon and metal layers by a thermal treatment (e.g., annealing, sintering, or any other suitable process) to transform the metal layer to a metal silicide layer, as stop layer 305.

As illustrated in FIG. 3B, a dielectric stack 308 including a plurality pairs of a first dielectric layer (referred to herein as "stack sacrificial layer" 312) and a second dielectric layer (referred to herein as "stack dielectric layers" 310, together referred to herein as "dielectric layer pairs") is formed on N-type doped semiconductor layer 306. Dielectric stack 308 includes interleaved stack sacrificial layers 312 and stack dielectric layers 310, according to some embodiments. Stack dielectric layers 310 and stack sacrificial layers 312 can be alternatingly deposited on N-type doped semiconductor layer 306 above carrier substrate 302 to form dielectric stack 308. In some embodiments, each stack dielectric layer 310 includes a layer of silicon oxide, and each stack sacrificial layer 312 includes a layer of silicon nitride. Dielectric stack 308 can be formed by one or more thin film deposition processes including, but not limited to, CVD, PVD, ALD, or any combination thereof. As illustrated in FIG. 3B, a staircase structure can be formed on the edge of dielectric stack 308. The staircase structure can be formed by performing a plurality of so-called "trim-etch" cycles to the dielectric layer pairs of dielectric stack 308 toward carrier substrate 302. Due to the repeated trim-etch cycles applied to the dielectric layer pairs of dielectric stack 308, dielectric stack 308 can have one or more tilted edges and a top dielectric layer pair shorter than the bottom one, as shown in FIG. 3B.

Method 500 proceeds to operation 506, as illustrated in FIG. 5A, in which a plurality of channel structures each extending vertically through the dielectric stack and the N-type doped semiconductor layer are formed, stopping at the first stop layer. In some embodiments, to form the channel structures, channel holes each extending vertically through the dielectric stack and the N-type doped semiconductor layer, stopping at the first stop layer, are etched, and a memory film and a semiconductor channel are sequentially deposited along a sidewall of each channel hole.

As illustrated in FIG. 3B, each channel hole is an opening extending vertically through dielectric stack 308 and N-type doped semiconductor layer 306, stopping at stop layer 305. In some embodiments, a plurality of openings are formed, such that each opening becomes the location for growing an individual channel structure 314 in the later process. In some embodiments, fabrication processes for forming the channel holes of channel structures 314 include wet etching and/or dry etching, such as deep RIE (DRIE). The etching of the channel holes continues until being stopped by stop layer 305, such as a high-k dielectric layer (e.g., an aluminum oxide layer) or a metal silicide layer, due to the etching selectivity between the materials of stop layer 305 (e.g., aluminum oxide or metal silicide) and N-type doped semiconductor layer 306 (i.e., polysilicon), according to some embodiments. In some embodiments, the etching conditions, such as etching rate and time, can be controlled to ensure that each channel hole has reached and stopped by stop layer 305 to minimize the gouging variations among the channel holes and channel structures 314 formed therein. It is understood that depending on the specific etching selectivity, one or more channel holes may extend into stop layer 305 to a small extent, which is still viewed as being stopped by stop layer 305 in the present disclosure.

As illustrated in FIG. 3B, a memory film including a blocking layer 317, a storage layer 316, and a tunneling layer 315, and a semiconductor channel 318 are sequentially formed in this order along sidewalls and the bottom surface of the channel hole. In some embodiments, blocking layer 317, storage layer 316, and tunneling layer 315 are first deposited along the sidewalls and bottom surface of the channel hole in this order using one or more thin film deposition processes, such as ALD, CVD, PVD, any other suitable processes, or any combination thereof, to form the memory film. Semiconductor channel 318 then can be formed by depositing a semiconductor material, such as polysilicon (e.g., undoped polysilicon), over tunneling layer 315 using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are sequentially deposited to form blocking layer 317, storage layer 316, and tunneling layer 315 of the memory film and semiconductor channel 318.

As illustrated in FIG. 3B, a capping layer is formed in the channel hole and over semiconductor channel 318 to completely or partially fill the channel hole (e.g., without or with an air gap). The capping layer can be formed by depositing a dielectric material, such as silicon oxide, using one or more thin film deposition processes, such as ALD, CVD, PVD, any other suitable processes, or any combination thereof. A channel plug can then be formed in the top portion of the channel hole. In some embodiments, parts of the memory film, semiconductor channel 318, and the capping layer that are on the top surface of dielectric stack 308 are removed and planarized by CMP, wet etching, and/or dry etching. A recess then can be formed in the top portion of the channel hole by wet etching and/or drying etching parts of semiconductor channel 318 and the capping layer in the top portion of the channel hole. The channel plug can then be formed by depositing semiconductor materials, such as polysilicon, into the recess by one or more thin film deposition processes, such as CVD, PVD, ALD, or any combination thereof. Channel structure 314 is thereby formed through dielectric stack 308 and N-type doped semiconductor layer 306, stopping at stop layer 305, according to some embodiments.

Method 500 proceeds to operation 508, as illustrated in FIG. 5A, in which the dielectric stack is replaced with a memory stack, for example, using the so-called "gate replacement" process, such that the channel structure extends vertically through the memory stack and the N-type doped semiconductor layer. In some embodiments, to replace the dielectric stack with the memory stack, an opening extending vertically through the dielectric stack, stopping at the N-type doped semiconductor layer, is etched, and the stack sacrificial layers are replaced with stack conductive layers through the opening to form the memory stack including interleaved the stack dielectric layers and the stack conductive layers.

As illustrated in FIG. 3C, a slit 320 is an opening that extends vertically through dielectric stack 308 and stops at N-type doped semiconductor layer 306. In some embodiments, fabrication processes for forming slit 320 include wet etching and/or dry etching, such as DRIE. A gate replacement then can be performed through slit 320 to replace dielectric stack 308 with a memory stack 330 (shown in FIG. 3E).

As illustrated in FIG. 3D, lateral recesses 322 are first formed by removing stack sacrificial layers 312 (shown in FIG. 3C) through slit 320. In some embodiments, stack sacrificial layers 312 are removed by applying etchants through slit 320, creating lateral recesses 322 interleaved between stack dielectric layers 310. The etchants can include any suitable etchants that etch stack sacrificial layers 312 selective to stack dielectric layers 310.

As illustrated in FIG. 3E, stack conductive layers 328 (including gate electrodes and adhesive layers) are deposited into lateral recesses 322 (shown in FIG. 3D) through slit 320. In some embodiments, a gate dielectric layer 332 is deposited into lateral recesses 322 prior to stack conductive layers 328, such that stack conductive layers 328 are deposited on gate dielectric layer 332. Stack conductive layers 328, such as metal layers, can be deposited using one or more thin film deposition processes, such as ALD, CVD, PVD, any other suitable processes, or any combination thereof. In some embodiments, gate dielectric layer 332, such as a high-k dielectric layer, is formed along the sidewall and at the bottom of slit 320 as well. Memory stack 330 including interleaved stack conductive layers 328 and stack dielectric layers 310 is thereby formed, replacing dielectric stack 308 (shown in FIG. 3D), according to some embodiments.

Method 500 proceeds to operation 510, as illustrated in FIG. 5A, in which an insulating structure extending vertically through the memory stack is formed. In some embodiments, to form the insulating structure, after forming the memory stack, one or more dielectric materials are deposited into the opening to fill the opening. As illustrated in FIG. 3E, an insulating structure 336 extending vertically through memory stack 330 is formed, stopping on the top surface of N-type doped semiconductor layer 306. Insulating structure 336 can be formed by depositing one or more dielectric materials, such as silicon oxide, into slit 320 to fully or partially fill slit 320 (with or without an air gap) using one or more thin film deposition processes, such as ALD, CVD, PVD, any other suitable processes, or any combination thereof. In some embodiments, insulating structure 336 includes gate dielectric layer 332 (e.g., including high-k dielectrics) and a dielectric capping layer 334 (e.g., including silicon oxide).

As illustrated in FIG. 3F, after the formation of insulating structure 336, local contacts, including channel local contacts 344 and word line local contacts 342, and peripheral contacts 338 and 340 are formed. A local dielectric layer can be formed on memory stack 330 by depositing dielectric materials, such as silicon oxide or silicon nitride, using one or more thin film deposition processes, such as CVD, PVD, ALD, or any combination thereof, on top of memory stack 330. Channel local contacts 344, word line local contacts 342, and peripheral contacts 338 and 340 can be formed by etching contact openings through the local dielectric layer (and any other ILD layers) using wet etching and/or dry etching, e.g., RIE, followed by filling the contact openings with conductive materials using one or more thin film deposition processes, such as ALD, CVD, PVD, any other suitable processes, or any combination thereof.

As illustrated in FIG. 3F, a bonding layer 346 is formed above channel local contacts 344, word line local contacts 342, and peripheral contacts 338 and 340. Bonding layer 346 includes bonding contacts electrically connected to channel local contacts 344, word line local contacts 342, and peripheral contacts 338 and 340. To form bonding layer 346, an ILD layer is deposited using one or more thin film deposition processes, such as CVD, PVD, ALD, or any combination thereof, and the bonding contacts are formed through the ILD layer using wet etching and/or dry etching, e.g., RIE, followed by one or more thin film deposition processes, such as ALD, CVD, PVD, any other suitable processes, or any combination thereof.

Method 500 proceeds to operation 512, as illustrated in FIG. 5A, in which the first substrate and the second substrate are bonded in a face-to-face manner, such that the memory stack is above the peripheral circuit. The bonding can include hybrid bonding. As illustrated in FIG. 3G, carrier substrate 302 and components formed thereon (e.g., memory stack 330 and channel structures 314 formed therethrough) are flipped upside down. Bonding layer 346 facing down is bonded with bonding layer 348 facing up, i.e., in a face-to-face manner, thereby forming a bonding interface 354 between carrier substrate 302 and silicon substrate 350, according to some embodiments. In some embodiments, a treatment process, e.g., a plasma treatment, a wet treatment, and/or a thermal treatment, is applied to the bonding surfaces prior to the bonding. After the bonding, the bonding contacts in bonding layer 346 and the bonding contacts in bonding layer 348 are aligned and in contact with one another, such that memory stack 330 and channel structures 314 formed therethrough can be electrically connected to peripheral circuits 352 and are above peripheral circuits 352.

Method 500 proceeds to operation 514, as illustrated in FIG. 5A, in which the second substrate, the sacrificial layer, and the first stop layer are sequentially removed to expose an end of each of the plurality of channel structures. The removal can be performed from the backside of the second substrate. In some embodiments, to sequentially remove the second substrate, the sacrificial layer, and the first stop layer, the second substrate is removed, stopping at the second stop layer of the sacrificial layer, and the remainder of the sacrificial layer is removed, stopping at the first stop layer.

As illustrated in FIG. 3H, carrier substrate 302 (and a pad oxide layer between carrier substrate 302 and stop layer 304, shown in FIG. 3G) are completely removed from the backside until being stopped by stop layer 304 (e.g., a silicon nitride layer). Carrier substrate 302 can be completely removed using CMP, grinding, dry etching, and/or wet etching. In some embodiments, carrier substrate 302 is peeled off. In some embodiments in which carrier substrate 302 includes silicon and stop layer 304 includes silicon nitride, carrier substrate 302 is removed using silicon CMP, which can be automatically stopped when reaching stop layer 304 having materials other than silicon, i.e., acting as a backside CMP stop layer. In some embodiments, substrate 302 (a silicon substrate) is removed using wet etching by tetramethylammonium hydroxide (TMAH), which is automatically stopped when reaching stop layer 304 having materials other than silicon, i.e., acting as a backside etch stop layer. Stop layer 304 can ensure the complete removal of carrier substrate 302 without the concern of thickness uniformity after thinning.

As shown in FIG. 3I, the remainder of sacrificial layer 303 (e.g., stop layer 304 and another pad oxide layer between stop layer 304 and stop layer 305, shown in FIG. 3H) then can be completely removed as well using wet etching with suitable etchants, such as phosphoric acid and hydrofluoric acid, until being stopped by stop layer 305 having a different material (e.g., high-k dielectric). As described above, since each channel structure 314 does not extend beyond stop layer 305 into sacrificial layer 303 or carrier substrate 302, the removal of carrier substrate 302 and sacrificial layer 303 does not affect channel structures 314. As shown in FIG. 3J, in some embodiments in which stop layer 305 includes a high-k dielectric (as opposed to a conductive layer including metal silicide), stop layer 305 (shown in FIG. 3I) is completely removed using wet etching and/or dry etching to expose the upper ends of channel structures 314.

Method 500 proceeds to operation 516, as illustrated in FIG. 5A, in which a conductive layer in contact with the ends of the plurality of channel structures is formed. In some embodiments, the conductive layer includes a metal silicide layer in contact with the ends of the plurality of channel structures and the N-type doped semiconductor layer, and a metal layer in contact with the metal silicide layer. In some embodiments, to form the conductive layer, part of the memory film abutting the N-type doped semiconductor layer is removed to form a recess surrounding part of the semiconductor channel, and the part of the semiconductor channel is doped. In some embodiments, to form the conductive layer, the metal silicide layer is formed in the recess in contact with the doped part of semiconductor channel and outside of the recess in contact with the N-type doped semiconductor layer.

As illustrated in FIG. 3J, parts of storage layer 316, blocking layer 317, and tunneling layer 315 (shown in FIG. 3I) abutting N-type doped semiconductor layer 306 are removed to form a recess 357 surrounding the top portion of semiconductor channel 318 extending into N-type doped semiconductor layer 306. In some embodiments, two wet etching processes are sequentially performed. For example, storage layer 316 including silicon nitride is selectively removed using wet etching with suitable etchants, such as phosphoric acid, without etching N-type doped semiconductor layer 306 including polysilicon. The etching of storage layer 316 can be controlled by controlling the etching time and/or etching rate, such that the etching does not continue to affect the rest of storage layer 316 surrounded by memory stack 330. Then, blocking layer 317 and tunneling layer 315 including silicon oxide may be selectively removed using wet etching with suitable etchants, such as hydrofluoric acid, without etching N-type doped semiconductor layer 306 and semiconductor channel 318 including polysilicon. The etching of blocking layer 317 and tunneling layer 315 can be controlled by controlling the etching time and/or etching rate, such that the etching does not continue to affect the rest of blocking layer 317 and tunneling layer 315 surrounded by memory stack 330. In some embodiments, a single dry etching process is performed, using patterned stop layer 305 as the etching mask. For example, stop layer 305 may not be removed when performing the dry etching, but instead, may be patterned to expose only storage layer 316, blocking layer 317, and tunneling layer 315 at the upper ends of channel structures 314, while still covering other areas as an etching mask. A dry etching then may be performed to etch parts of storage layer 316, blocking layer 317, and tunneling layer 315 abutting N-type doped semiconductor layer 306. The dry etching can be controlled by controlling the etching time and/or etching rate, such that the etching does not continue to affect the rest of storage layer 316, blocking layer 317, and tunneling layer 315 surrounded by memory stack 330. Patterned stop layer 305 may be removed once the dry etching is finished.

Nevertheless, the removal of parts of storage layer 316, blocking layer 317, and tunneling layer 315 abutting N-type doped semiconductor layer 306 from the backside is much less challenging and has a higher production yield compared with the known solutions using front side wet etching via the openings (e.g., slit 320 in FIG. 3D) through dielectric stack 308/memory stack 330 with a high aspect ratio (e.g., greater than 50). By avoiding the issues introduced by the high aspect ratio of slit 320, the fabrication complexity and cost can be reduced, and the yield can be increased. Moreover, the vertical scalability (e.g., the increasing level of dielectric stack 308/memory stack 330) can be improved as well.

As illustrated in FIG. 3J, the top portion of the memory film (including blocking layer 317, storage layer 316, and tunneling layer 315) of each channel structure 314 abutting N-type doped semiconductor layer 306 can be removed to form recess 357, exposing the top portion of semiconductor channel 318, according to some embodiments. In some embodiments, the top portion of semiconductor channel 318 exposed by recess 357 is doped to increase its conductivity. For example, a tilted ion implantation process may be performed to dope the top portion of semiconductor channel 318 (e.g., including polysilicon) exposed by recess 357 with any suitable dopants to a desired doping concentration.

As illustrated in FIG. 3K, a conductive layer 359 is formed in recess 357 (shown in FIG. 3J), surrounding and in contact with the doped top portion of semiconductor channel 318, as well as outside of recess 357 on N-type doped semiconductor layer 306. In some embodiments, to form conductive layer 359, a metal silicide layer 360 is formed in recess 357 in contact with the doped top portion of semiconductor channel 318 and outside of recess 357 in contact with N-type doped semiconductor layer 306, and a metal layer 362 is formed on metal silicide layer 360. In one example, a metal film (e.g., Co, Ni, or Ti) may be deposited on the sidewalls and bottom surfaces of recess 357 and on N-type doped semiconductor layer 306 using one or more thin film deposition processes, such as ALD, CVD, PVD, any other suitable processes, or any combination thereof. The metal film can be in contact with polysilicon of N-type doped semiconductor layer 306 and the doped top portion of semiconductor channel 318. A silicidation process then can be performed on the metal film and the polysilicon by a thermal treatment (e.g., annealing, sintering, or any other suitable process) to form metal silicide layer 360 along the sidewalls and bottom surfaces of recess 357 and on N-type doped semiconductor layer 306. Metal layer 362 then can be formed on metal silicide layer 360 by depositing another metal film (e.g., W, Al, Ti, TiN, Co, and/or Ni) using one or more thin film deposition processes, such as ALD, CVD, PVD, any other suitable processes, or any combination thereof, on metal silicide layer 360 to fill the remaining space of recess 357. In another example, instead of depositing two metal films separately, a single metal film (e.g., Co, Ni, or Ti) may be deposited into recess 357 to fill recess 357 and on N-type doped semiconductor layer 306 using one or more thin film deposition processes, such as ALD, CVD, PVD, any other suitable processes, or any combination thereof. A silicidation process then can be performed on the metal film and the polysilicon by a thermal treatment (e.g., annealing, sintering, or any other suitable process), such that part of the metal film forms metal silicide layer 360 along the sidewalls and bottom surfaces of recess 357 and on N-type doped semiconductor layer 306, while the remainder of the metal film becomes metal layer 362 on metal silicide layer 360. A CMP process can be performed to remove any excess metal layer 362. As shown in FIG. 3K, conductive layer 359 (as one example of conductive layer 122 in 3D memory device 100 in FIG. 1A) including metal silicide layer 360 and metal layer 362 is thereby formed, according to some embodiments. In some embodiments conductive layer 359 is patterned and etched not to cover the peripheral region.

In some embodiments, to form the conductive layer, doped polysilicon is deposited into the recess to be in contact with the doped part of semiconductor channel, and the metal silicide layer is formed in contact with the doped polysilicon and the N-type doped semiconductor layer. As illustrated in FIG. 3O, a channel plug 365 is formed in recess 357 (shown in FIG. 3J), surrounding and in contact with the doped top portion of semiconductor channel 318. As a result, the removed top portion of channel structure 314 (shown in FIG. 3H) abutting N-type doped semiconductor layer 306 is thereby replaced with channel plug 365, according to some embodiments. In some embodiments, to form channel plug 365, polysilicon is deposited into recess 357 using one or more thin film deposition processes, such as ALD, CVD, PVD, any other suitable processes, or any combination thereof to fill recess 357, followed by a CMP process to remove any excess polysilicon above the top surface of N-type doped semiconductor layer 306. In some embodiments, in-situ doping of N-type dopants, such as P, As, or Sb, is performed when depositing polysilicon into recess 357 to dope channel plug 365. As channel plug 365 and doped top portion of semiconductor channel 318 may include the same material, such as doped polysilicon, channel plug 365 may be viewed as part of semiconductor channel 318 of channel structure 314.

As shown in FIG. 3O, conductive layer 359 including metal silicide layer 360 and metal layer 362 is formed on N-type doped semiconductor layer 306 and channel plug 365. In some embodiments, a metal film is first deposited on N-type doped semiconductor layer 306 and channel plug 365, followed by a silicidation process to form metal silicide layer 360 in contact with channel plug 365 and N-type doped semiconductor layer 306. Another metal film then can be deposited on metal silicide layer 360 to form metal layer 362. In some embodiments, a metal film is deposited on N-type doped semiconductor layer 306 and channel plug 365, followed by a silicidation process, such that part of the metal film in contact with N-type doped semiconductor layer 306 and channel plug 365 form metal silicide layer 360 and the remainder of the metal film becomes metal layer 362. As shown in FIG. 3O, conductive layer 359 (as one example of conductive layer 122 in 3D memory device 150 in FIG. 1B) including metal silicide layer 360 and metal layer 362 is thereby formed, according to some embodiments. In some embodiments conductive layer 359 is patterned and etched not to cover the peripheral region.

Method 500 proceeds to operation 518, as illustrated in FIG. 5A, in which a source contact is formed above the memory stack and in contact with the N-type doped semiconductor layer. As illustrated in FIG. 3L, one or more ILD layers 356 are formed on N-type doped semiconductor layer 306. ILD layers 356 can be formed by depositing dielectric materials on the top surface of N-type doped semiconductor layer 306 using one or more thin film deposition processes, such as ALD, CVD, PVD, any other suitable processes, or any combination thereof. A source contact opening 358 can be formed through ILD layers 356 and conductive layer 359 into N-type doped semiconductor layer 306. In some embodiments, source contact opening 358 is formed using wet etching and/or dry etching, such as ME. In some embodiments, source contact opening 358 extends further into the top portion of N-type doped semiconductor layer 306. The etching process through ILD layers 356 may continue to etch part of N-type doped semiconductor layer 306. In some embodiments, a separate etching process is used to etch part of N-type doped semiconductor layer 306 after etching through ILD layers 356 and conductive layer 359.

As illustrated in FIG. 3M, a source contact 364 is formed in source contact opening 358 (shown in FIG. 3L) at the backside of N-type doped semiconductor layer 306. Source contact 364 is above memory stack 330 and in contact with N-type doped semiconductor layer 306, according to some embodiments. In some embodiments, one or more conductive materials are deposited into source contact opening 358 using one or more thin film deposition processes, such as ALD, CVD, PVD, any other suitable processes, or any combination thereof, to fill source contact opening 358 with an adhesive layer (e.g., TiN) and a conductor layer (e.g., W). A planarization process, such as CMP, can then be performed to remove the excess conductive materials, such that the top surface of source contact 364 is flush with the top surface of ILD layers 356.

Method 500 proceeds to operation 520, as illustrated in FIG. 5A, in which an interconnect layer is formed above and in contact with the source contact. In some embodiments, a contact is formed through the N-type doped semiconductor layer and in contact with the interconnect layer, such that the N-type doped semiconductor layer is electrically connected to the contact through the source contact and the interconnect layer.

As illustrated in FIG. 3N, a redistribution layer 370 is formed above and in contact with source contact 364. In some embodiments, redistribution layer 370 is formed by depositing a conductive material, such as Al, on the top surfaces of ILD layers 356 and source contact 364 using one or more thin film deposition processes, such as ALD, CVD, PVD, any other suitable processes, or any combination thereof. A passivation layer 372 can be formed on redistribution layer 370. In some embodiments, passivation layer 372 is formed by depositing a dielectric material, such as silicon nitride, using one or more thin film deposition processes, such as ALD, CVD, PVD, any other suitable processes, or any combination thereof. An interconnect layer 376 including ILD layers 356, redistribution layer 370, and passivation layer 372 is thereby formed, according to some embodiments.

As illustrated in FIG. 3L, contact openings 363 and 361 each extending through ILD layers 356 and N-type doped semiconductor layer 306 are formed. In some embodiments, contact openings 363 and 361 are formed using wet etching and/or dry etching, such as ME, through ILD layers 356 and N-type doped semiconductor layer 306. In some embodiments, contact openings 363 and 361 are patterned using lithography to be aligned with peripheral contacts 338 and 340, respectively. The etching of contact openings 363 and 361 can stop at the upper ends of peripheral contacts 338 and 340 to expose peripheral contacts 338 and 340. As illustrated in FIG. 3L, a spacer 362 is formed along the sidewalls of contact openings 363 and 361 to electrically separate N-type doped semiconductor layer 306 using one or more thin film deposition processes, such as ALD, CVD, PVD, any other suitable processes, or any combination thereof. In some embodiments, the etching of source contact opening 358 is performed after the formation of spacer 362, such that spacer 362 is not formed along the sidewall of source contact opening 358 to increase the contact area between source contact 364 and N-type doped semiconductor layer 306.

As illustrated in FIG. 3M, contacts 366 and 368 are formed in contact openings 363 and 361, respectively (shown in FIG. 3L) at the backside of N-type doped semiconductor layer 306. Contacts 366 and 368 extend vertically through ILD layers 356 and N-type doped semiconductor layer 306, according to some embodiments. Contacts 366 and 368 and source contact 364 can be formed using the same deposition process to reduce the number of deposition processes. In some embodiments, one or more conductive materials are deposited into contact openings 363 and 361 using one or more thin film deposition processes, such as ALD, CVD, PVD, any other suitable processes, or any combination thereof, to fill contact openings 363 and 361 with an adhesive layer (e.g., TiN) and a conductor layer (e.g., W). A planarization process, such as CMP, can then be performed to remove the excess conductive materials, such that the top surfaces of contacts 366 and 368 (and the top surface of source contact 364) are flush with the top surface of ILD layers 356. In some embodiments, as contact openings 363 and 361 are aligned with peripheral contacts 338 and 340, respectively, contacts 366 and 368 are above and in contact with peripheral contacts 338 and 340, respectively, as well.

As illustrated in FIG. 3N, redistribution layer 370 is also formed above and in contact with contact 366. As a result, N-type doped semiconductor layer 306 can be electrically connected to peripheral contact 338 through source contact 364, redistribution layer 370 of interconnect layer 376, and contact 366. In some embodiments, N-type doped semiconductor layer 306 is electrically connected to peripheral circuits 352 through source contact 364, interconnect layer 376, contact 366, peripheral contact 338, and bonding layers 346 and 348.

As illustrated in FIG. 3N, a contact pad 374 is formed above and in contact with contact 368. In some embodiments, part of passivation layer 372 covering contact 368 is removed by wet etching and/or dry etching to expose part of redistribution layer 370 underneath to form contact pad 374. As a result, contact pad 374 for pad-out can be electrically connected to peripheral circuits 352 through contact 368, peripheral contact 340, and bonding layers 346 and 348.

It is understood that the first stop layer in method 500 may be a first conductive layer, e.g., a metal silicide layer, part of which remains in the conductive layer in the final product, as described below with respect to method 501. The detail of similar operations between methods 500 and 501 may not be repeated for ease of description. Referring to FIG. 5B, method 501 starts at operation 502, in which a peripheral circuit is formed on a first substrate. The first substrate can be a silicon substrate.

Method 501 proceeds to operation 505, as illustrated in FIG. 5B, in which a sacrificial layer on a second substrate, a first conductive layer on the sacrificial layer, an N-type doped semiconductor layer on the first conductive layer, and a dielectric stack on the N-type doped semiconductor layer are sequentially formed. In some embodiments, the first conductive layer includes a metal silicide. As illustrated in FIG. 3A, stop layer 305 may be a conductive layer including metal silicide, i.e., a metal silicide layer. It is understood that the above descriptions related to the formation of carrier substrate 302, sacrificial layer 303, and N-type doped semiconductor layer 306 can be similarly applied to method 501 and thus, are not repeated for ease of description.

Method 501 proceeds to operation 507, as illustrated in FIG. 5B, in which a plurality of channel structures each extending vertically through the dielectric stack and the N-type doped semiconductor layer are formed, stopping at the first conductive layer. In some embodiments, to form the channel structures, a plurality of channel holes each extending vertically through the dielectric stack and the doped device layer, stopping at the first conductive layer, is formed, and a memory film and a semiconductor channel are subsequently deposited along a sidewall of each channel hole.

Method 501 proceeds to operation 508, as illustrated in FIG. 5B, in which the dielectric stack is replaced with a memory stack, such that each channel structure extends vertically through the memory stack and the N-type doped semiconductor layer. In some embodiments, to replace the dielectric stack with the memory stack, an opening extending vertically through the dielectric stack is etched, stopping at the N-type doped semiconductor layer, and the stack sacrificial layers are replaced with stack conductive layers through the opening to form the memory stack including interleaved the stack dielectric layers and the stack conductive layers.

Method 501 proceeds to operation 510, as illustrated in FIG. 5B, in which an insulating structure extending vertically through the memory stack is formed. In some embodiments, to form the insulating structure, after forming the memory stack, one or more dielectric materials are deposited into the opening to fill the opening. Method 501 proceeds to operation 512, as illustrated in FIG. 5B, in which the first substrate and the second substrate wafer are bonded in a face-to-face manner, such that the memory stack is above the peripheral circuit. The bonding can include hybrid bonding.

Method 501 proceeds to operation 515, as illustrated in FIG. 5B, in which the second substrate, the sacrificial layer, and part the first conductive layer are sequentially removed to expose an end of each of the plurality of channel structures. The removal can be performed from the backside of the second substrate. In some embodiments, to sequentially remove the second substrate, the sacrificial layer, and the part of the first conductive layer, the second substrate is removed, stopping at the stop layer, a remainder of the sacrificial layer is removed, stopping at the first conductive layer, and part of the first conductive layer is removed to expose the end of each of the plurality of channel structures.

It is understood that the above descriptions related to the removal of carrier substrate 302 and sacrificial layer 303 can be similarly applied to method 501 and thus, are not repeated for ease of description. As illustrated in FIG. 3P, after the removal of sacrificial layer 303 (shown in FIG. 3G), part of conductive layer 305 (e.g., a metal silicide layer) is removed to expose the upper ends of channel structures 314. Conductive layer 305 can be patterned, such that parts right above each channel structure 314 can be removed to expose each channel structure 314 using, for example, lithography, wet etching, and/or dry etching. The remainder of conductive layer 305 remains on N-type doped semiconductor layer 306, according to some embodiments.

Method 501 proceeds to operation 517, as illustrated in FIG. 5B, in which a second conductive layer is formed in contact with the ends of the plurality of channel structures and the first conductive layer. The second conductive layer can include a metal. In some embodiments, to form the second conductive layer, part of the memory film abutting the N-type doped semiconductor layer is etched to form a recess surrounding part of the semiconductor channel, the part of the semiconductor channel is doped, and the metal is deposited into the recess to be in contact with the doped part of semiconductor channel and outside of the recess to be in contact with the first conductive layer.

It is understood that the above descriptions related to the removal of parts of storage layer 316, blocking layer 317, and tunneling layer 315 abutting N-type doped semiconductor layer 306 to form recess 357 can be similarly applied to method 501 and thus, are not repeated for ease of description. As illustrated in FIG. 3P, metal layer 362 is formed in recess 357 (shown in FIG. 3J), surrounding and in contact with the doped top portion of semiconductor channel 318, as well as outside of recess 357 on conductive layer 305 (e.g., a metal silicide layer). Metal layer 362 can surround and contact the ends of channel structures 314 (e.g., the doped portions of semiconductor channels 318) in recess 357. Metal layer 362 can also be above and in contact with conductive layer 305 outside of recess 357. Metal layer 362 can be formed by depositing a metal film (e.g., W, Al, Ti, TiN, Co, and/or Ni) using one or more thin film deposition processes, such as ALD, CVD, PVD, any other suitable processes, or any combination thereof, to fill recess 357 and outside of recess 357 on conductive layer 305. A CMP process can be performed to remove any excess metal layer 362. Conductive layer 359 (as one example of conductive layer 122 in 3D memory device 160 in FIG. 1C) including metal layer 362 and conductive layer 305 is thereby formed, according to some embodiments. In some embodiments conductive layer 359 is patterned and etched not to cover the peripheral region. Compared with method 500, the number of fabrication processes in method 501 can be reduced by keeping the first stop layer (e.g., a metal silicide layer) part of the conductive layer in the final product.

Method 501 proceeds to operation 518, as illustrated in FIG. 5B, in which a source contact above the memory stack and in contact with the N-type doped semiconductor layer is formed. Method 501 proceeds to operation 520, as illustrated in FIG. 5B, in which an interconnect layer above and in contact with the source contact is formed. In some embodiments, a contact is formed through the N-type doped semiconductor layer and in contact with the interconnect layer, such that the N-type doped semiconductor layer is electrically connected to the contact through the source contact and the interconnect layer.

Figure 4A:
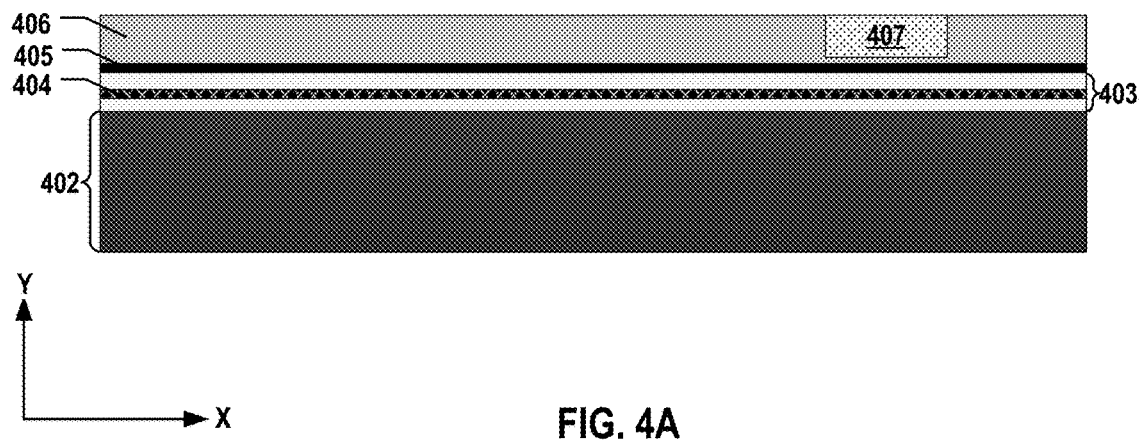
FIGS. 4A-4Q illustrate a fabrication process for forming another exemplary 3D memory device, according to some embodiments of the present disclosure.
Figure 4B:
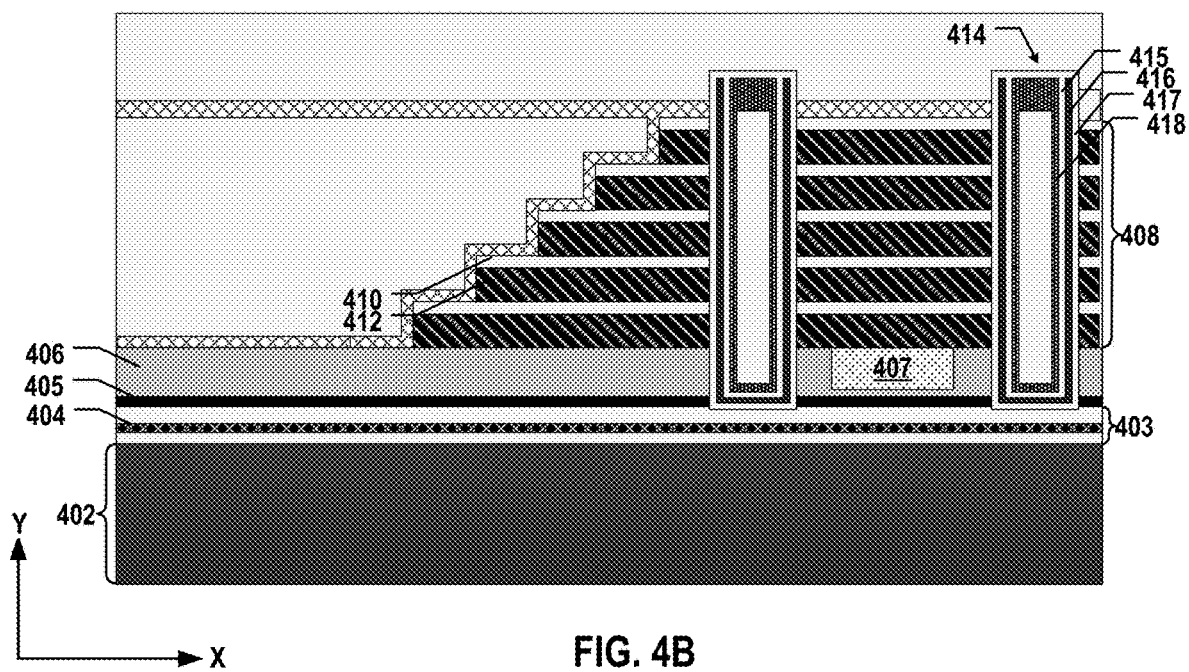
Figure 4C:
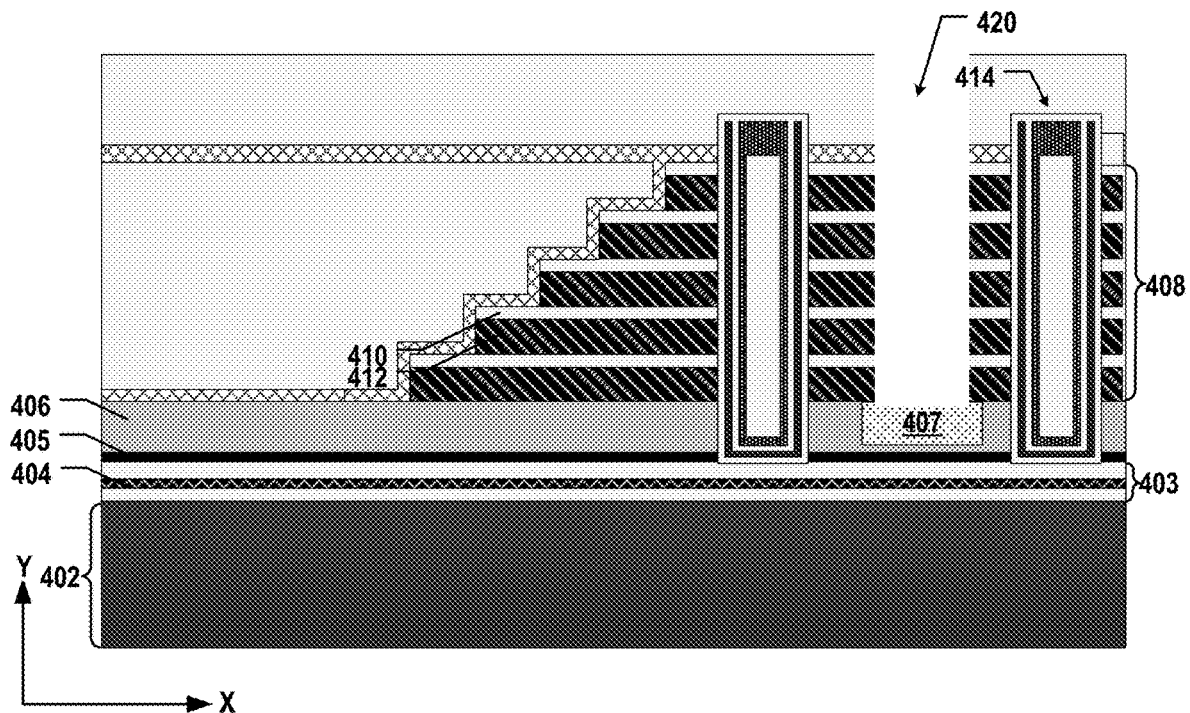
Figure 4D:
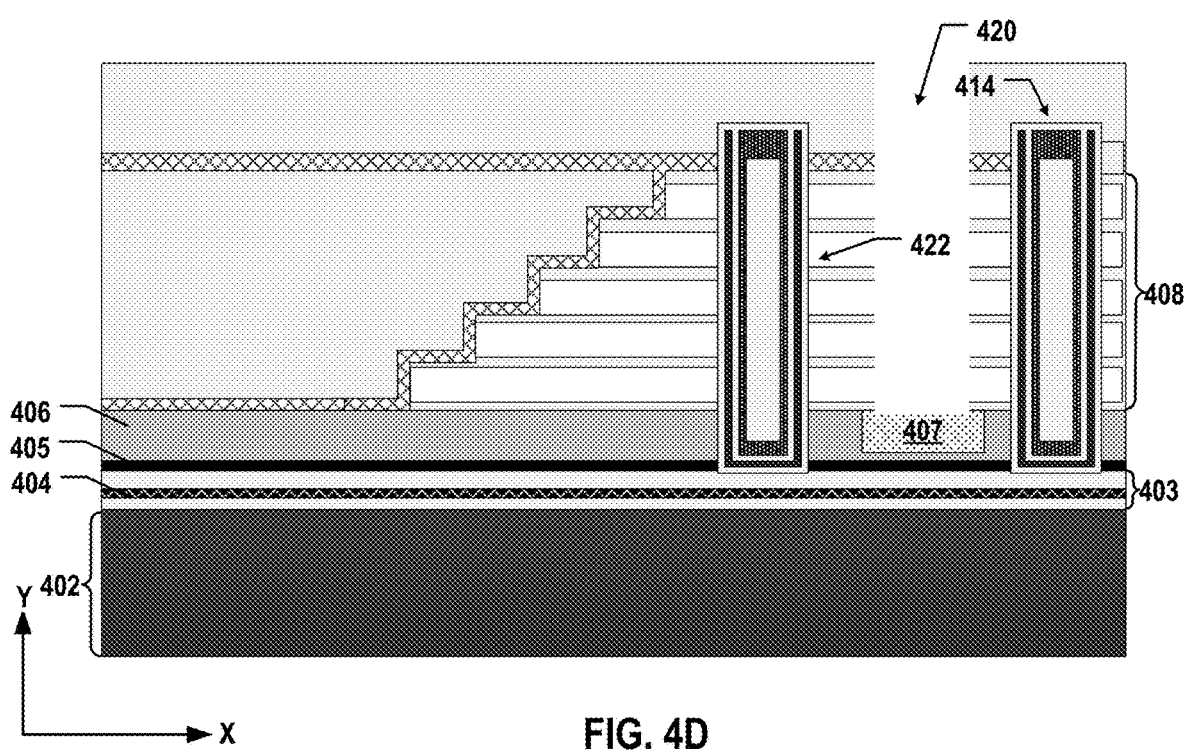
Figure 4E:
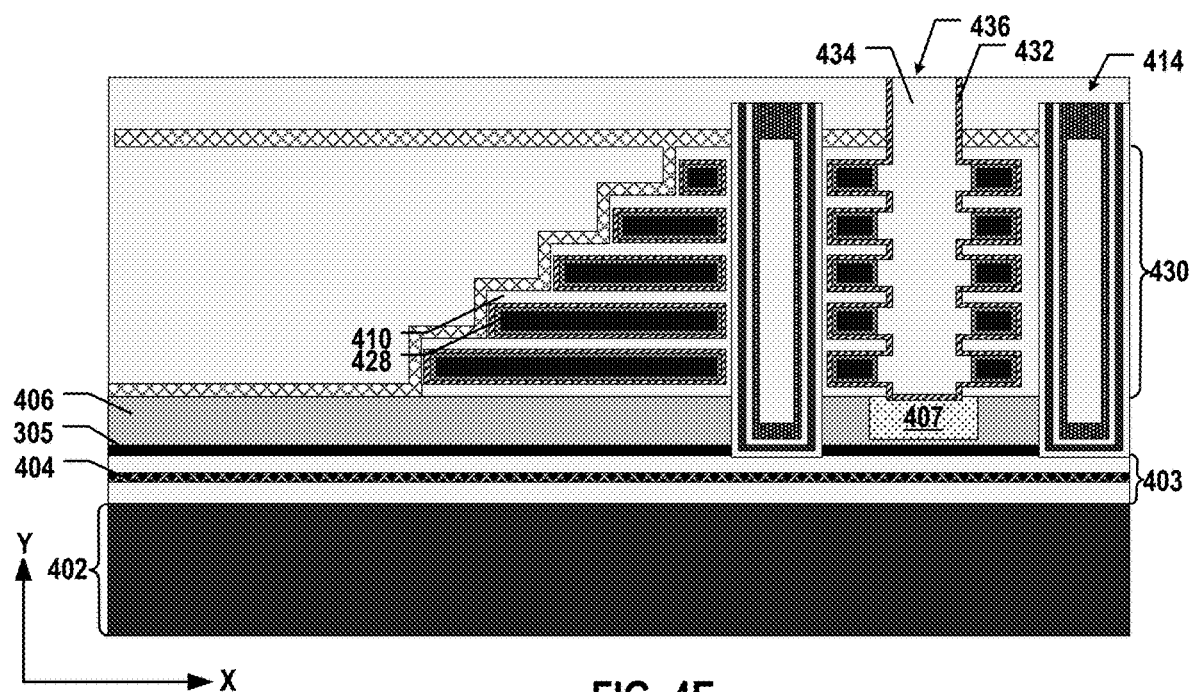
Figure 4F:
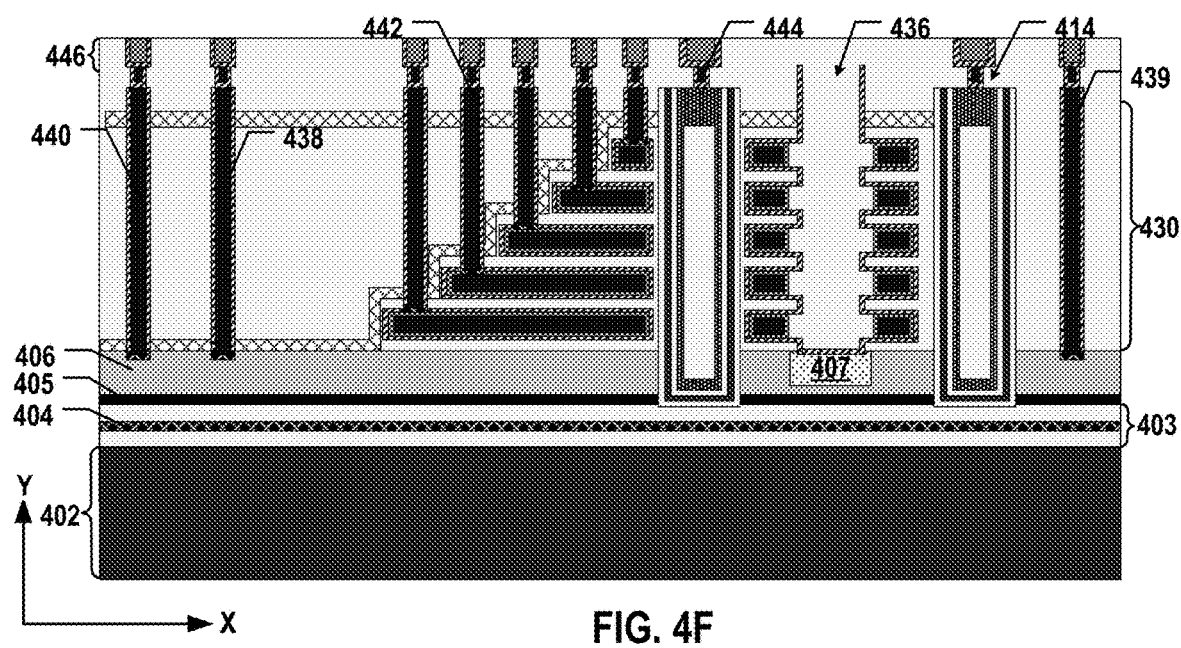
Figure 4G:
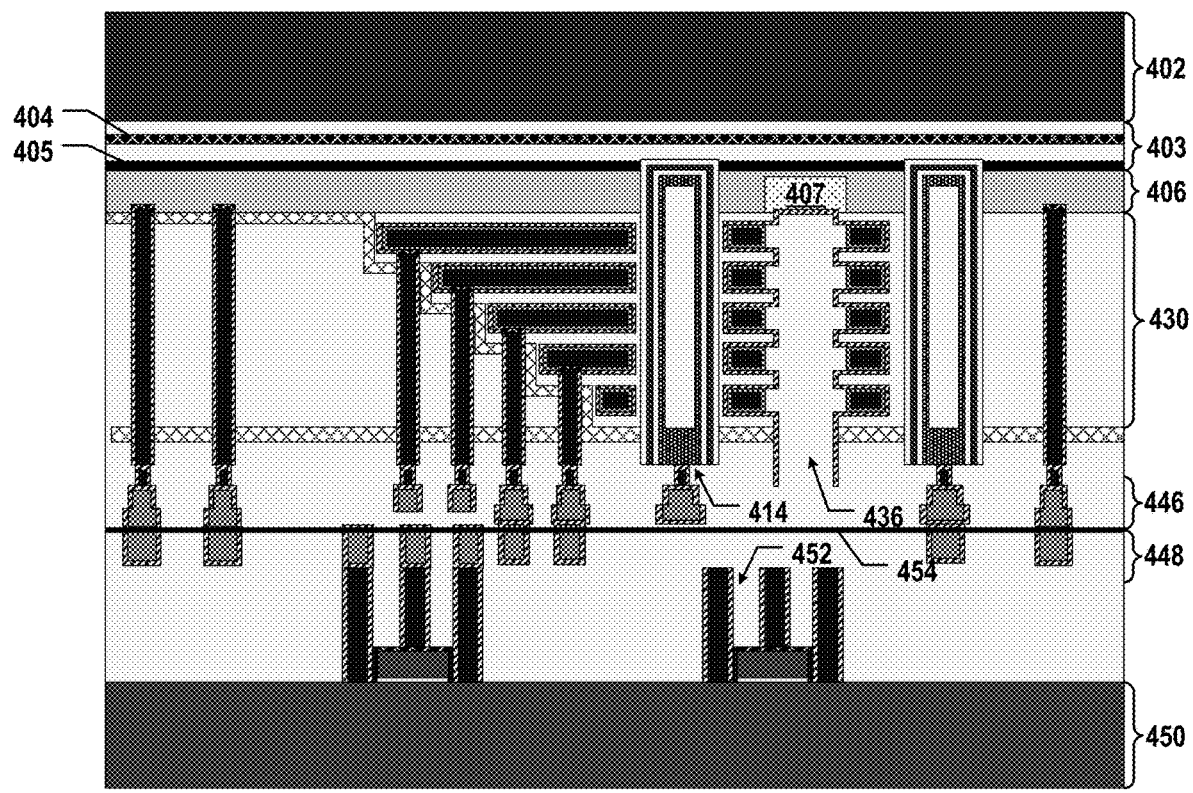
Figure 4H:
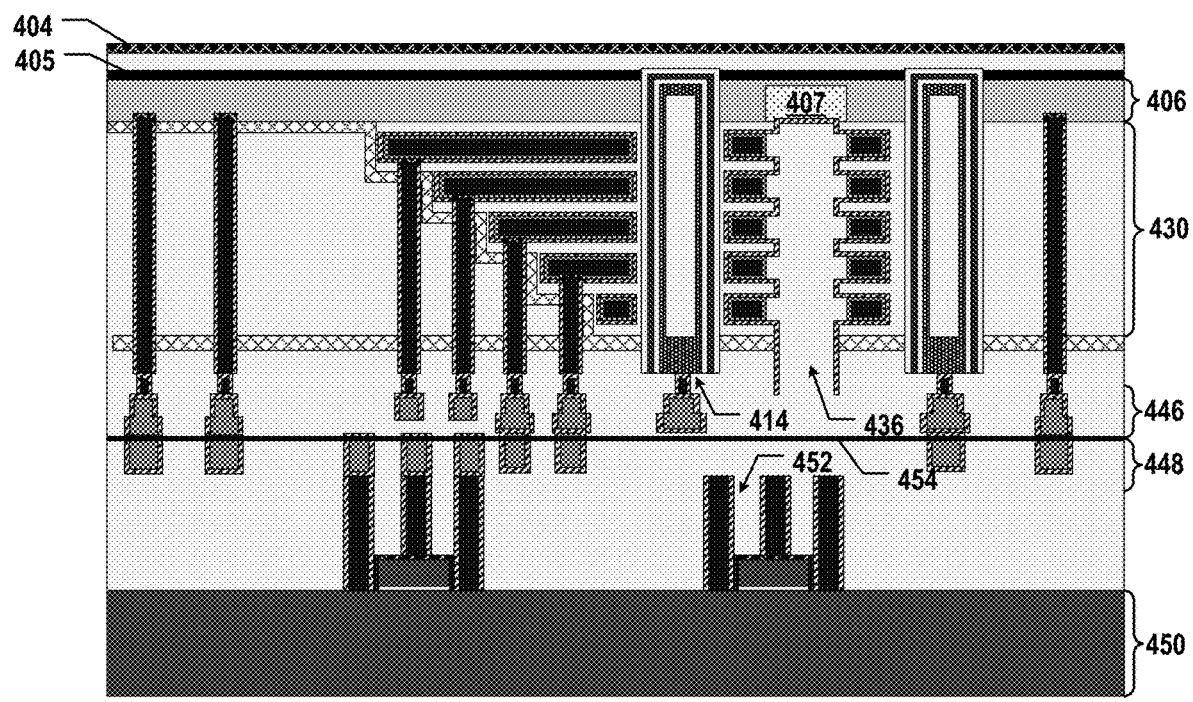
Figure 4K:
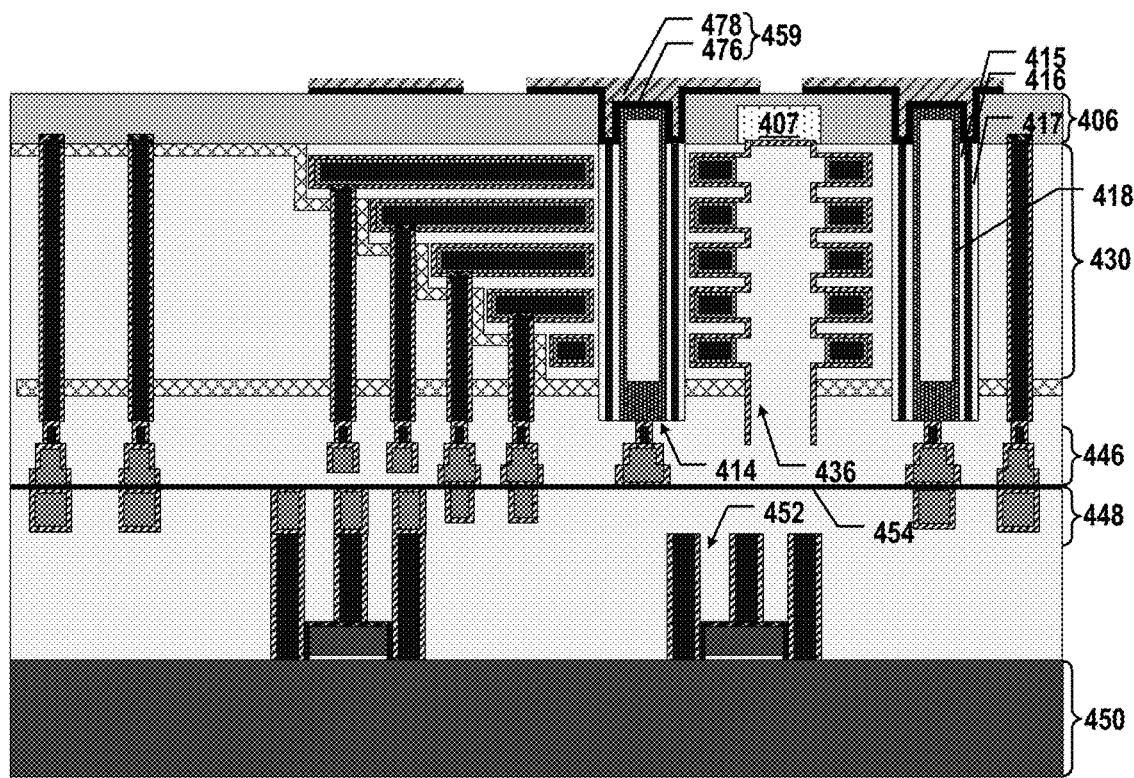
Figure 4L:
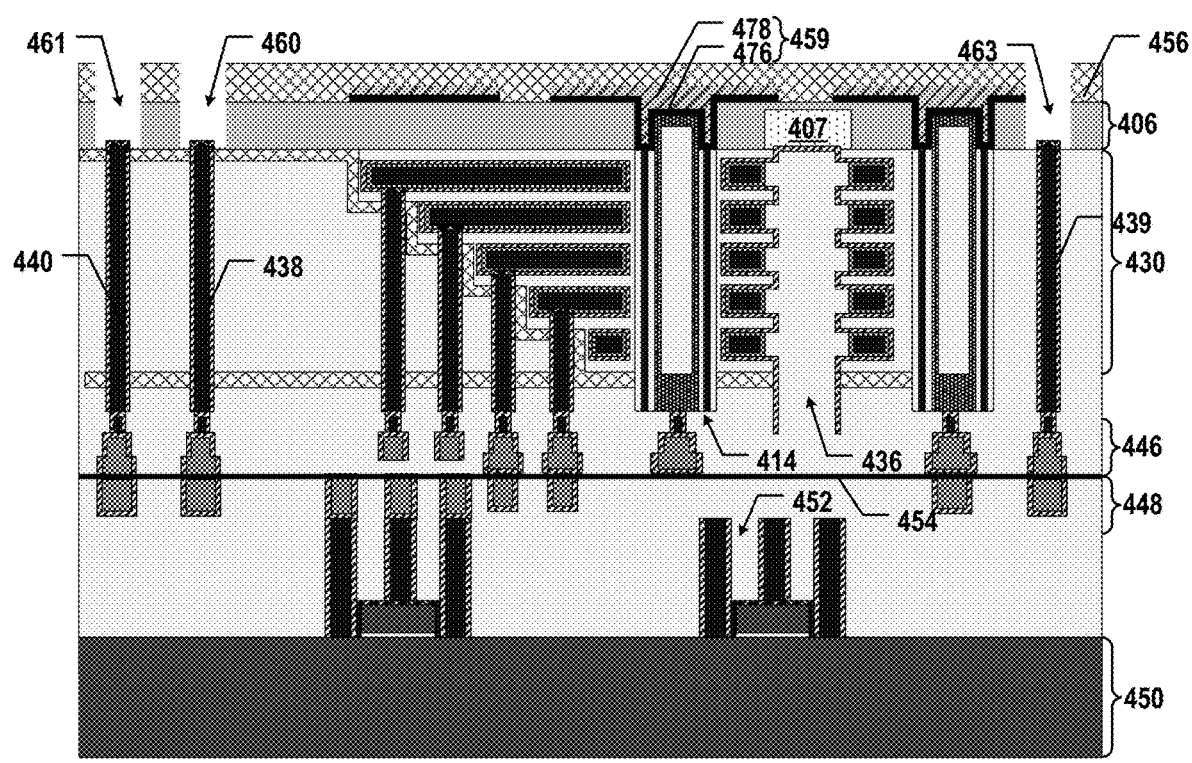
Figure 4M:
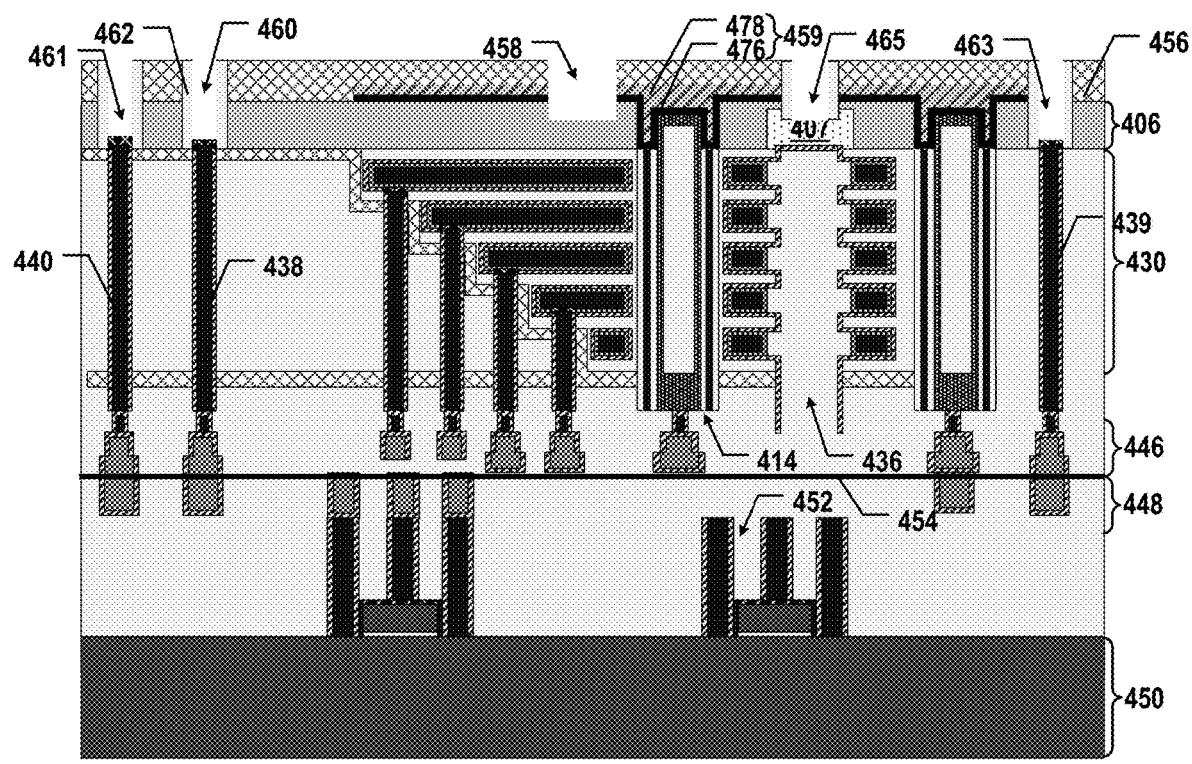
Figure 4N:
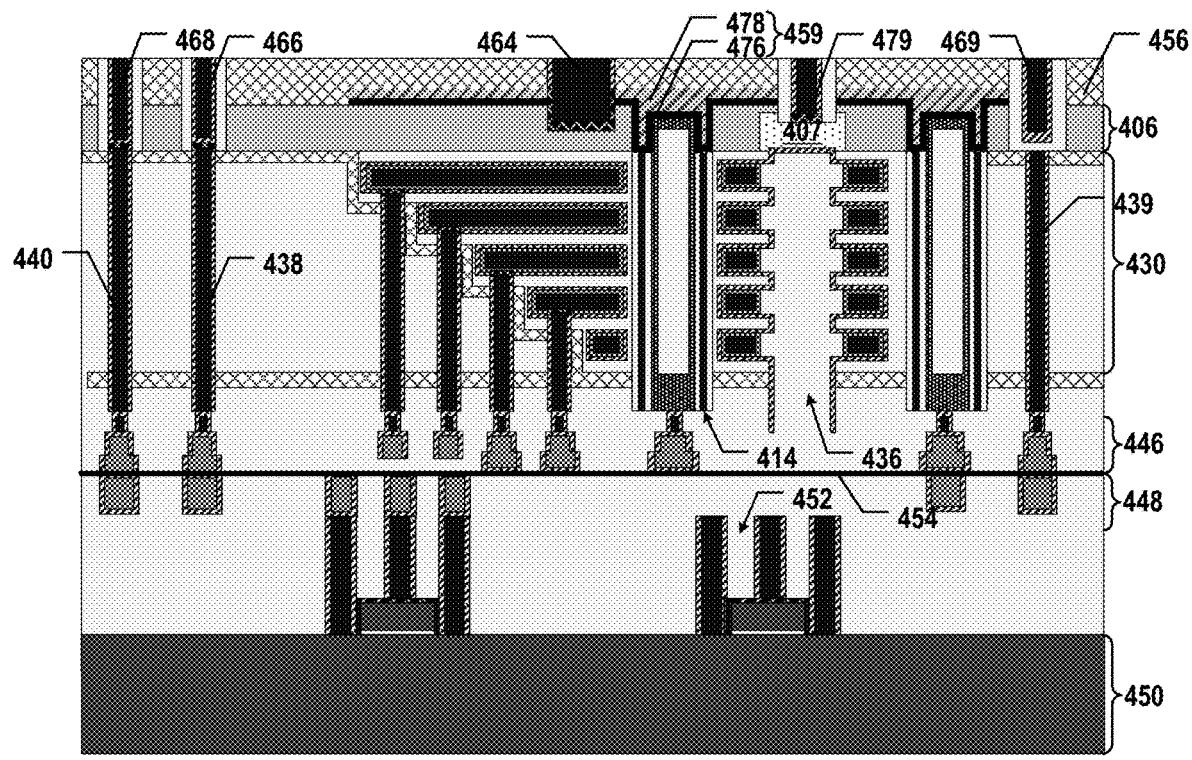
Figure 40:
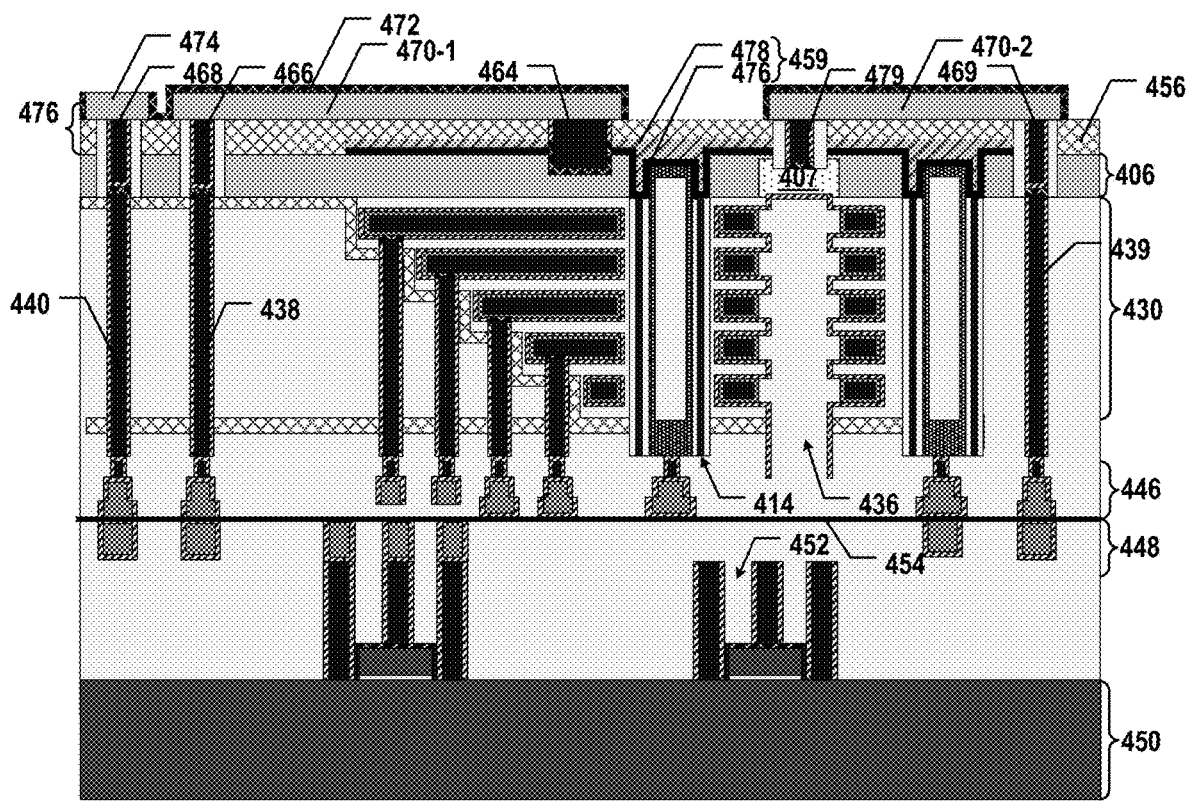
Figure 4P:
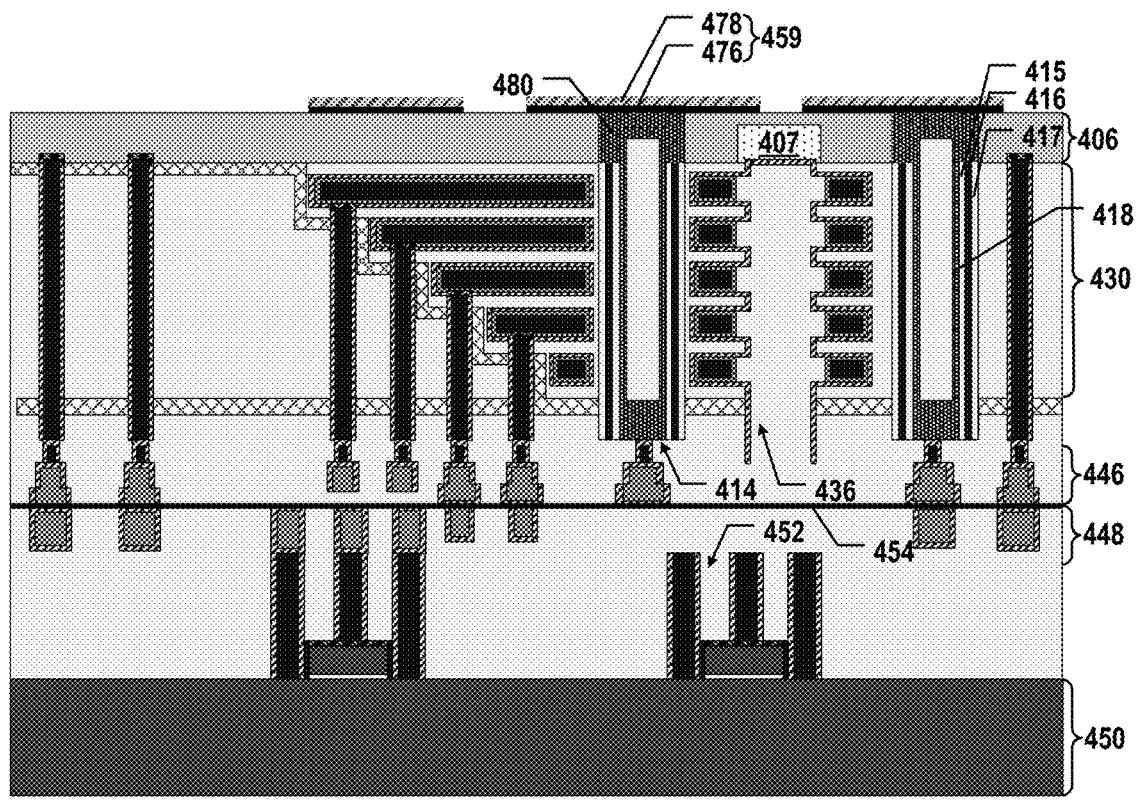
Figure 4Q:
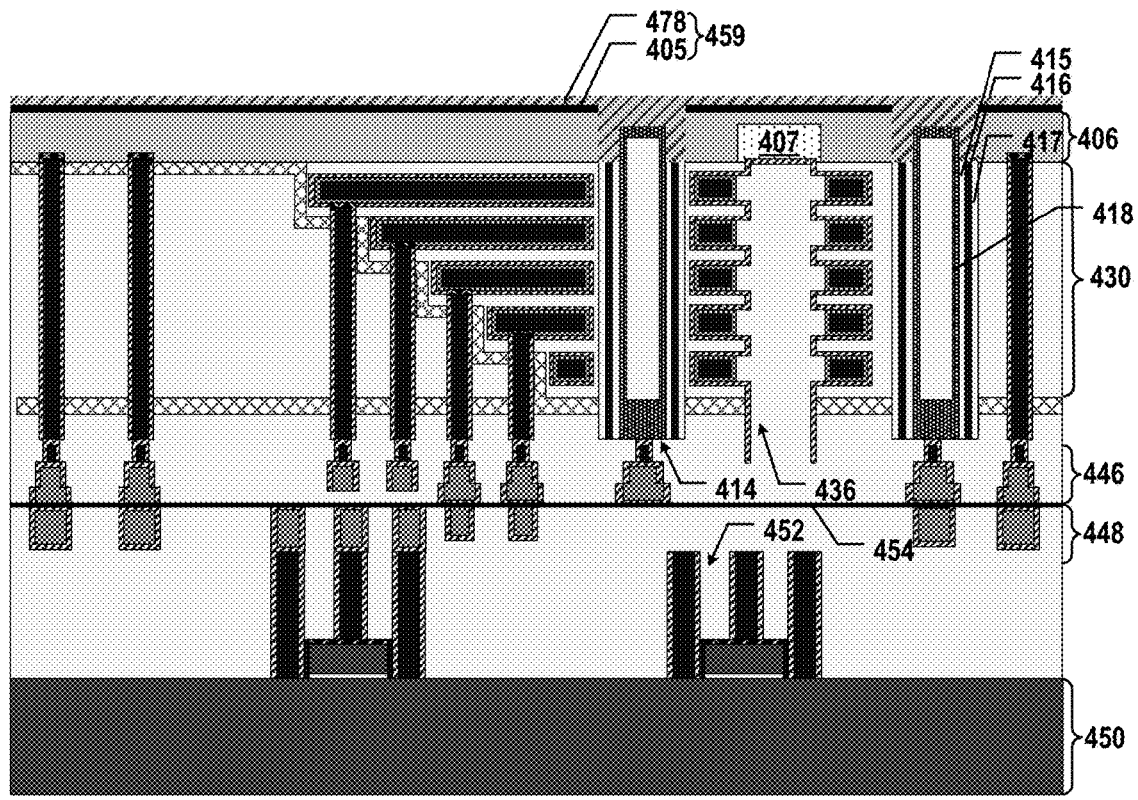
Figure 6A:
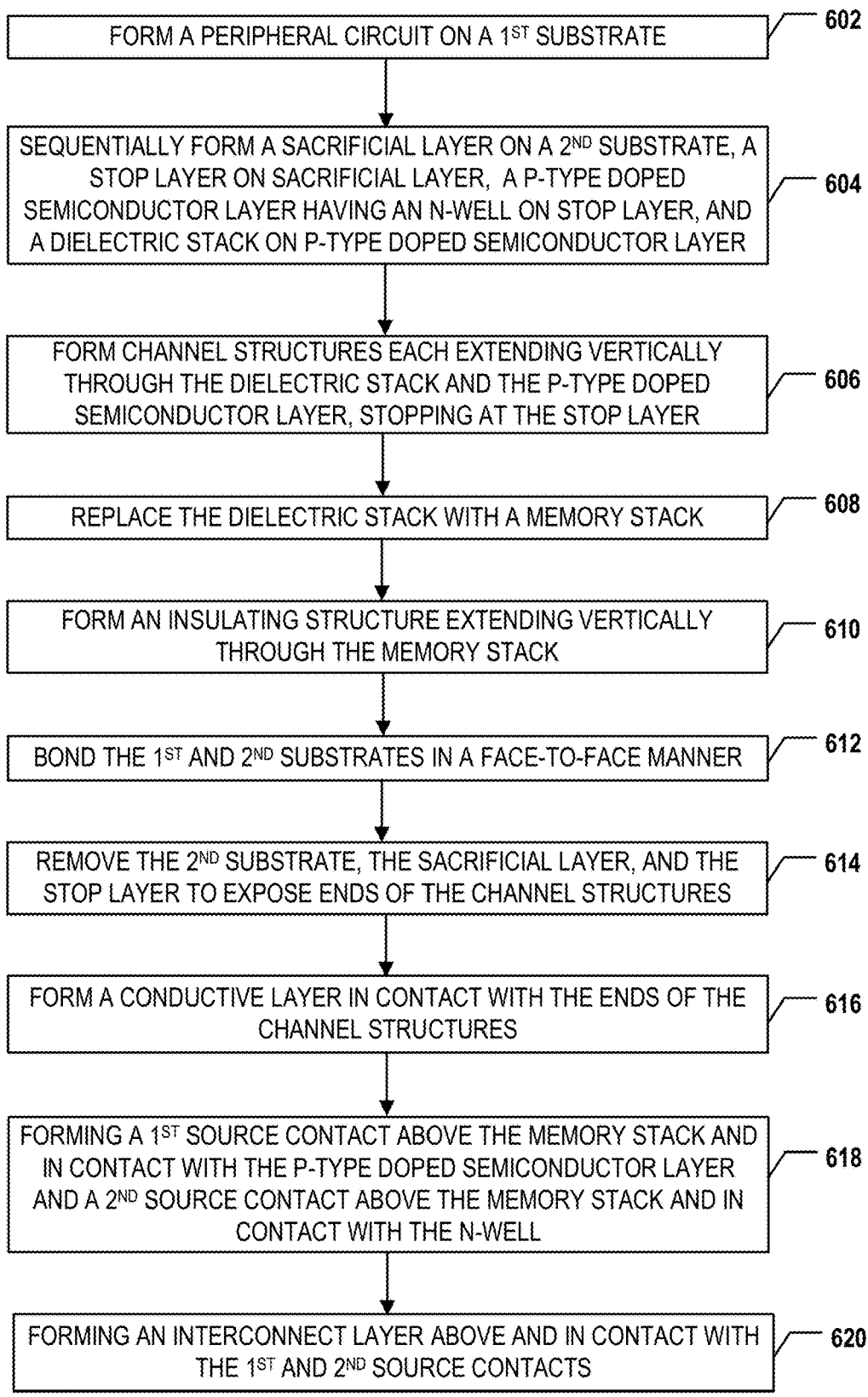
FIG. 6A illustrates a flowchart of a method for forming another exemplary 3D memory device, according to some embodiments of the present disclosure.
Figure 6B:
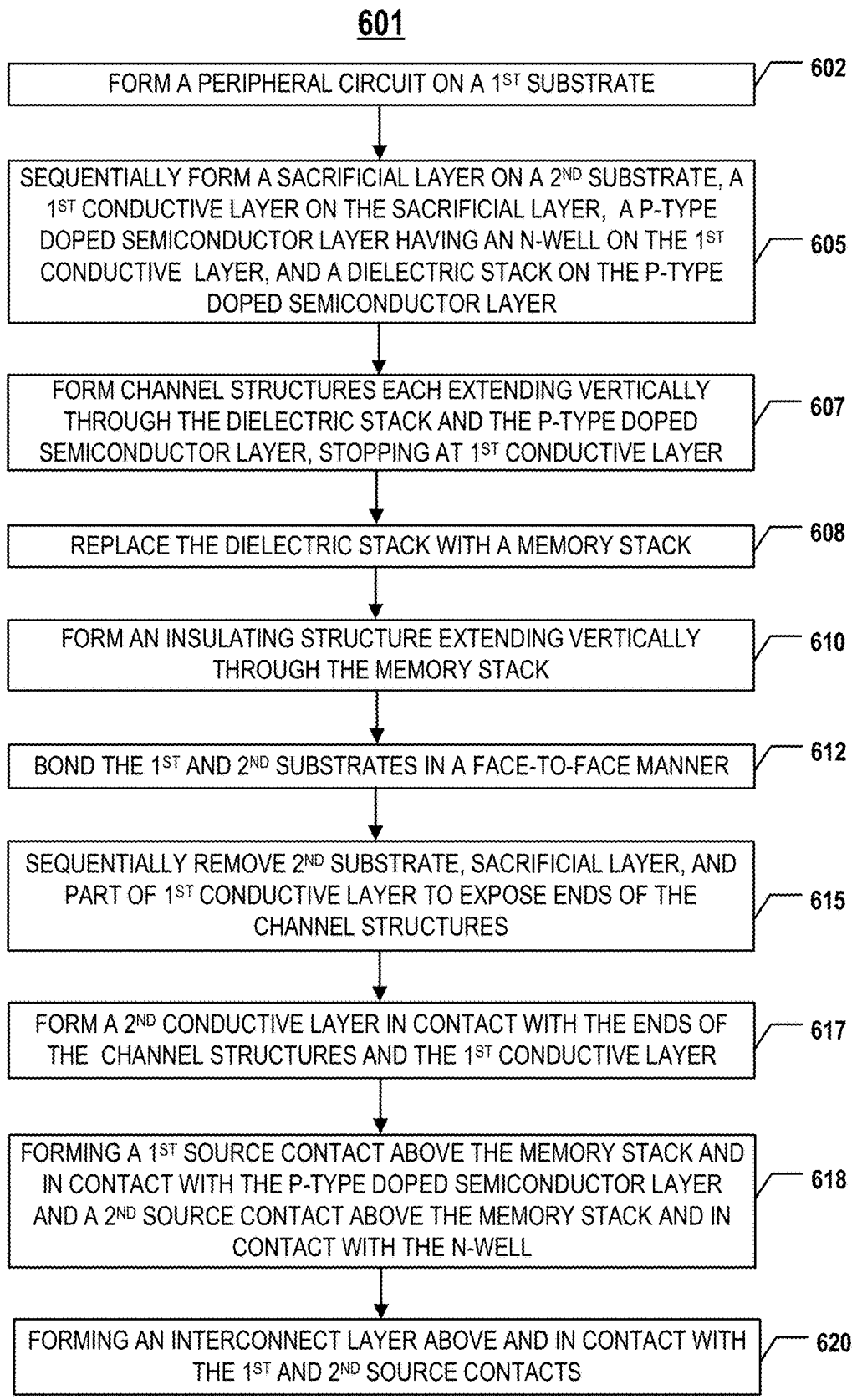
FIG. 6B illustrates a flowchart of another method for forming another exemplary 3D memory device, according to some embodiments of the present disclosure.

FIGS. 4A-4Q illustrate a fabrication process for forming another exemplary 3D memory device, according to some embodiments of the present disclosure. FIG. 6A illustrates a flowchart of a method 600 for forming another exemplary 3D memory device, according to some embodiments of the present disclosure. FIG. 6B illustrates a flowchart of another method 601 for forming another exemplary 3D memory device, according to some embodiments of the present disclosure. Examples of the 3D memory device depicted in FIGS. 4A-4Q, 6A, and 6B include 3D memory devices 200, 250, and 260 depicted in FIGS. 2A-2C. FIGS. 4A-4Q, 6A, and 6B will be described together. It is understood that the operations shown in methods 600 and 601 are not exhaustive and that other operations can be performed as well before, after, or between any of the illustrated operations. Further, some of the operations may be performed simultaneously, or in a different order than shown in FIGS. 6A and 6B.

Referring to FIG. 6A, method 600 starts at operation 602, in which a peripheral circuit is formed on a first substrate. The first substrate can be a silicon substrate. As illustrated in FIG. 4G, a plurality of transistors are formed on a silicon substrate 450 using a plurality of processes including, but not limited to, photolithography, etching, thin film deposition, thermal growth, implantation, CMP, and any other suitable processes. In some embodiments, doped regions (not shown) are formed in silicon substrate 450 by ion implantation and/or thermal diffusion, which function, for example, as source regions and/or drain regions of the transistors. In some embodiments, isolation regions (e.g., STIs) are also formed in silicon substrate 450 by wet etching and/or dry etching and thin film deposition. The transistors can form peripheral circuits 452 on silicon substrate 450.

As illustrated in FIG. 4G, a bonding layer 448 is formed above peripheral circuits 452. Bonding layer 448 includes bonding contacts electrically connected to peripheral circuits 452. To form bonding layer 448, an ILD layer is deposited using one or more thin film deposition processes, such as CVD, PVD, ALD, or any combination thereof; the bonding contacts through the ILD layer are formed using wet etching and/or dry etching, e.g., ME, followed by one or more thin film deposition processes, such as ALD, CVD, PVD, any other suitable processes, or any combination thereof.

Channel structures each extending vertically through a memory stack and a P-type doped semiconductor layer having an N-well can be formed above a second substrate. Method 600 proceeds to operation 604, as illustrated in FIG. 6A, in which a sacrificial layer on a substrate, a first stop layer on the sacrificial layer, a P-type doped semiconductor layer having an N-well on the first stop layer, and a dielectric stack on the P-type doped semiconductor layer are sequentially formed. The sacrificial layer can be formed on the front side of the second substrate on which semiconductor devices can be formed. The second substrate can be a silicon substrate. It is understood that as the second substrate will be removed from the final product, the second substrate may be part of a dummy wafer, for example, a carrier substrate, made of any suitable materials, such as glass, sapphire, plastic, silicon, to name a few, to reduce the cost of the second substrate. In some embodiments, the substrate is a carrier substrate, the P-type doped semiconductor layer includes polysilicon, and the dielectric stack includes interleaved stack dielectric layers and stack sacrificial layers. In some embodiments, the stack dielectric layers and stack sacrificial layers are alternatingly deposited on the P-type doped semiconductor layer to form the dielectric stack. In some embodiments, the sacrificial layer includes two pad oxide layers (also known as buffer layers) and a second stop layer sandwiched between the two pad oxide layers. In some embodiments, the first stop layer includes a high-k dielectric, the second stop layer includes silicon nitride, and each of the two pad oxide layers includes silicon oxide. In some embodiments, prior to forming the dielectric stack, part of the P-type doped semiconductor layer is doped with an N-type dopant to form the N-well.

As illustrated in FIG. 4A, a sacrificial layer 403 is formed on a carrier substrate 402, a stop layer 405 is formed on sacrificial layer 403, and a P-type doped semiconductor layer 406 is formed on stop layer 405. P-type doped semiconductor layer 406 can include polysilicon doped with P-type dopant(s), such as B, Ga, or Al. Sacrificial layer 403 can include any suitable sacrificial materials that can be later selectively removed and are different from the material of P-type doped semiconductor layer 406. In some embodiments, sacrificial layer 403 is a composite dielectric layer having a stop layer 404 sandwiched between two pad oxide layers. As described below in detail, stop layer 404 can act as a CMP/etch stop layer when removing carrier substrate 402 from the backside and thus, may include any suitable materials other than the material of carrier substrate 402, such as silicon nitride. Similarly, stop layer 405 can act as an etch stop layer when etching the channel holes from the front side and thus, may include any suitable materials that have a high etching selectivity (e.g., greater than about 5) with respect to polysilicon (the material of P-type doped semiconductor layer 406 on stop layer 405). In one example, stop layer 405 may be removed in the later process from the final product and may include a high-k dielectric, e.g., aluminum oxide, hafnium oxide, zirconium oxide, or titanium oxide, to name a few. In another example, at least part of stop layer 405 may remain in the final product and may include a metal silicide, e.g., copper silicide, cobalt silicide, nickel silicide, titanium silicide, tungsten silicide, silver silicide, aluminum silicide, gold silicide, platinum silicide, to name a few. It is understood that in some examples, pad oxide layers (e.g., silicon oxide layers) may be formed between carrier substrate 402 and stop layer 404 and between stop layer 404 and stop layer 405 to relax the stress between different layers and avoid peeling.

To form sacrificial layer 403, silicon oxide, silicon nitride, and silicon oxide are sequentially deposited on carrier substrate 402 using one or more thin film deposition processes including, but not limited to, CVD, PVD, ALD, or any combination thereof, according to some embodiments. To form stop layer 405, a high-k dielectric is deposited on sacrificial layer 403 using one or more thin film deposition processes including, but not limited to, CVD, PVD, ALD, or any combination thereof, according to some embodiments. In some embodiments, to form P-type doped semiconductor layer 406, polysilicon is deposited on stop layer 405 using one or more thin film deposition processes including, but not limited to, CVD, PVD, ALD, or any combination thereof, followed by doping the deposited polysilicon with P-type dopant(s), such as B, Ga, or Al, using ion implantation and/or thermal diffusion. In some embodiments, to form P-type doped semiconductor layer 406, in-situ doping of P-type dopants, such as B, Ga, or Al, is performed when depositing polysilicon on stop layer 405. In some embodiments in which stop layer 405 includes a metal silicide, a metal layer is deposited on sacrificial layer 403, followed by depositing polysilicon to form P-type doped semiconductor layer 406 on the metal layer. A silicidation process can then be performed on the polysilicon and metal layers by a thermal treatment (e.g., annealing, sintering, or any other suitable process) to transform the metal layer into a metal silicide layer, as stop layer 405.

As illustrated in FIG. 4A, part of P-type doped semiconductor layer 406 is doped with N-type dopant(s), such as P, As, or Sb, to form an N-well 407 in P-type doped semiconductor layer 406. In some embodiments, N-well 407 is formed using ion implantation and/or thermal diffusion. The ion implantation and/or thermal diffusion processes can be controlled to control the thickness of N-well 407, either through the entire thickness of P-type doped semiconductor layer 406 or part thereof.

As illustrated in FIG. 4B, a dielectric stack 408 including a plurality pairs of a first dielectric layer (referred to herein as "stack sacrificial layer" 412) and a second dielectric layer (referred to herein as "stack dielectric layers" 410, together referred to herein as "dielectric layer pairs") is formed on P-type doped semiconductor layer 406. Dielectric stack 408 includes interleaved stack sacrificial layers 412 and stack dielectric layers 410, according to some embodiments. Stack dielectric layers 410 and stack sacrificial layers 412 can be alternatingly deposited on P-type doped semiconductor layer 406 above carrier substrate 402 to form dielectric stack 408. In some embodiments, each stack dielectric layer 410 includes a layer of silicon oxide, and each stack sacrificial layer 412 includes a layer of silicon nitride. Dielectric stack 408 can be formed by one or more thin film deposition processes including, but not limited to, CVD, PVD, ALD, or any combination thereof. As illustrated in FIG. 4B, a staircase structure can be formed on the edge of dielectric stack 408. The staircase structure can be formed by performing a plurality of so-called "trim-etch" cycles to the dielectric layer pairs of dielectric stack 408 toward carrier substrate 402. Due to the repeated trim-etch cycles applied to the dielectric layer pairs of dielectric stack 408, dielectric stack 408 can have one or more tilted edges and a top dielectric layer pair shorter than the bottom one, as shown in FIG. 4B.

Method 600 proceeds to operation 606, as illustrated in FIG. 6A, in which channel structures each extending vertically through the dielectric stack and the P-type doped semiconductor layer are formed, stopping at the first stop layer. In some embodiments, to form the channel structures, channel holes each extending vertically through the dielectric stack and the P-type doped semiconductor layer is etched, stopping at the first stop layer, and a memory film and a semiconductor channel are subsequently deposited along a sidewall of each channel hole.

As illustrated in FIG. 4B, each channel hole is an opening extending vertically through dielectric stack 408 and P-type doped semiconductor layer 406, stopping at stop layer 405. In some embodiments, a plurality of openings are formed, such that each opening becomes the location for growing an individual channel structure 414 in the later process. In some embodiments, fabrication processes for forming the channel holes of channel structures 414 include wet etching and/or dry etching, such as DRIE. The etching of the channel holes continues until being stopped by stop layer 405, such as a high-k dielectric layer (e.g., an aluminum oxide layer) or a metal silicide layer, due to the etching selectivity between the materials of stop layer 405 (e.g., aluminum oxide or metal silicide) and P-type doped semiconductor layer 406 (i.e., polysilicon), according to some embodiments. In some embodiments, the etching conditions, such as etching rate and time, can be controlled to ensure that each channel hole has reached and stopped by stop layer 405 to minimize the gouging variations among the channel holes and channel structures 414 formed therein. It is understood that depending on the specific etching selectivity, one or more channel holes may extend into stop layer 405 to a small extent, which is still viewed as being stopped by stop layer 405 in the present disclosure.

As illustrated in FIG. 4B, a memory film including a blocking layer 417, a storage layer 416, and a tunneling layer 415, and a semiconductor channel 418 are sequentially formed in this order along sidewalls and the bottom surface of the channel hole. In some embodiments, blocking layer 417, storage layer 416, and tunneling layer 415 are first deposited along the sidewalls and bottom surface of the channel hole in this order using one or more thin film deposition processes, such as ALD, CVD, PVD, any other suitable processes, or any combination thereof, to form the memory film. Semiconductor channel 418 then can be formed by depositing a semiconductor material, such as polysilicon (e.g., undoped polysilicon), over tunneling layer 415 using one or more thin film deposition processes, such as ALD, CVD, PVD, any other suitable processes, or any combination thereof. In some embodiments, a first silicon oxide layer, a silicon nitride layer, a second silicon oxide layer, and a polysilicon layer (a "SONO" structure) are sequentially deposited to form blocking layer 417, storage layer 416, and tunneling layer 415 of the memory film and semiconductor channel 418.

As illustrated in FIG. 4B, a capping layer is formed in the channel hole and over semiconductor channel 418 to completely or partially fill the channel hole (e.g., without or with an air gap). The capping layer can be formed by depositing a dielectric material, such as silicon oxide, using one or more thin film deposition processes, such as ALD, CVD, PVD, any other suitable processes, or any combination thereof. A channel plug can then be formed in the top portion of the channel hole. In some embodiments, parts of the memory film, semiconductor channel 418, and the capping layer that are on the top surface of dielectric stack 408 are removed and planarized by CMP, wet etching, and/or dry etching. A recess then can be formed in the top portion of the channel hole by wet etching and/or drying etching parts of semiconductor channel 418 and the capping layer in the top portion of the channel hole. The channel plug can then be formed by depositing semiconductor materials, such as polysilicon, into the recess by one or more thin film deposition processes, such as CVD, PVD, ALD, or any combination thereof. Channel structure 414 is thereby formed through dielectric stack 408 and P-type doped semiconductor layer 406, stopping at stop layer 405, according to some embodiments.

Method 600 proceeds to operation 608, as illustrated in FIG. 6A, in which the dielectric stack is replaced with a memory stack, for example, using the so-called "gate replacement" process, such that the channel structure extends vertically through the memory stack and the P-type doped semiconductor layer. In some embodiments, to replace the dielectric stack with the memory stack, an opening extending vertically through the dielectric stack, stopping at the P-type doped semiconductor layer, is etched, and the stack sacrificial layers are replaced with stack conductive layers through the opening to form the memory stack including interleaved the stack dielectric layers and the stack conductive layers.

As illustrated in FIG. 4C, a slit 420 is an opening that extends vertically through dielectric stack 408 and stops at P-type doped semiconductor layer 406. In some embodiments, fabrication processes for forming slit 420 include wet etching and/or dry etching, such as DRIE. Although slit 420 is laterally aligned with N-well 407 as shown in FIG. 4C, it is understood that slit 420 may not be laterally aligned with N-well 407 in other examples. A gate replacement then can be performed through slit 420 to replace dielectric stack 408 with a memory stack 430 (shown in FIG. 4E).

As illustrated in FIG. 4D, lateral recesses 422 are first formed by removing stack sacrificial layers 412 (shown in FIG. 4C) through slit 420. In some embodiments, stack sacrificial layers 412 are removed by applying etchants through slit 420, creating lateral recesses 422 interleaved between stack dielectric layers 410. The etchants can include any suitable etchants that etch stack sacrificial layers 412 selective to stack dielectric layers 410.

As illustrated in FIG. 4E, stack conductive layers 428 (including gate electrodes and adhesive layers) are deposited into lateral recesses 422 (shown in FIG. 4D) through slit 420. In some embodiments, a gate dielectric layer 432 is deposited into lateral recesses 422 prior to stack conductive layers 428, such that stack conductive layers 428 are deposited on gate dielectric layer 432. Stack conductive layers 428, such as metal layers, can be deposited using one or more thin film deposition processes, such as ALD, CVD, PVD, any other suitable processes, or any combination thereof. In some embodiments, gate dielectric layer 432, such as a high-k dielectric layer, is formed along the sidewall and at the bottom of slit 420 as well. Memory stack 430 including interleaved stack conductive layers 428 and stack dielectric layers 410 is thereby formed, replacing dielectric stack 408 (shown in FIG. 4D), according to some embodiments.

Method 600 proceeds to operation 610, as illustrated in FIG. 6A, in which an insulating structure extending vertically through the memory stack is formed. In some embodiments, to form the insulating structure, after forming the memory stack, one or more dielectric materials are deposited into the opening to fill the opening. As illustrated in FIG. 4E, an insulating structure 436 extending vertically through memory stack 430 is formed, stopping on the top surface of P-type doped semiconductor layer 406. Insulating structure 436 can be formed by depositing one or more dielectric materials, such as silicon oxide, into slit 420 to fully or partially fill slit 420 (with or without an air gap) using one or more thin film deposition processes, such as ALD, CVD, PVD, any other suitable processes, or any combination thereof. In some embodiments, insulating structure 436 includes gate dielectric layer 432 (e.g., including high-k dielectrics) and a dielectric capping layer 434 (e.g., including silicon oxide).

As illustrated in FIG. 4F, after the formation of insulating structure 436, local contacts, including channel local contacts 444 and word line local contacts 442, and peripheral contacts 438, 439, and 440 are formed. A local dielectric layer can be formed on memory stack 430 by depositing dielectric materials, such as silicon oxide or silicon nitride, using one or more thin film deposition processes, such as CVD, PVD, ALD, or any combination thereof, on top of memory stack 430. Channel local contacts 444, word line local contacts 442, and peripheral contacts 438, 439, and 440 can be formed by etching contact openings through the local dielectric layer (and any other ILD layers) using wet etching and/or dry etching, e.g., RIE, followed by filling the contact openings with conductive materials using one or more thin film deposition processes, such as ALD, CVD, PVD, any other suitable processes, or any combination thereof.

As illustrated in FIG. 4F, a bonding layer 446 is formed above channel local contacts 444, word line local contacts 442, and peripheral contacts 438, 439, and 440. Bonding layer 446 includes bonding contacts electrically connected to channel local contacts 444, word line local contacts 442, and peripheral contacts 438, 439, and 440. To form bonding layer 446, an ILD layer is deposited using one or more thin film deposition processes, such as CVD, PVD, ALD, or any combination thereof, and the bonding contacts are formed through the ILD layer using wet etching and/or dry etching, e.g., RIE, followed by one or more thin film deposition processes, such as ALD, CVD, PVD, any other suitable processes, or any combination thereof.

Method 600 proceeds to operation 612, as illustrated in FIG. 6A, in which the first substrate and the second substrate are bonded in a face-to-face manner, such that the memory stack is above the peripheral circuit. The bonding can include hybrid bonding. As illustrated in FIG. 4G, carrier substrate 402 and components formed thereon (e.g., memory stack 430 and channel structures 414 formed therethrough) are flipped upside down. Bonding layer 446 facing down is bonded with bonding layer 448 facing up, i.e., in a face-to-face manner, thereby forming a bonding interface 454 between carrier substrate 402 and silicon substrate 450, according to some embodiments. In some embodiments, a treatment process, e.g., a plasma treatment, a wet treatment, and/or a thermal treatment, is applied to the bonding surfaces prior to the bonding. After the bonding, the bonding contacts in bonding layer 446 and the bonding contacts in bonding layer 448 are aligned and in contact with one another, such that memory stack 430 and channel structures 414 formed therethrough can be electrically connected to peripheral circuits 452 and are above peripheral circuits 452.

Method 600 proceeds to operation 614, as illustrated in FIG. 6A, in which the second substrate, the sacrificial layer, and the first stop layer are sequentially removed to expose an end of each of the plurality of channel structures. The removal can be performed from the backside of the second substrate. In some embodiments, to sequentially remove the second substrate, the sacrificial layer, and the first stop layer, the second substrate is removed, stopping at the second stop layer of the sacrificial layer, and the remainder of the sacrificial layer is removed, stopping at the first stop layer.

As illustrated in FIG. 4H, carrier substrate 402 (and a pad oxide layer between carrier substrate 402 and stop layer 404, shown in FIG. 4G) are completely removed from the backside until being stopped by stop layer 404 (e.g., a silicon nitride layer). Carrier substrate 402 can be completely removed using CMP, grinding, dry etching, and/or wet etching. In some embodiments, carrier substrate 402 is peeled off. In some embodiments in which carrier substrate 402 includes silicon and stop layer 404 includes silicon nitride, carrier substrate 402 is removed using silicon CMP, which can be automatically stopped when reaching stop layer 404 having materials other than silicon, i.e., acting as a backside CMP stop layer. In some embodiments, substrate 402 (a silicon substrate) is removed using wet etching by TMAH, which is automatically stopped when reaching stop layer 404 having materials other than silicon, i.e., acting as a backside etch stop layer. Stop layer 404 can ensure the complete removal of carrier substrate 402 without the concern of thickness uniformity after thinning.

As shown in FIG. 4I, the remainder of sacrificial layer 403 (e.g., stop layer 404 and another pad oxide layer between stop layer 404 and stop layer 405, shown in FIG. 4H) then can be completely removed as well using wet etching with suitable etchants, such as phosphoric acid and hydrofluoric acid, until being stopped by stop layer 405 having a different material (e.g., high-k dielectric). As described above, since each channel structure 414 does not extend beyond stop layer 405 into sacrificial layer 403 or carrier substrate 402, the removal of carrier substrate 402 and sacrificial layer 403 does not affect channel structures 414. As shown in FIG. 4J, in some embodiments in which stop layer 405 includes a high-k dielectric (as opposed to a conductive layer including metal silicide), stop layer 405 (shown in FIG. 3I) is completely removed using wet etching and/or dry etching to expose the upper ends of channel structures 414.

Method 600 proceeds to operation 616, as illustrated in FIG. 6A, in which a conductive layer is formed in contact with the ends of the plurality of channel structures. In some embodiments, the conductive layer includes a metal silicide layer in contact with the ends of the plurality of channel structures and the P-type doped semiconductor layer, and a metal layer in contact with the metal silicide layer. In some embodiments, to form the conductive layer, part of the memory film abutting the P-type doped semiconductor layer is removed to form a recess surrounding part of the semiconductor channel, and the part of the semiconductor channel is doped. In some embodiments, to form the conductive layer, the metal silicide layer is formed in the recess in contact with the doped part of semiconductor channel and outside of the recess in contact with the P-type doped semiconductor layer.

As illustrated in FIG. 4J, parts of storage layer 416, blocking layer 417, and tunneling layer 415 (shown in FIG. 4I) abutting P-type doped semiconductor layer 406 are removed to form a recess 457 surrounding the top portion of semiconductor channel 418 extending into P-type doped semiconductor layer 406. In some embodiments, two wet etching processes are sequentially performed. For example, storage layer 416 including silicon nitride is selectively removed using wet etching with suitable etchants, such as phosphoric acid, without etching P-type doped semiconductor layer 406 including polysilicon. The etching of storage layer 416 can be controlled by controlling the etching time and/or etching rate, such that the etching does not continue to affect the rest of storage layer 416 surrounded by memory stack 430. Then, blocking layer 417 and tunneling layer 415 including silicon oxide may be selectively removed using wet etching with suitable etchants, such as hydrofluoric acid, without etching P-type doped semiconductor layer 406 and semiconductor channel 418 including polysilicon. The etching of blocking layer 417 and tunneling layer 415 can be controlled by controlling the etching time and/or etching rate, such that the etching does not continue to affect the rest of blocking layer 417 and tunneling layer 415 surrounded by memory stack 430. In some embodiments, a single dry etching process is performed, using patterned stop layer 405 as the etching mask. For example, stop layer 405 may not be removed when performing the dry etching, but instead, may be patterned to expose only storage layer 416, blocking layer 417, and tunneling layer 415 at the upper ends of channel structures 414, while still covering other areas as an etching mask. A dry etching then may be performed to etch parts of storage layer 416, blocking layer 417, and tunneling layer 415 abutting P-type doped semiconductor layer 406. The dry etching can be controlled by controlling the etching time and/or etching rate, such that the etching does not continue to affect the rest of storage layer 416, blocking layer 417, and tunneling layer 415 surrounded by memory stack 430. Patterned stop layer 405 may be removed once the dry etching is finished.

Nevertheless, the removal of parts of storage layer 416, blocking layer 417, and tunneling layer 415 abutting P-type doped semiconductor layer 406 from the backside is much less challenging and has a higher production yield compared with the known solutions using front side wet etching via the openings (e.g., slit 420 in FIG. 4D) through dielectric stack 408/memory stack 430 with a high aspect ratio (e.g., greater than 50). By avoiding the issues introduced by the high aspect ratio of slit 420, the fabrication complexity and cost can be reduced, and the yield can be increased. Moreover, the vertical scalability (e.g., the increasing level of dielectric stack 408/memory stack 430) can be improved as well.

As illustrated in FIG. 4J, the top portion of the memory film (including blocking layer 417, storage layer 416, and tunneling layer 415) of each channel structure 414 abutting P-type doped semiconductor layer 406 can be removed to form recess 457, exposing the top portion of semiconductor channel 418, according to some embodiments. In some embodiments, the top portion of semiconductor channel 418 exposed by recess 457 is doped to increase its conductivity. For example, a tilted ion implantation process may be performed to dope the top portion of semiconductor channel 418 (e.g., including polysilicon) exposed by recess 457 with any suitable dopants to a desired doping concentration.

As illustrated in FIG. 4K, a conductive layer 459 is formed in recess 457 (shown in FIG. 4J), surrounding and in contact with the doped top portion of semiconductor channel 418, as well as outside of recess 457 on P-type doped semiconductor layer 406. In some embodiments, to form conductive layer 459, a metal silicide layer 476 is formed in recess 457 in contact with the doped top portion of semiconductor channel 418 and outside of recess 457 in contact with P-type doped semiconductor layer 406, and a metal layer 478 is formed on metal silicide layer 476. In one example, a metal film (e.g., Co, Ni, or Ti) may be deposited on the sidewalls and bottom surfaces of recess 457 and on P-type doped semiconductor layer 406 using one or more thin film deposition processes, such as ALD, CVD, PVD, any other suitable processes, or any combination thereof. The metal film can be in contact with polysilicon of P-type doped semiconductor layer 406 and the doped top portion of semiconductor channel 418. A silicidation process can then be performed on the metal film and the polysilicon by a thermal treatment (e.g., annealing, sintering, or any other suitable process) to form metal silicide layer 476 along the sidewalls and bottom surfaces of recess 457 and on P-type doped semiconductor layer 406. Metal layer 478 then can be formed on metal silicide layer 476 by depositing another metal film (e.g., W, Al, Ti, TiN, Co, and/or Ni) using one or more thin film deposition processes, such as ALD, CVD, PVD, any other suitable processes, or any combination thereof, on metal silicide layer 476 to fill the remaining space of recess 457. In another example, instead of depositing two metal films separately, a single metal film (e.g., Co, Ni, or Ti) may be deposited into recess 457 to fill recess 457 and on P-type doped semiconductor layer 406 using one or more thin film deposition processes, such as ALD, CVD, PVD, any other suitable processes, or any combination thereof. A silicidation process then can be performed on the metal film and the polysilicon by a thermal treatment (e.g., annealing, sintering, or any other suitable process), such that part of the metal film forms metal silicide layer 476 along the sidewalls and bottom surfaces of recess 457 and on P-type doped semiconductor layer 406, while the remainder of the metal film becomes metal layer 478 on metal silicide layer 476. A CMP process can be performed to remove any excess metal layer 478. As shown in FIG. 4K, conductive layer 459 (as one example of conductive layer 222 in 3D memory device 200 in FIG. 2A) including metal silicide layer 476 and metal layer 478 is thereby formed, according to some embodiments. In some embodiments conductive layer 459 is patterned and etched not to cover the peripheral region.

In some embodiments, to form the conductive layer, doped polysilicon is deposited into the recess to be in contact with the doped part of semiconductor channel, and the metal silicide layer is formed in contact with the doped polysilicon and the P-type doped semiconductor layer. As illustrated in FIG. 4P, a channel plug 480 is formed in recess 457 (shown in FIG. 4J), surrounding and in contact with the doped top portion of semiconductor channel 418. As a result, the removed top portion of channel structure 414 (shown in FIG. 4H) abutting P-type doped semiconductor layer 406 is thereby replaced with channel plug 480, according to some embodiments. In some embodiments, to form channel plug 480, polysilicon is deposited into recess 457 using one or more thin film deposition processes, such as ALD, CVD, PVD, any other suitable processes, or any combination thereof to fill recess 457, followed by a CMP process to remove any excess polysilicon above the top surface of P-type doped semiconductor layer 406. In some embodiments, in-situ doping of P-type dopants, such as B, Ga, or Al, is performed when depositing polysilicon into recess 457 to dope channel plug 480. As channel plug 480 and doped top portion of semiconductor channel 418 may include the same material, such as doped polysilicon, channel plug 480 may be viewed as part of semiconductor channel 418 of channel structure 414.

As shown in FIG. 4P, conductive layer 459 including metal silicide layer 476 and metal layer 478 is formed on P-type doped semiconductor layer 406 and channel plug 480. In some embodiments, a metal film is first deposited on P-type doped semiconductor layer 406 and channel plug 480, followed by a silicidation process to form metal silicide layer 476 in contact with channel plug 480 and P-type doped semiconductor layer 406. Another metal film then can be deposited on metal silicide layer 476 to form metal layer 478. In some embodiments, a metal film is deposited on P-type doped semiconductor layer 406 and channel plug 480, followed by a silicidation process, such that part of the metal film in contact with P-type doped semiconductor layer 406 and channel plug 480 form metal silicide layer 476 and the remainder of the metal film becomes metal layer 478. As shown in FIG. 4P, conductive layer 459 (as one example of conductive layer 222 in 3D memory device 250 in FIG. 2B) including metal silicide layer 476 and metal layer 478 is thereby formed, according to some embodiments. In some embodiments conductive layer 459 is patterned and etched not to cover the peripheral region.

Method 600 proceeds to operation 618, as illustrated in FIG. 6A, in which a first source contact is formed above the memory stack and in contact with the P-type doped semiconductor layer, and a second source contact is formed above the memory stack and in contact with the N-well. As illustrated in FIG. 4L, one or more ILD layers 456 are formed on P-type doped semiconductor layer 406. ILD layers 456 can be formed by depositing dielectric materials on the top surface of P-type doped semiconductor layer 406 using one or more thin film deposition processes, such as ALD, CVD, PVD, any other suitable processes, or any combination thereof.

As illustrated in FIG. 4M, a source contact opening 458 can be formed through ILD layers 456 and conductive layer 459 into P-type doped semiconductor layer 406. In some embodiments, source contact opening 458 is formed using wet etching and/or dry etching, such as ME. In some embodiments, source contact opening 458 extends further into the top portion of P-type doped semiconductor layer 406. The etching process through ILD layers 456 and conductive layer 459 may continue to etch part of P-type doped semiconductor layer 406. In some embodiments, a separate etching process is used to etch part of P-type doped semiconductor layer 406 after etching through ILD layers 456 and conductive layer 459.

As illustrated in FIG. 4M, a source contact opening 465 can be formed through ILD layers 456 and conductive layer 459 into N-well 407. In some embodiments, source contact opening 465 is formed using wet etching and/or dry etching, such as RIE. In some embodiments, source contact opening 465 extends further into the top portion of N-well 407. The etching process through ILD layers 456 and conductive layer 459 may continue to etch part of N-well 407. In some embodiments, a separate etching process is used to etch part of N-well 407 after etching through ILD layers 456 and conductive layer 459. The etching of source contact opening 458 can be performed after the etching of source contact opening 465 or vice versa. It is understood that in some examples, source contact openings 458 and 465 may be etched by the same etching process to reduce the number of etching processes.

As illustrated in FIG. 4N, source contacts 464 and 479 are formed in source contact openings 458 and 465, respectively, (shown in FIG. 4M) at the backside of P-type doped semiconductor layer 406. Source contact 464 is above memory stack 430 and in contact with P-type doped semiconductor layer 406, according to some embodiments. Source contact 479 is above memory stack 430 and in contact with N-well 407, according to some embodiments. In some embodiments, one or more conductive materials are deposited into source contact openings 458 and 465 using one or more thin film deposition processes, such as ALD, CVD, PVD, any other suitable processes, or any combination thereof, to fill source contact openings 458 and 465 with adhesive layers (e.g., TiN) and conductor layers (e.g., W). A planarization process, such as CMP, can then be performed to remove the excess conductive materials, such that the top surfaces of source contacts 464 and 479 are flush with one another as well as flush with the top surface of ILD layers 456. It is understood that in some examples, source contacts 464 and 479 may be formed by the same deposition and CMP processes to reduce the number of fabrication processes.

Method 600 proceeds to operation 620, as illustrated in FIG. 6A, in which an interconnect layer is formed above and in contact with the first and second source contacts. In some embodiments, the interconnect layer includes a first interconnect and a second interconnect above and in contact with the first and second source contacts, respectively.

As illustrated in FIG. 4O, a redistribution layer 470 is formed above and in contact with source contacts 464 and 479. In some embodiments, redistribution layer 470 is formed by depositing a conductive material, such as Al, on the top surfaces of ILD layers 456 and source contact 364 using one or more thin film deposition processes, such as ALD, CVD, PVD, any other suitable processes, or any combination thereof. In some embodiments, redistribution layer 470 is patterned by lithography and etching processes to form a first interconnect 470-1 above and in contact with source contact 464 and a second interconnect 470-2 above and in contact with source contact 479. First and second interconnects 470-1 and 470-2 can be electrically separated from one another. A passivation layer 472 can be formed on redistribution layer 470. In some embodiments, passivation layer 472 is formed by depositing a dielectric material, such as silicon nitride, using one or more thin film deposition processes, such as ALD, CVD, PVD, any other suitable processes, or any combination thereof. An interconnect layer 476 including ILD layers 456, redistribution layer 470, and passivation layer 472 is thereby formed, according to some embodiments.

As illustrated in FIG. 4L, contact openings 460, 461, and 463 each extending through ILD layers 456 and P-type doped semiconductor layer 406 are formed. In some embodiments, contact openings 460, 461, and 463 are formed using wet etching and/or dry etching, such as ME, through ILD layers 456 and P-type doped semiconductor layer 406. In some embodiments, contact openings 460, 461, and 463 are patterned using lithography to be aligned with peripheral contacts 438, 440, and 439, respectively. The etching of contact openings 460, 461, and 463 can stop at the upper ends of peripheral contacts 438, 439, and 440 to expose peripheral contacts 438, 439, and 440. The etching of contact openings 460, 461, and 463 can be performed by the same etching process to reduce the number of etching processes. It is understood that due to the different etching depths, the etching of contact openings 460, 461, and 463 may be performed prior to the etching of source contact opening 465, or vice versa, but not at the same time.

As illustrated in FIG. 4M, a spacer 462 is formed along the sidewalls of contact openings 460, 461, and 463 as well as source contact opening 465 to electrically separate P-type doped semiconductor layer 406 using one or more thin film deposition processes, such as ALD, CVD, PVD, any other suitable processes, or any combination thereof. In some embodiments, spacers 462 are formed along the sidewalls of contact openings 460, 461, and 463 as well as source contact opening 465 by the same deposition process to reduce the number of fabrication processes. In some embodiments, the etching of source contact opening 458 is performed after the formation of spacer 462, such that spacer 462 is not formed along the sidewall of source contact opening 458 to increase the contact area between source contact 464 and P-type doped semiconductor layer 406.

As illustrated in FIG. 4N, contacts 466, 468, and 469 are formed in contact openings 460, 461, and 463, respectively (shown in FIG. 4M) at the backside of P-type doped semiconductor layer 406. Contacts 466, 468, and 469 extend vertically through ILD layers 456 and P-type doped semiconductor layer 406, according to some embodiments. Contacts 466, 468, and 469 as well as source contacts 464 and 479 can be formed using the same deposition process to reduce the number of deposition processes. In some embodiments, one or more conductive materials are deposited into contact openings 460, 461, and 463 using one or more thin film deposition processes, such as ALD, CVD, PVD, any other suitable processes, or any combination thereof, to fill contact openings 460, 461, and 463 with an adhesive layer (e.g., TiN) and a conductor layer (e.g., W). A planarization process, such as CMP, can then be performed to remove the excess conductive materials, such that the top surfaces of contacts 466, 468, and 469 (and the top surfaces of source contact 464 and 479) are flush with the top surface of ILD layers 456. In some embodiments, as contact openings 460, 461, and 463 are aligned with peripheral contacts 438, 440, and 439, respectively, contacts 466, 468, and 469 are above and in contact with peripheral contacts 438, 440, and 439, respectively, as well.

As illustrated in FIG. 4O, first interconnect 470-1 of redistribution layer 470 is formed above and in contact with contact 466. As a result, P-type doped semiconductor layer 406 can be electrically connected to peripheral contact 438 through source contact 464, first interconnect 470-1 of interconnect layer 476, and contact 466. In some embodiments, P-type doped semiconductor layer 406 is electrically connected to peripheral circuits 452 through source contact 464, first interconnect 470-1 of interconnect layer 476, contact 466, peripheral contact 438, and bonding layers 446 and 448. Similarly, second interconnect 470-2 of redistribution layer 470 is formed above and in contact with contact 469. As a result, N-well 407 can be electrically connected to peripheral contact 438 through source contact 479, second interconnect 470-2 of interconnect layer 476, and contact 469. In some embodiments, N-well 407 is electrically connected to peripheral circuits 452 through source contact 479, second interconnect 470-2 of interconnect layer 476, contact 469, peripheral contact 439, and bonding layers 446 and 448.

As illustrated in FIG. 4O, a contact pad 474 is formed above and in contact with contact 468. In some embodiments, part of passivation layer 472 covering contact 468 is removed by wet etching and/or dry etching to expose part of redistribution layer 470 underneath to form contact pad 474. As a result, contact pad 474 for pad-out can be electrically connected to peripheral circuits 452 through contact 468, peripheral contact 440, and bonding layers 446 and 448.

It is understood that the first stop layer in method 600 may be a first conductive layer, e.g., a metal silicide layer, part of which remains in the conductive layer in the final product, as described below with respect to method 601. The detail of similar operations between methods 600 and 601 may not be repeated for ease of description. Referring to FIG. 6B, method 601 starts at operation 602, in which a peripheral circuit is formed on a first substrate. The first substrate can be a silicon substrate.

Method 601 proceeds to operation 605, as illustrated in FIG. 6B, in which a sacrificial layer on a second substrate, a first conductive layer on the sacrificial layer, a P-type doped semiconductor layer having an N-well on the first conductive layer, and a dielectric stack on the P-type doped semiconductor layer are sequentially formed. In some embodiments, the first conductive layer includes a metal silicide. As illustrated in FIG. 4A, stop layer 405 may be a conductive layer including metal silicide, i.e., a metal silicide layer. It is understood that the above descriptions related to the formation of carrier substrate 402, sacrificial layer 403, and P-type doped semiconductor layer 406 can be similarly applied to method 601 and thus, are not repeated for ease of description.

Method 601 proceeds to operation 607, as illustrated in FIG. 6B, in which a plurality of channel structures each extending vertically through the dielectric stack and the P-type doped semiconductor layer are formed, stopping at the first conductive layer. In some embodiments, to form the channel structures, a plurality of channel holes each extending vertically through the dielectric stack and the doped device layer, stopping at the first conductive layer, is formed, and a memory film and a semiconductor channel are subsequently deposited along a sidewall of each channel hole.

Method 601 proceeds to operation 608, as illustrated in FIG. 6B, in which the dielectric stack is replaced with a memory stack, such that each channel structure extends vertically through the memory stack and the P-type doped semiconductor layer. In some embodiments, to replace the dielectric stack with the memory stack, an opening extending vertically through the dielectric stack is etched, stopping at the P-type doped semiconductor layer, and the stack sacrificial layers are replaced with stack conductive layers through the opening to form the memory stack including interleaved the stack dielectric layers and the stack conductive layers.

Method 601 proceeds to operation 610, as illustrated in FIG. 6B, in which an insulating structure extending vertically through the memory stack is formed. In some embodiments, to form the insulating structure, after forming the memory stack, one or more dielectric materials are deposited into the opening to fill the opening. Method 601 proceeds to operation 612, as illustrated in FIG. 6B, in which the first substrate and the second substrate wafer are bonded in a face-to-face manner, such that the memory stack is above the peripheral circuit. The bonding can include hybrid bonding.

Method 601 proceeds to operation 615, as illustrated in FIG. 6B, in which the second substrate, the sacrificial layer, and part the first conductive layer are sequentially removed to expose an end of each of the plurality of channel structures. The removal can be performed from the backside of the second substrate. In some embodiments, to sequentially remove the second substrate, the sacrificial layer, and the part of the first conductive layer, the second substrate is removed, stopping at the stop layer, a remainder of the sacrificial layer is removed, stopping at the first conductive layer, and part of the first conductive layer is removed to expose the end of each of the plurality of channel structures.

It is understood that the above descriptions related to the removal of carrier substrate 402 and sacrificial layer 403 can be similarly applied to method 601 and thus, are not repeated for ease of description. As illustrated in FIG. 4Q, after the removal of sacrificial layer 403 (shown in FIG. 4G), part of conductive layer 405 (e.g., a metal silicide layer) is removed to expose the upper ends of channel structures 414. Conductive layer 405 can be patterned, such that parts right above each channel structure 414 can be removed to expose each channel structure 414 using, for example, lithography, wet etching, and/or dry etching. The remainder of conductive layer 405 remains on P-type doped semiconductor layer 406, according to some embodiments.

Method 601 proceeds to operation 617, as illustrated in FIG. 6B, in which a second conductive layer is formed in contact with the ends of the plurality of channel structures and the first conductive layer. The second conductive layer can include a metal. In some embodiments, to form the second conductive layer, part of the memory film abutting the P-type doped semiconductor layer is etched to form a recess surrounding part of the semiconductor channel, the part of the semiconductor channel is doped, and the metal is deposited into the recess to be in contact with the doped part of semiconductor channel and outside of the recess to be in contact with the first conductive layer.

It is understood that the above descriptions related to the removal of parts of storage layer 416, blocking layer 417, and tunneling layer 415 abutting P-type doped semiconductor layer 406 to form recess 457 can be similarly applied to method 601 and thus, are not repeated for ease of description. As illustrated in FIG. 4Q, metal layer 478 is formed in recess 457 (shown in FIG. 4J), surrounding and in contact with the doped top portion of semiconductor channel 418, as well as outside of recess 457 on conductive layer 405 (e.g., a metal silicide layer). Metal layer 478 can surround and contact the ends of channel structures 414 (e.g., the doped portions of semiconductor channels 418) in recess 457. Metal layer 478 can also be above and in contact with conductive layer 405 outside of recess 457. Metal layer 478 can be formed by depositing a metal film (e.g., W, Al, Ti, TiN, Co, and/or Ni) using one or more thin film deposition processes, such as ALD, CVD, PVD, any other suitable processes, or any combination thereof, to fill recess 457 and outside of recess 457 on conductive layer 405. A CMP process can be performed to remove any excess metal layer 478. Conductive layer 459 (as one example of conductive layer 222 in 3D memory device 260 in FIG. 2C) including metal layer 478 and conductive layer 405 is thereby formed, according to some embodiments. In some embodiments conductive layer 459 is patterned and etched not to cover the peripheral region. Compared with method 600, the number of fabrication processes in method 601 can be reduced by keeping the first stop layer (e.g., a metal silicide layer) part of the conductive layer in the final product.

Method 601 proceeds to operation 618, as illustrated in FIG. 6B, in which a first source contact above the memory stack and in contact with the P-type doped semiconductor layer is formed, and a second source contact above the memory stack and in contact with the N-well is formed. Method 601 proceeds to operation 620, as illustrated in FIG. 6B, in which an interconnect layer above and in contact with the first and second source contacts is formed. In some embodiments, the interconnect layer includes a first interconnect above and in contact with the first source contact, and a second interconnect above and in contact with the second source contact. In some embodiments, a first contact is formed through the P-type doped semiconductor layer and in contact with the first interconnect, such that the P-type doped semiconductor layer is electrically connected to the first contact through the first source contact and the first interconnect. In some embodiments, a second contact is formed through the P-type doped semiconductor layer and in contact with the second interconnect, such that the N-well is electrically connected to the second contact through the second source contact and the second interconnect.

According to one aspect of the present disclosure, a 3D memory device includes a substrate, a peripheral circuit on the substrate, a memory stack including interleaved conductive layers and dielectric layers above the peripheral circuit, an N-type doped semiconductor layer above the memory stack, a plurality of channel structures each extending vertically through the memory stack into the N-type doped semiconductor layer, a conductive layer in contact with upper ends of the plurality of channel structures, at least part of which is on the N-type doped semiconductor layer, and a source contact above the memory stack and in contact with the N-type doped semiconductor layer.

In some embodiments, the N-type doped semiconductor layer includes polysilicon.

In some embodiments, the 3D memory device is configured to generate GIDL-assisted body biasing when performing an erase operation.

In some embodiments, each of the channel structures includes a memory film and a semiconductor channel, and an upper end of the memory film is below an upper end of the semiconductor channel.

In some embodiments, the conductive layer includes a metal silicide layer and a metal layer.

In some embodiments, the metal silicide layer is in contact with the semiconductor channel, and the metal layer is above and in contact with the metal silicide layer.

In some embodiments, a portion of the semiconductor channel extending into the N-type doped semiconductor layer includes doped polysilicon.

In some embodiments, a thickness of the N-type doped semiconductor layer is less than about 50 nm.

In some embodiments, the 3D memory device further includes an interconnect layer above and electrically connected to the source contact.

In some embodiments, the 3D memory device further includes a first contact through the N-type doped semiconductor layer. The N-type doped semiconductor layer is electrically connected to the peripheral circuit through at least the source contact, the interconnect layer, and the first contact, according to some embodiments.

In some embodiments, the 3D memory device further includes an insulating structure extending vertically through the memory stack and extending laterally to separate the plurality of channel structures into a plurality of blocks. In some embodiments, a top surface of the insulating structure is flush with a bottom surface of the N-type doped semiconductor layer.

In some embodiments, the 3D memory device further includes a bonding interface between the peripheral circuit and the memory stack.

In some embodiments, the 3D memory device further includes a second contact through the N-type doped semiconductor layer. The interconnect layer includes a contact pad electrically connected to the second contact, according to some embodiments.

In some embodiments, an upper end of each of the plurality of channel structures is flush with or below a top surface of the N-type doped semiconductor layer.

According to another aspect of the present disclosure, a 3D memory device includes a substrate, a memory stack including interleaved conductive layers and dielectric layers above the substrate, an N-type doped semiconductor layer above the memory stack, and a plurality of channel structures each extending vertically through the memory stack into the N-type doped semiconductor layer. Each of the plurality of channel structures includes a memory film and a semiconductor channel. An upper end of the memory film is below an upper end of the semiconductor channel. The 3D memory device further includes a conductive layer in contact with the semiconductor channels of the plurality of channel structures. At least part of the conductive layer is on the N-type doped semiconductor layer.

In some embodiments, the conductive layer includes a metal silicide layer and a metal layer.

In some embodiments, the metal silicide layer is in contact with the semiconductor channel, and the metal layer is above and in contact with the metal silicide layer In some embodiments, the metal layer is in contact with the semiconductor channel, and part of the metal layer is above and in contact with the metal silicide layer.

In some embodiments, a thickness of the N-type doped semiconductor layer is less than about 50 nm.

In some embodiments, the 3D memory device further includes an insulating structure extending vertically through the memory stack and extending laterally to separate the plurality of channel structures into a plurality of blocks. In some embodiments, a top surface of the insulating structure is flush with a bottom surface of the N-type doped semiconductor layer.

In some embodiments, the 3D memory device further includes a source contact above the memory stack and in contact with the N-type doped semiconductor layer.

In some embodiments, the 3D memory device further includes a peripheral circuit above the substrate, and a bonding interface between the peripheral circuit and the memory stack.

In some embodiments, the 3D memory device further includes an interconnect layer above and electrically connected to the source contact.

In some embodiments, the N-type doped semiconductor layer is electrically connected to the peripheral circuit through at least the source contact and the interconnect layer.

According to still another aspect of the present disclosure, a 3D memory device includes a first semiconductor structure, a second semiconductor structure, and a bonding interface between the first semiconductor structure and the second semiconductor structure. The first semiconductor structure includes a peripheral circuit. The second semiconductor structure includes a memory stack including interleaved conductive layers and dielectric layers, an N-type doped semiconductor layer, a plurality of channel structures each extending vertically through the memory stack into the N-type doped semiconductor layer and electrically connected to the peripheral circuit, and a conductive layer including a metal silicide layer and a metal layer electrically connecting the plurality of channel structures.

In some embodiments, a thickness of the N-type doped semiconductor layer is less than about 50 nm.

In some embodiments, each of the channel structures includes a memory film and a semiconductor channel, and the metal silicide layer is in contact with the semiconductor channels of the plurality of channel structures.

In some embodiments, each of the channel structures includes a memory film and a semiconductor channel, and the metal layer is in contact with the semiconductor channels of the plurality of channel structures.

In some embodiments, second semiconductor structure further includes an insulating structure extending vertically through the memory stack and extending laterally to separate the plurality of channel structures into a plurality of blocks.

In some embodiments, the insulating structure does not extend vertically into the N-type doped semiconductor layer.

In some embodiments, the second semiconductor structure further includes a source contact in contact with the N-type doped semiconductor layer.

In some embodiments, the second semiconductor structure further includes an interconnect layer, and the N-type doped semiconductor layer is electrically connected to the peripheral circuit through at least the source contact and the interconnect layer.

In some embodiments, each of the channel structures does not extend beyond the N-type doped semiconductor layer.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
    a substrate;
    a peripheral circuit above the substrate;
    a memory stack comprising interleaved conductive layers and dielectric layers above the peripheral circuit;
    an N-type doped semiconductor layer above the memory stack;
    a plurality of channel structures each extending vertically through the memory stack into the N-type doped semiconductor layer, wherein upper ends of the plurality of channel structures are laterally surrounded by the N-type doped semiconductor layer;
    a conductive layer in contact with the upper ends of the plurality of channel structures, wherein at least part of the conductive layer is on the N-type doped semiconductor layer; and
    a source contact above the memory stack and in contact with the N-type doped semiconductor layer.

2. The 3D memory device of claim 1, wherein the N-type doped semiconductor layer comprises polysilicon.

3. The 3D memory device of claim 1, wherein the 3D memory device is configured to generate gate-induced-drain-leakage (GIDL)—assisted body biasing when performing an erase operation.

4. The 3D memory device of claim 1, wherein each of the channel structures comprises a memory film and a semiconductor channel, and an upper end of the memory film is below an upper end of the semiconductor channel.

5. The 3D memory device of claim 4, wherein the conductive layer comprises a metal silicide layer and a metal layer.

6. The 3D memory device of claim 5, wherein the metal silicide layer is in contact with the semiconductor channel, and the metal layer is above and in contact with the metal silicide layer.

7. The 3D memory device of claim 4, wherein a portion of the semiconductor channel extending into the N-type doped semiconductor layer comprises doped polysilicon.

8. The 3D memory device of claim 1, wherein a thickness of the N-type doped semiconductor layer is less than about 50 nm.

9. The 3D memory device of claim 1, further comprising an interconnect layer above and electrically connected to the source contact.

10. The 3D memory device of claim 9, further comprising a first contact through the N-type doped semiconductor layer, wherein the N-type doped semiconductor layer is electrically connected to the peripheral circuit through at least the source contact, the interconnect layer, and the first contact.

11. The 3D memory device of claim 10, further comprising a second contact through the N-type doped semiconductor layer, wherein the interconnect layer comprises a contact pad electrically connected to the second contact.

12. The 3D memory device of claim 1, further comprising an insulating structure extending vertically through the memory stack and extending laterally to separate the plurality of channel structures into a plurality of blocks, wherein a top surface of the insulating structure is flush with a bottom surface of the N-type doped semiconductor layer.

13. The 3D memory device of claim 1, further comprising a bonding interface between the peripheral circuit and the memory stack.

14. The 3D memory device of claim 1, wherein an upper end of each of the plurality of channel structures is flush with or below a top surface of the N-type doped semiconductor layer.

15. A three-dimensional (3D) memory device, comprising:
    a substrate;
    a memory stack comprising interleaved conductive layers and dielectric layers above the substrate;
    an N-type doped semiconductor layer above the memory stack;
    a plurality of channel structures each extending vertically through the memory stack into the N-type doped semiconductor layer, wherein upper ends of the plurality of channel structures are laterally surrounded by the N-type doped semiconductor layer, each of the plurality of channel structures comprises a memory film and a semiconductor channel, an upper end of the memory film being below an upper end of the semiconductor channel; and a conductive layer in contact with the semiconductor channels of the plurality of channel structures, wherein at least part of the conductive layer is on the N-type doped semiconductor layer.

16. The 3D memory device of claim 15, wherein the conductive layer comprises a metal silicide layer and a metal layer.

17. The 3D memory device of claim 16, wherein the metal silicide layer is in contact with the semiconductor channel, and the metal layer is above and in contact with the metal silicide layer.

18. The 3D memory device of claim 16, wherein the metal layer is in contact with the semiconductor channel, and part of the metal layer is above and in contact with the metal silicide layer.

19. The 3D memory device of claim 15, further comprising an insulating structure extending vertically through the memory stack and extending laterally to separate the plurality of channel structures into a plurality of blocks, wherein a top surface of the insulating structure is flush with a bottom surface of the N-type doped semiconductor layer.

20. A three-dimensional (3D) memory device, comprising:
   a first semiconductor structure comprising a peripheral circuit;
   a second semiconductor structure comprising:
      a memory stack comprising interleaved conductive layers and dielectric layers;
      an N-type doped semiconductor layer;
      a plurality of channel structures each extending vertically through the memory stack into the N-type doped semiconductor layer and electrically connected to the peripheral circuit, wherein upper ends of the plurality of channel structures are laterally surrounded by the N-type doped semiconductor layer; and
      a conductive layer comprising a metal silicide layer and a metal layer electrically connecting the plurality of channel structures, and
   a bonding interface between the first semiconductor structure and the second semiconductor structure.

* * * * *